(12) United States Patent
Yamada et al.

(10) Patent No.: US 7,729,570 B2
(45) Date of Patent: Jun. 1, 2010

(54) PHOTOELECTRIC CIRCUIT BOARD AND DEVICE FOR OPTICAL COMMUNICATION

(75) Inventors: Kazuhito Yamada, Gifu (JP); Tomohiro Nishikawa, Gifu (JP); Motoo Asai, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 11/750,625

(22) Filed: May 18, 2007

(65) Prior Publication Data

US 2008/0285910 A1 Nov. 20, 2008

(51) Int. Cl.
G02B 6/12 (2006.01)
(52) U.S. Cl. ...................................................... 385/14
(58) Field of Classification Search .................. None
See application file for complete search history.

(56) References Cited

U.S. PATENT DOCUMENTS

| 5,864,642 | A * | 1/1999 | Chun et al. ................... 385/14 |
| 6,343,171 | B1 * | 1/2002 | Yoshimura et al. ............ 385/50 |
| 6,370,292 | B1 * | 4/2002 | Strake ........................... 385/14 |
| 7,070,207 | B2 | 7/2006 | Asai |
| 2005/0185880 | A1 | 8/2005 | Asai |
| 2006/0012967 | A1 | 1/2006 | Asai et al. |
| 2006/0263003 | A1 | 11/2006 | Asai et al. |
| 2007/0183719 | A1 * | 8/2007 | Lee et al. ....................... 385/47 |
| 2007/0230863 | A1 * | 10/2007 | Fukuda et al. ................. 385/14 |
| 2008/0013880 | A1 * | 1/2008 | Pitwon .......................... 385/14 |
| 2008/0118200 | A1 * | 5/2008 | Kim et al. ...................... 385/14 |

FOREIGN PATENT DOCUMENTS

| JP | 6-268339 | 9/1994 |
| JP | 2002-331532 | 11/2002 |
| JP | 2006-84488 | 3/2006 |
| JP | 2006-140233 | 6/2006 |

OTHER PUBLICATIONS

U.S. Appl. No. 11/623,923, filed Jan. 17, 2007, Kodama, et al.
U.S. Appl. No. 11/696,436, filed Apr. 4, 2007, Kodama, et al.
U.S. Appl. No. 11/693,188, filed Mar. 29, 2007, Kodama, et al.
U.S. Appl. No. 11/696,434, filed Apr. 4, 2007, Kodama, et al.
U.S. Appl. No. 11/733,361, filed Apr. 10, 2007, Asai, et al.
U.S. Appl. No. 11/737,792, filed Apr. 20, 2007, Asai, et al.
U.S. Appl. No. 11/763,670, filed Jun. 15, 2007, Kodama, et al.

* cited by examiner

*Primary Examiner*—Mike Stahl
(74) *Attorney, Agent, or Firm*—Oblon, Spivak, McClelland, Maier & Neustadt, L.L.P.

(57) ABSTRACT

The photoelectric circuit board according to the present invention is a photoelectric circuit board, wherein a rigid portion where at least a conductor circuit and an insulating layer are formed and layered and one or more flex portions that are bendable are integrated, external connection portions for mounting an optical element and/or a package substrate on which an optical element is mounted are formed in above-described rigid portion, and an optical circuit is formed in at least one of above-described flex portions.

27 Claims, 31 Drawing Sheets

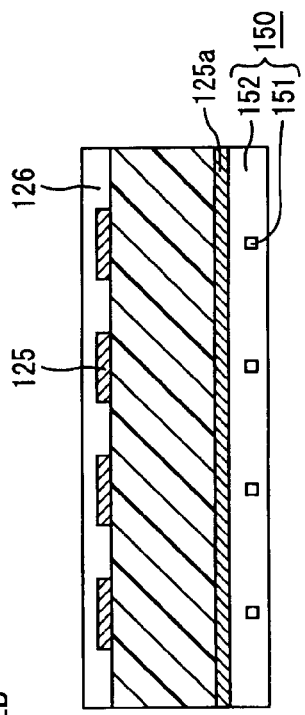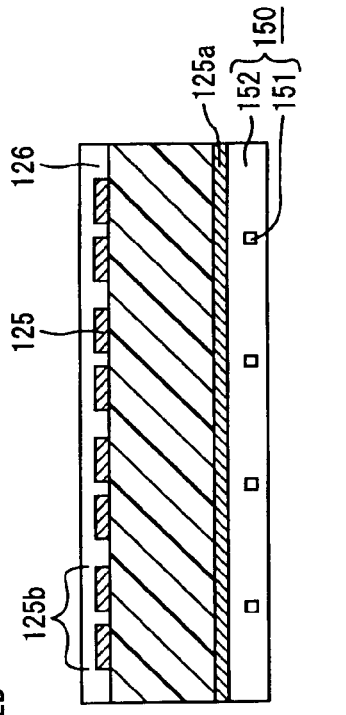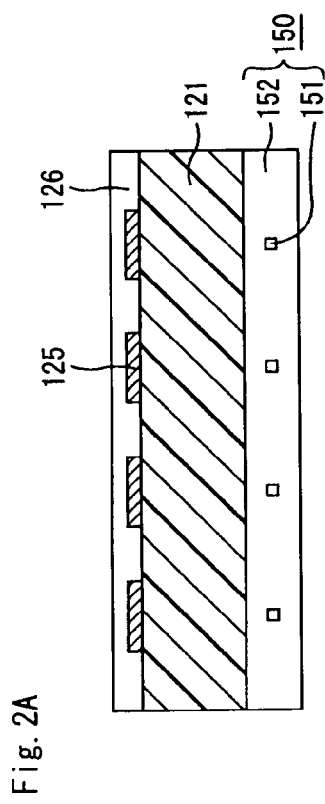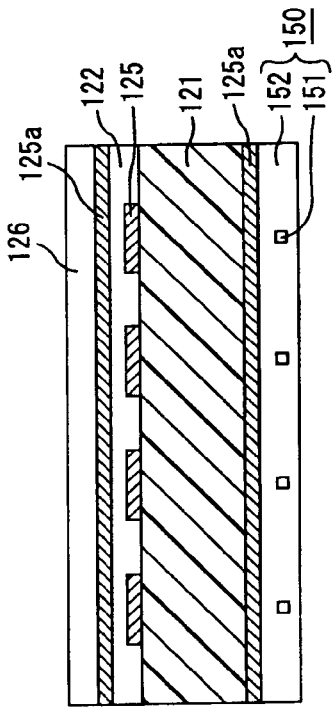

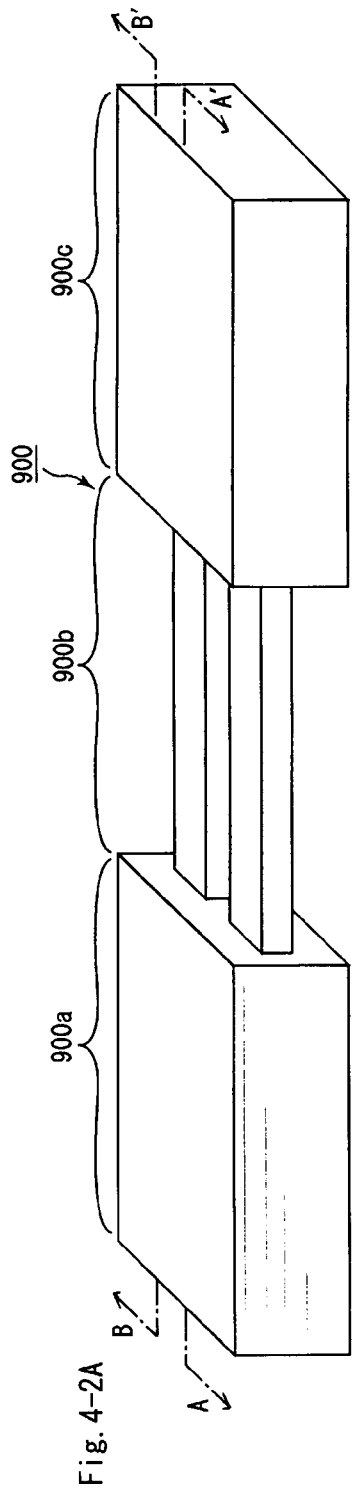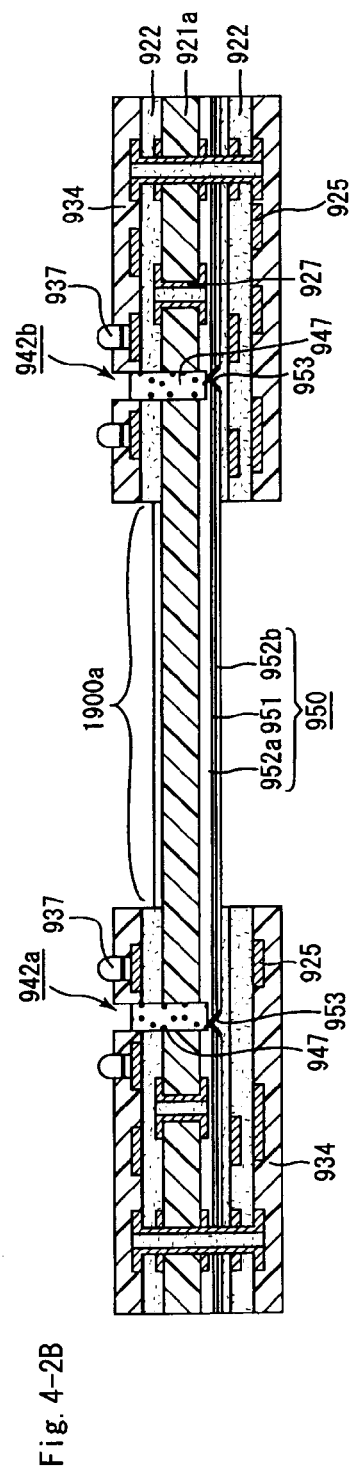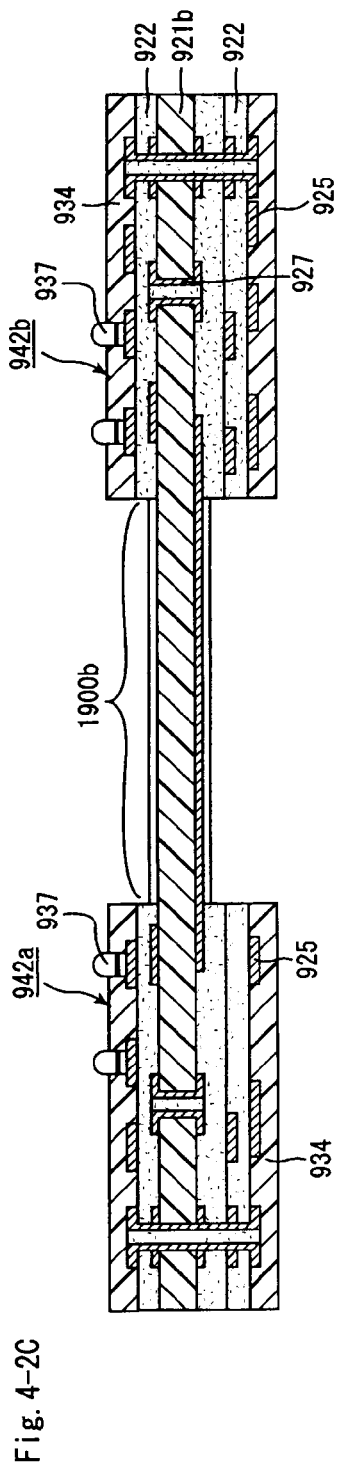
Fig. 4-2A
Fig. 4-2B
Fig. 4-2C

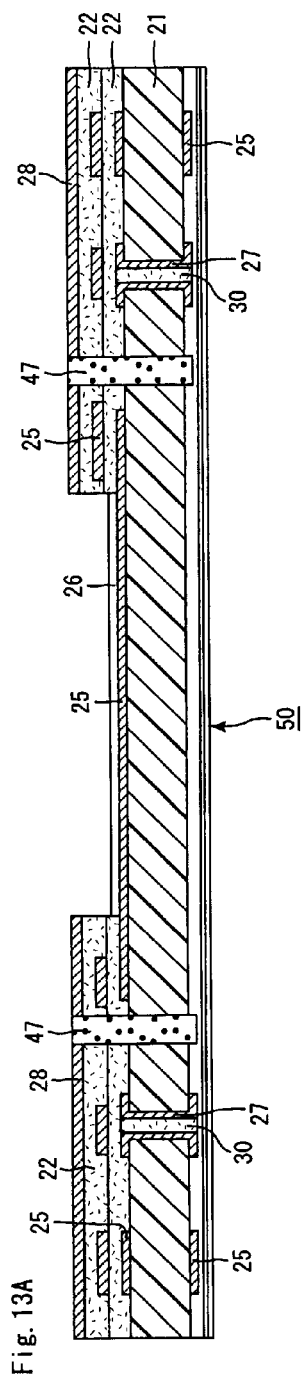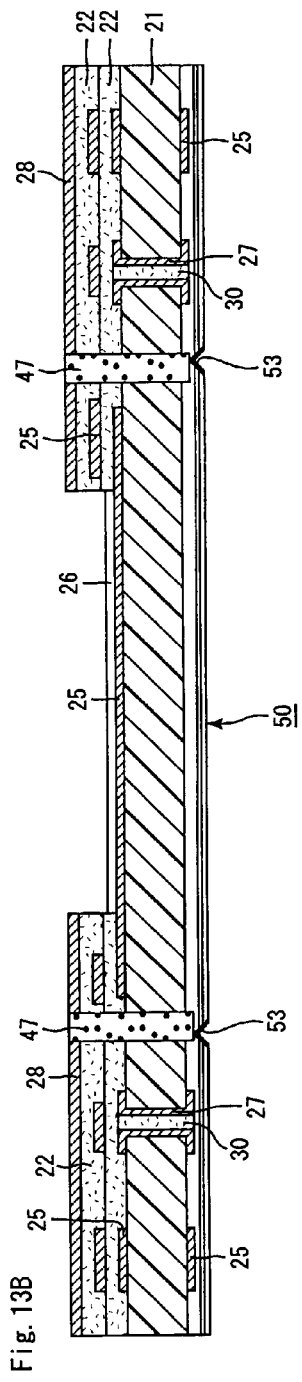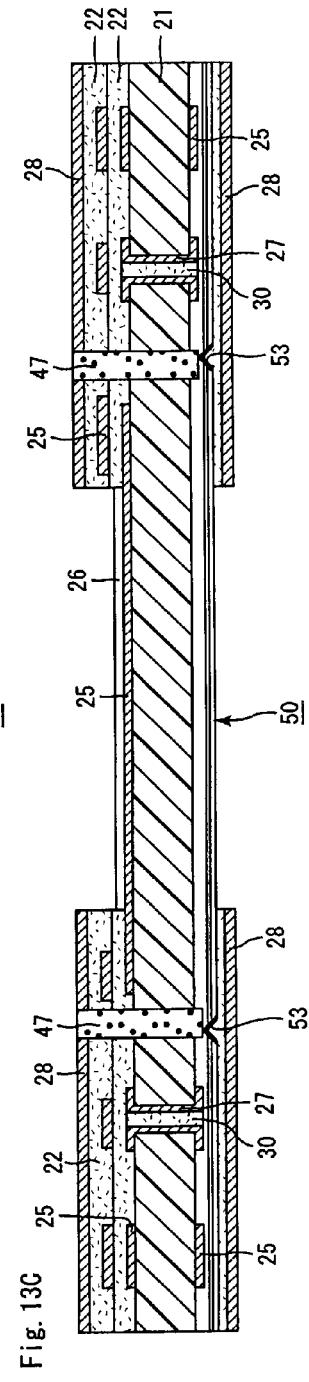

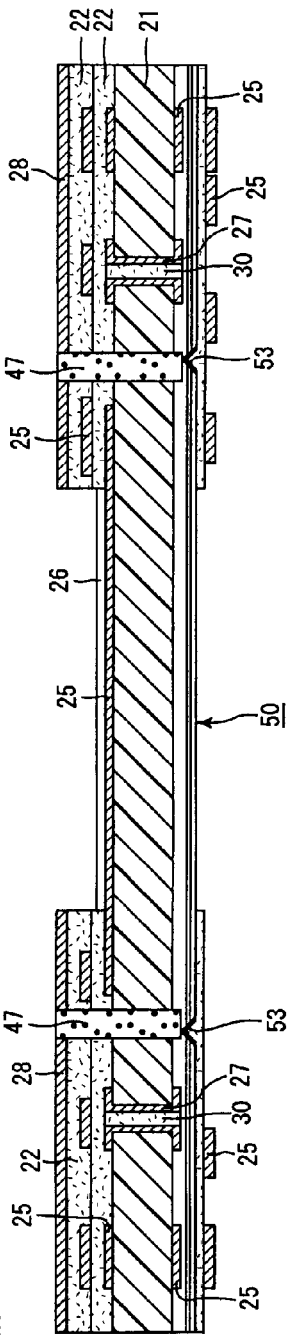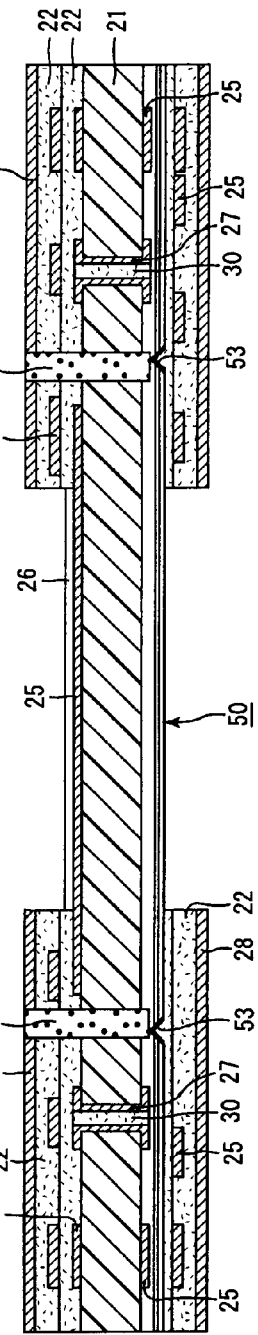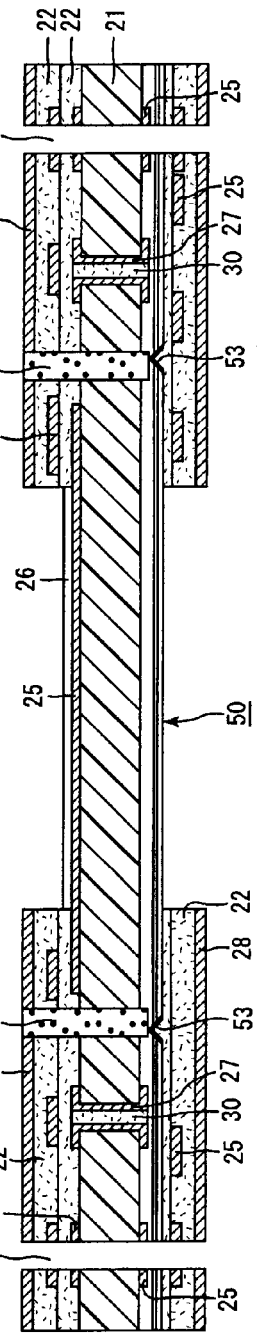

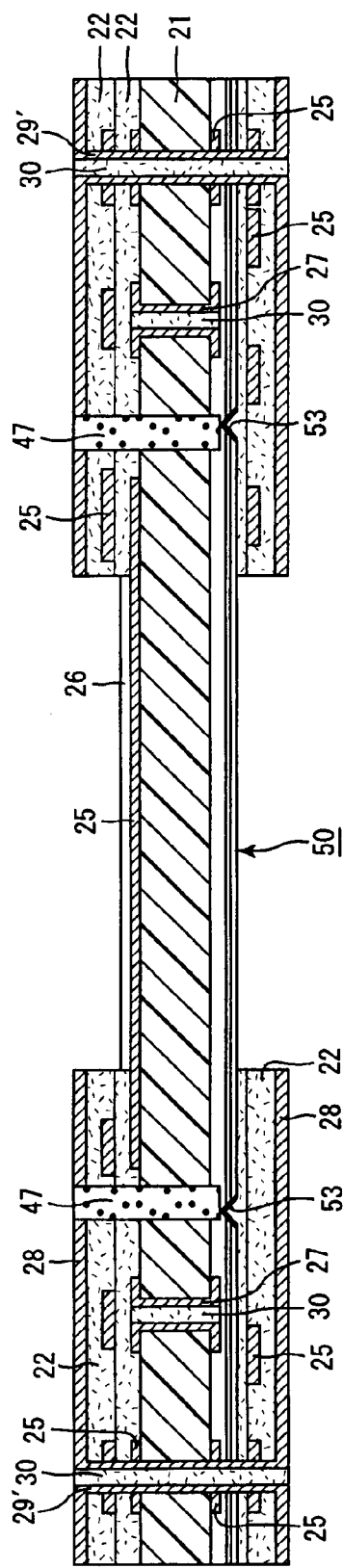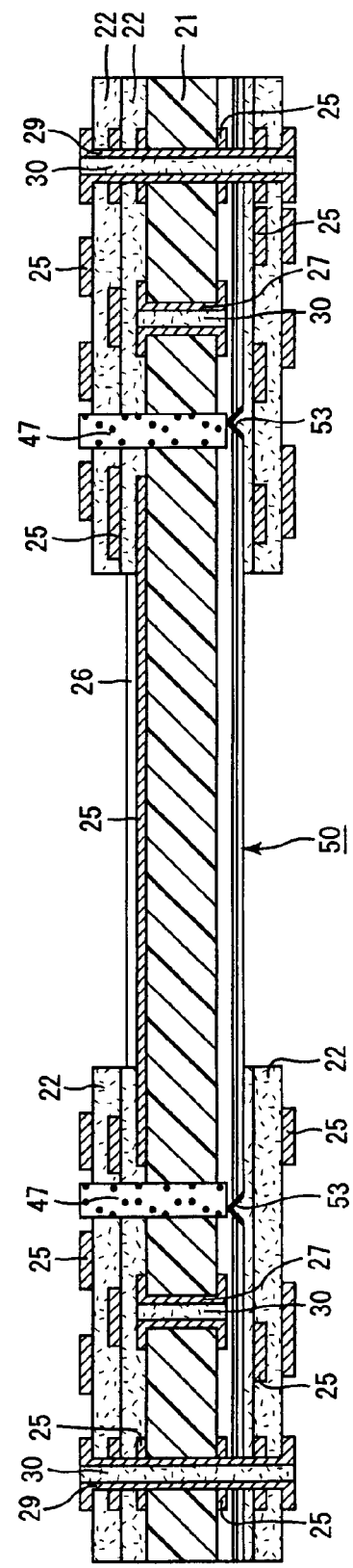

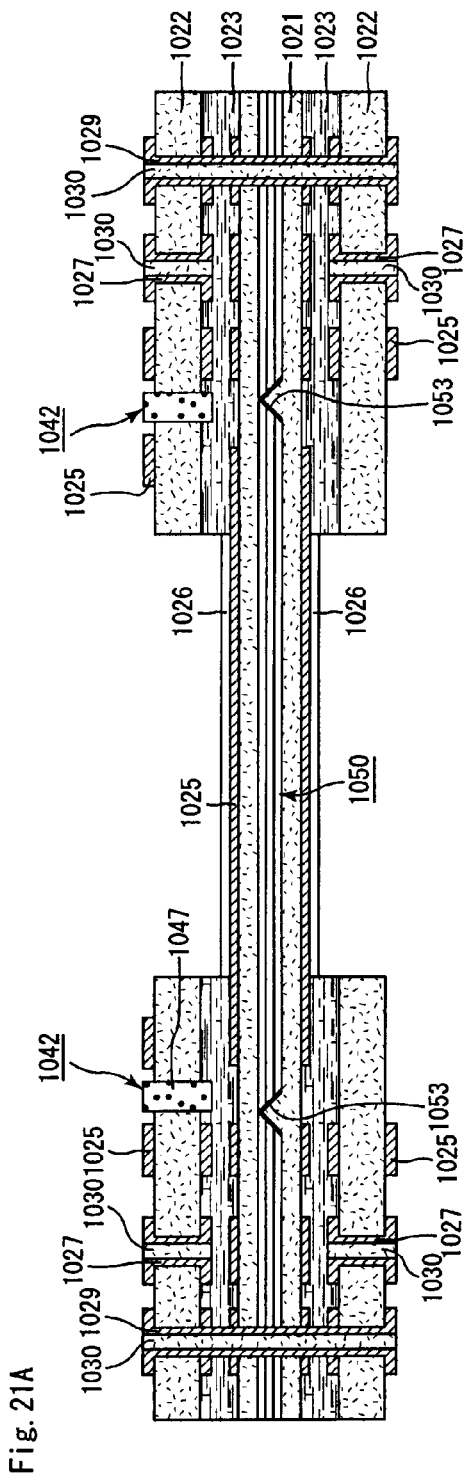
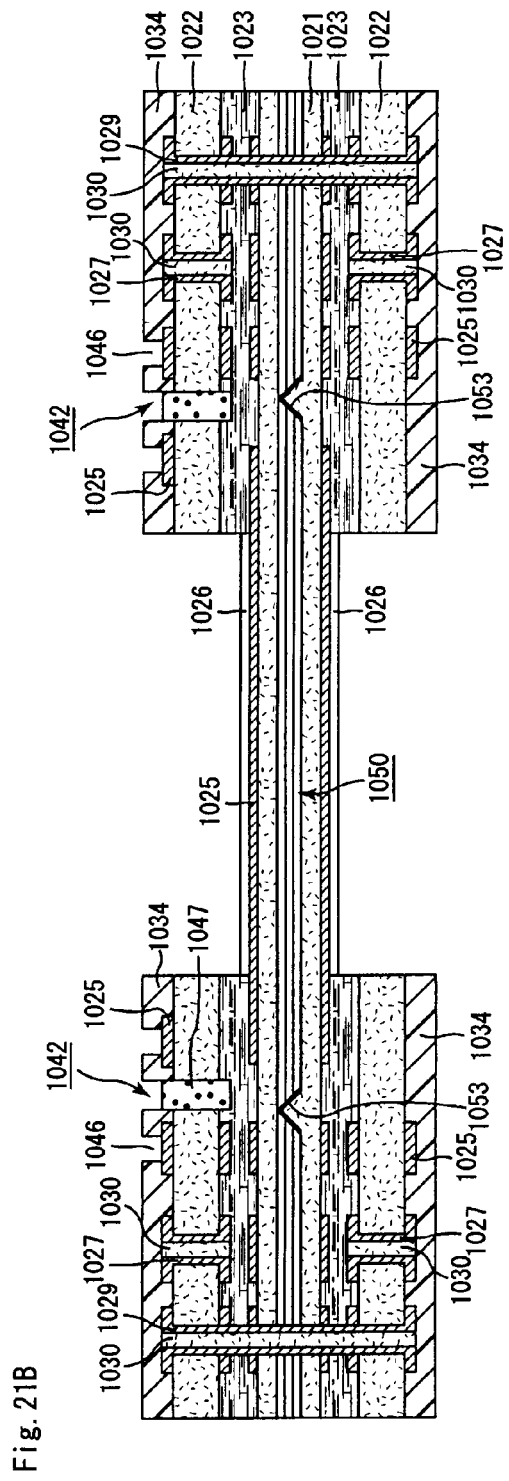
Fig. 21A
Fig. 21B

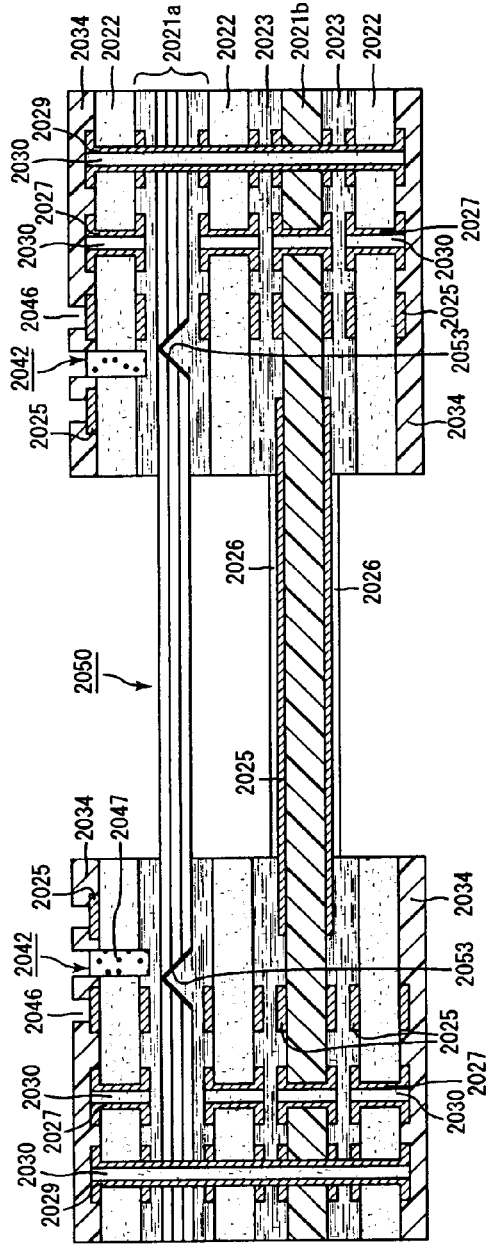
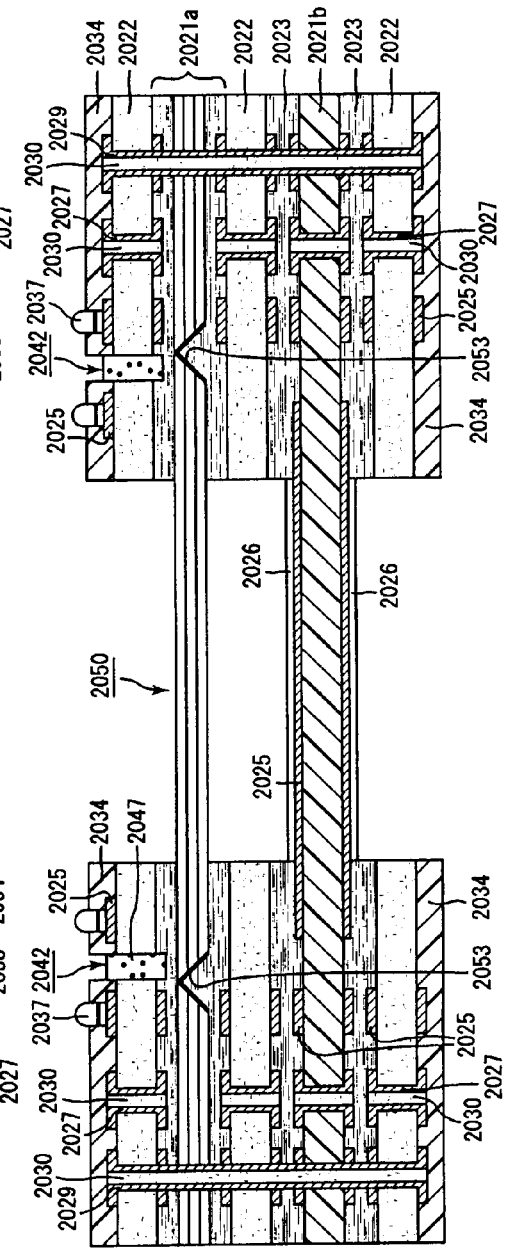
Fig. 25A
Fig. 25B

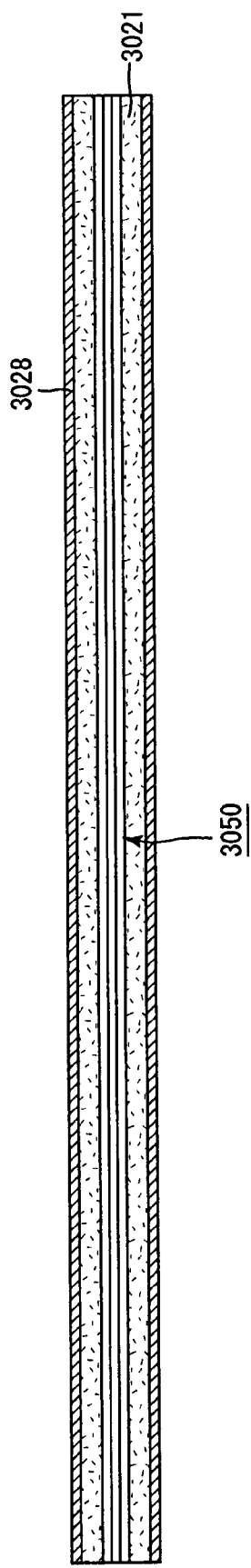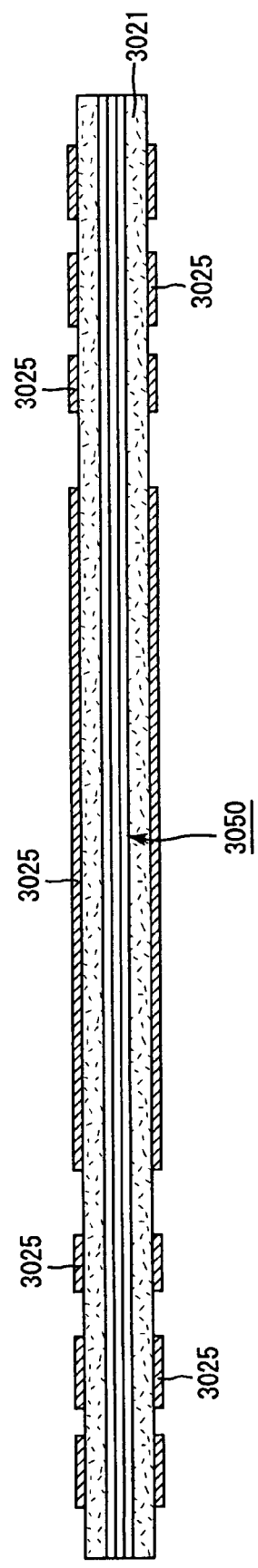

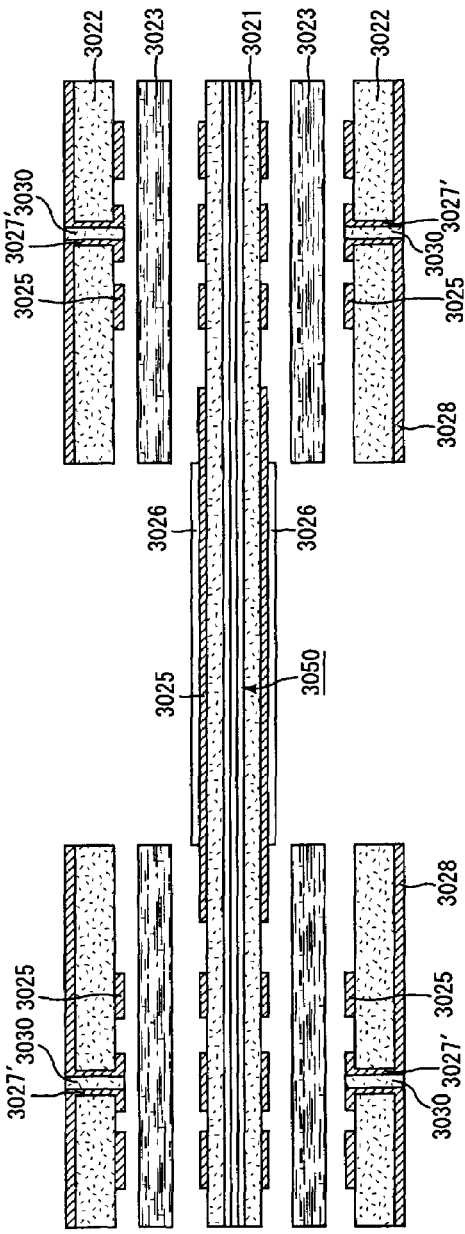
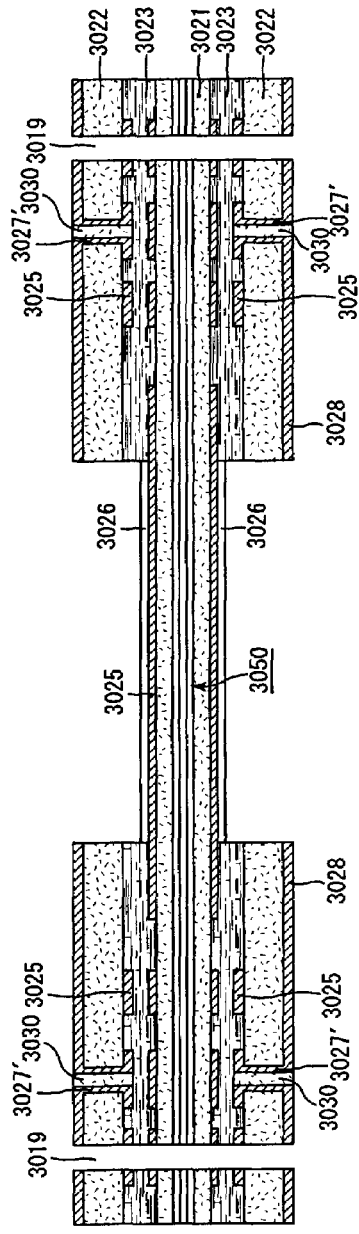
Fig. 27A
Fig. 27B

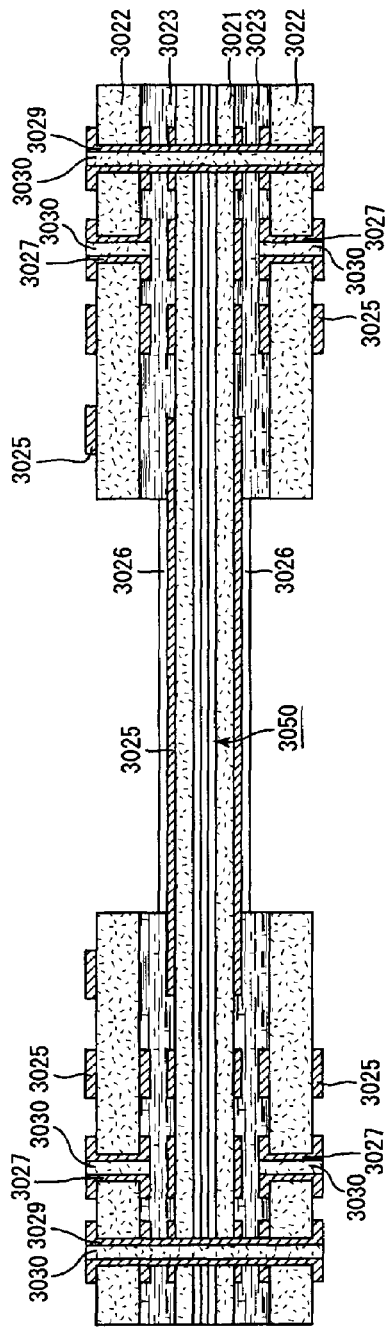
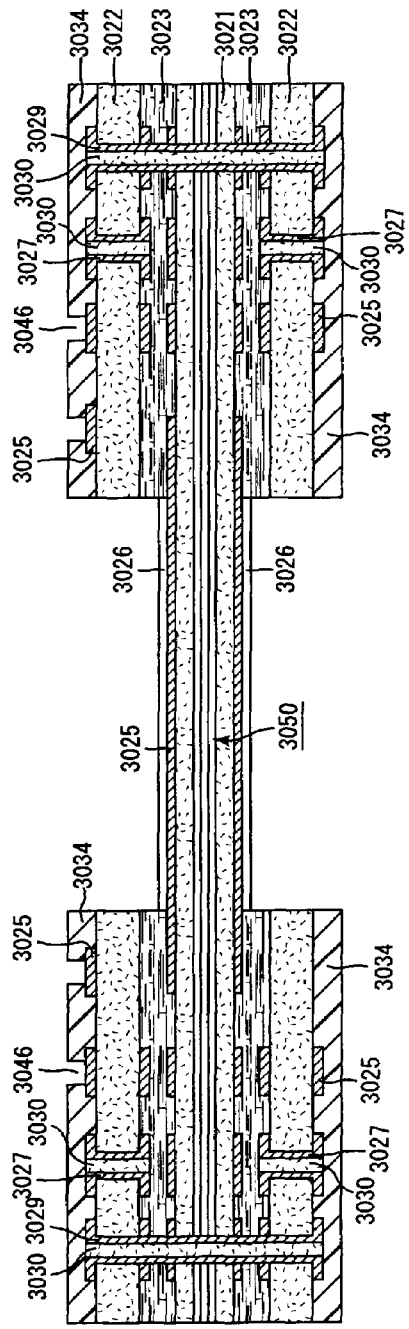
Fig. 28A
Fig. 28B

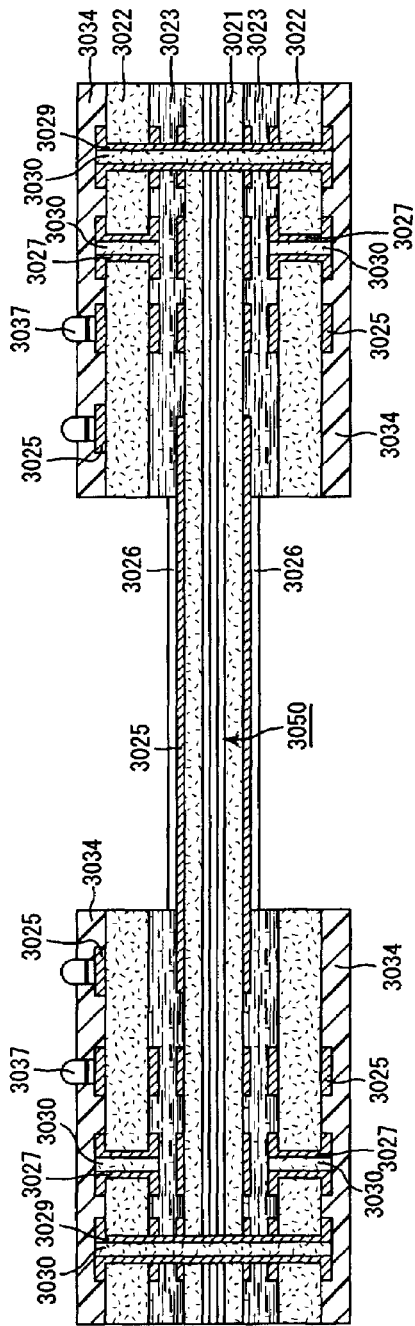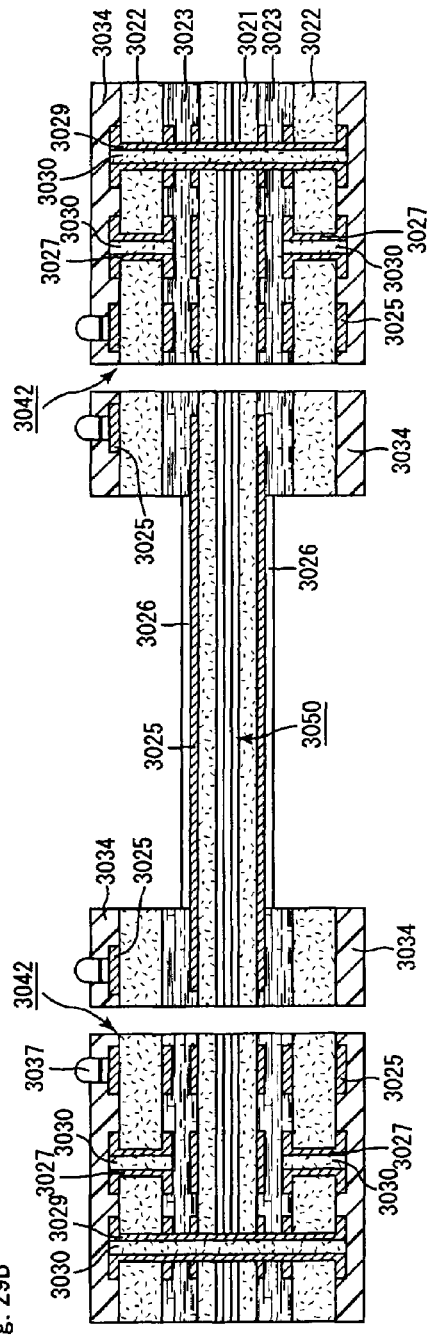
Fig. 29A
Fig. 29B

PHOTOELECTRIC CIRCUIT BOARD AND DEVICE FOR OPTICAL COMMUNICATION

CROSS-REFERENCE TO RELATED APPLICATIONS

This application relates to JP-A 2006-140233 published on Jun. 1, 2006. The contents of this application are incorporated herein by reference in their entirety.

BACKGROUND OF THE INVENTION

1. Field of the Invention

The present invention relates to a photoelectric circuit board and a device for optical communication.

2. Discussion of the Background

To meet the miniaturization needs of device applications, a flex-rigid substrate has been conventionally used in an electric device such as personal computers, digital video cameras, digital cameras, CCD modules, liquid crystal panels and optical conversion modules.

Various kinds of flex-rigid substrates to be used in electric devices of this kind have been proposed (for example, see JP-A 06-268339).

Moreover, a larger data processing capacity and a faster data processing capacity have been demanded for the above-described devices as a result of a much improved performance and multifunction capability.

The contents of JP-A H06-268339 are incorporated herein by reference in their entirety.

SUMMARY OF THE INVENTION

A photoelectric circuit board according to a first aspect of the present invention is a photoelectric circuit board, wherein a rigid portion where at least a conductor circuit and an insulating layer are formed and layered and one or more flex portions that are bendable are integrated, external connection portions for mounting an optical element and/or a package substrate on which an optical element is mounted are formed in the above-described rigid portion, and an optical circuit is formed in at least one of the above-described flex portions.

In the photoelectric circuit board according to the first aspect of the present invention, a conductor circuit and an insulating layer are desirably formed and layered on both sides of a substrate in the above-described rigid portion.

In the photoelectric circuit board according to the first aspect of the present invention, an optical waveguide in film form is desirably an optical circuit, formed in the above-described flex portion, and a substrate in the above-described rigid portion.

In the photoelectric circuit board according to the first aspect of the present invention, a conductor circuit, as well as an optical circuit, is desirably formed in at least one of the above-described flex portions.

Desirably, the photoelectric circuit board according to the first aspect of the present invention has a plurality of the above-described flex portions, an optical circuit and/or a conductor circuit are/is formed in each of the flex portions. Of the above-described flex portions, at least one flex portion comprises an optical circuit out of the optical circuit and the conductor circuit, and at least another flex portion comprises a conductor circuit out of the optical circuit and the conductor circuit.

In this case, a flex portion in which the optical circuit is formed and a flex portion in which the conductor circuit is desirably formed are formed in the same layer.

In the photoelectric circuit board according to the first aspect of the present invention, a conductor circuit is formed in the above-described flex portion, and a portion or the entirety of the above-described conductor circuit that is formed in the above-described flex portion is desirably of a power supply pattern and/or a ground pattern.

In the photoelectric circuit board according to the first aspect of the present invention, a cover lay is desirably formed in an outermost layer in at least one side of the above-described flex portion.

In the photoelectric circuit board according to the first aspect of the present invention, the above-described optical circuit is desirably an optical waveguide.

Then, in the above-described flex portion, desirably, a conductor circuit functioning as a signal pattern or a power supply pattern is formed on one side of a substrate, and a conductor circuit functioning as a ground pattern is formed on the other side of the above-described substrate, and the above-described optical waveguide is formed on the above-described conductor circuit functioning as a ground pattern.

In addition, in the above-described flex portion, desirably, a conductor circuit functioning as a signal pattern is formed on one side of a substrate, and a conductor circuit functioning as a ground pattern or a power supply pattern is formed by interposing an insulating layer, and a conductor circuit functioning as a ground pattern is formed on the other side of the above-described substrate, and the above-described optical waveguide is formed on the above-described conductor circuit functioning as a ground pattern.

In addition, in the above-described flex portion, desirably, a conductor circuit with differential line functioning as a signal pattern is formed on one side of a substrate, and a conductor circuit functioning as a ground pattern or a power supply pattern is formed on the other side of the above-described substrate, and the above-described optical waveguide is formed on the above-described conductor circuit functioning as a ground pattern.

A photoelectric circuit board according to a second aspect of the present invention is a photoelectric circuit board, wherein a rigid portion where at least a conductor circuit and an insulating layers are formed and layered and one or more flex portions that are bendable are integrated, external connection portions for mounting an optical element and/or a package substrate on which an optical element is mounted are formed and an optical signal transmitting region is formed in the above-described rigid portion, an optical circuit is formed in at least one of the above-described flex portions, and the above-described optical circuit is optically coupled with one end of the above-described optical signal transmitting region of the above-described rigid portion.

In the above-described rigid portion of the photoelectric circuit board according to the second aspect of the present invention, a conductor circuit and an insulating layer are desirably formed and layered on both sides of a substrate.

In the photoelectric circuit board according to the second aspect of the present invention, the above-described optical signal transmitting region is desirably filled in with a resin composite or formed only of an opening.

In the photoelectric circuit board according to the second aspect of the present invention, the above-described optical signal transmitting region is desirably formed so as to penetrate through the above-described substrate and all the above-described insulating layers that configure the above-described rigid portion or so as to penetrate through the above-described substrate and a portion of the above-described insulating layers that configure the above-described rigid portion.

In the photoelectric circuit board according to the second aspect of the present invention, the above-described optical signal transmitting region desirably has a collective through hole structure or an individual through hole structure.

In the photoelectric circuit board according to the second aspect of the present invention, the above-described resin composite desirably has about 70%/mm or more of transmittance of a transmission light.

In the photoelectric circuit board according to the second aspect of the present invention, a microlens is desirably provided on an end portion on the side opposite to the side where the above-described optical signal transmitting region is optically coupled with an optical circuit.

Here, the above-described microlens desirably has about 70%/mm or more of transmittance of a transmission light.

In the photoelectric circuit board according to the second aspect of the present invention, the above-described microlens is desirably provided directly or by interposing an optical adhesive.

In addition, the above-described microlens is desirably provided by interposing a lens marker.

In the photoelectric circuit board according to the second aspect of the present invention, the above-described optical circuit is desirably an optical waveguide where an optical path conversion mirror is formed.

A device for optical communication according to a first aspect of the present invention is a device for optical communication, wherein a rigid portion where at least a conductor circuit and an insulating layer are formed and layered and one or more flex portions that are bendable are integrated, an optical signal transmitting region and external connection portions for mounting an optical element and/or a package substrate on which an optical element is mounted are formed, and the above-described optical signal transmitting region is formed in the above-described rigid portion, the above-described optical element and/or the above-described package substrate are connected to the above-described external connection portions, and an optical circuit is formed in at least one of the above-described flex portions.

In the above-described rigid portion of the device for optical communication according to the first aspect of the present invention, a conductor circuit and an insulating layer are desirably formed and layered on both sides of a substrate.

In the device for optical communication according to the first aspect of the present invention, an optical waveguide in film form is desirably an optical circuit, formed in the above-described flex portion, and a substrate in the above-described rigid portion.

In the device for optical communication according to the first aspect of the present invention, a conductor circuit, as well as an optical circuit, is desirably formed in at least one of the above-described flex portions.

In the device for optical communication according to the first aspect of the present invention, desirably, there are a plurality of the above-described flex portions, and an optical circuit and/or a conductor circuit are/is formed in each of the flex portions. Of the above-described flex portions, desirably, at least one flex portion comprises an optical circuit out of the optical circuit and the conductor circuit, and at least another flex portion comprises a conductor circuit out of the optical circuit and the conductor circuit.

In this case, a flex portion in which an optical circuit is desirably formed and a flex portion in which a conductor circuit is formed are formed in the same layer.

In the device for optical communication according to the first aspect of the present invention, desirably, a conductor circuit is formed in the above-described flex portion, and a portion or the entirety of a conductor circuit that is formed in the above-described flex portion is of a power supply pattern and/or a ground pattern.

In the device for optical communication according to the first aspect of the present invention, a cover lay is desirably formed in an outermost layer on at least one side of the above-described flex portion.

In the device for optical communication according to the first aspect of the present invention, the above-described optical circuit is desirably an optical waveguide in film form.

Then, in the above-described flex portion, desirably, a conductor circuit functioning as a signal pattern or a power supply pattern is formed on one side of a substrate, and a conductor circuit functioning as a ground pattern is formed on the other side of the above-described substrate, and the above-described optical waveguide is formed on the above-described conductor circuit functioning as a ground pattern.

In addition, in the above-described flex portion, desirably, a conductor circuit functioning as a signal pattern is formed on one side of a substrate, and a conductor circuit functioning as a ground pattern or a power supply pattern is formed by interposing an insulating layer, and a conductor circuit functioning as a ground pattern is formed on the other side of the above-described substrate, and the above-described optical waveguide is formed on the above-described conductor circuit functioning as a ground pattern.

In addition, in the above-described flex portion, desirably, a conductor circuit with differential line functioning as a signal pattern is formed on one side of a substrate, and a conductor circuit functioning as a ground pattern or a power supply pattern is formed on the other side of the above-described substrate, and the above-described optical waveguide is formed on the above-described conductor circuit functioning as a ground pattern.

The device for optical communication according to the first aspect of the present invention is desirably used for a cellular phone, a personal computer, a digital video camera, a digital camera, a CCD module, a liquid crystal panel, or an optical conversion module.

In the device for optical communication according to the first aspect of the present invention, a RGB signal is desirably transmitted via an optical circuit, and a screen adjusting signal is transmitted via a conductor circuit.

A device for optical communication according to a second aspect of the present invention comprises a photoelectric circuit board where a rigid portion where at least a conductor circuits and an insulating layer are formed and layered and one or more flex portions that are bendable are integrated, wherein an optical signal transmitting region and external connection portions for mounting an optical element and/or a package substrate on which an optical element is mounted are formed, and the above-described optical signal transmitting region is formed in the above-described rigid portion, the above-described optical element and/or the above-described package substrate are connected to the above-described external connection portions, an optical circuit is formed in at least one of the above-described flex portions, and the above-described optical circuit are optically coupled with and one end of the above-described optical signal transmitting region of the above-described rigid portion.

In the rigid portion of the device for optical communication according to the second aspect of the present invention, a conductor circuit and an insulating layer are desirably formed and layered on both sides of a substrate.

In the device for optical communication according to the second aspect of the present invention, the above-described optical signal transmitting region is desirably filled in with a resin composite or formed only of an opening.

In the device for optical communication according to the second aspect of the present invention, the above-described optical signal transmitting region is desirably formed so as to penetrate through the above-described substrate and all the above-described insulating layers that configure the above-described rigid portion or so as to penetrate only through the above-described substrate and a portion of the above-described insulating layers that configure the above-described rigid portion.

In the device for optical communication according to the second aspect of the present invention, the above-described optical signal transmitting region desirably has a collective through hole structure or an individual through hole structure.

In the device for optical communication according to the second aspect of the present invention, the above-described resin composite desirably has about 70%/mm or more of transmittance of a transmission light.

In the device for optical communication according to the second aspect of the present invention, a microlens is desirably provided on an end portion on the side opposite to the side where the above-described optical signal transmitting region is optically coupled with an optical circuit.

Here, the above-described microlens desirably has about 70%/mm or more of transmittance of a transmission light.

In the device for optical communication according to the second aspect of the present invention, the above-described microlens is desirably provided directly or by interposing optical adhesive.

In addition, the above-described microlens is desirably provided by interposing a lens marker.

In the device for optical communication according to the second aspect of the present invention, the above-described optical circuit is desirably an optical waveguide where an optical path conversion mirror is formed.

In the device for optical communication according to the second aspect of the present invention, an optical path conversion member is desirably provided in the above-described photoelectric circuit board.

Here, the above-described optical path conversion member is desirably fixed to the above-described optical element.

In addition, the above-described optical path conversion member is desirably provided on the above-described photoelectric circuit board by interposing a submount substrate.

In addition, the above-described optical path conversion member is desirably fixed to the wall side of the above-described optical signal transmitting region by interposing an adhesive.

In the device for optical communication according to the second aspect of the present invention, an optical path conversion mirror is desirably formed in the above-described optical path conversion member.

In addition, a convex lens or a grating lens is desirably formed on a reflective side of the above-described optical path conversion member.

In the device for optical communication according to the second aspect of the present invention, desirably, using an optical adhesive layer, an optical path conversion member is fixed on the side opposite to the side of the above-described submount substrate where an optical element is mounted, and the above-described submount substrate is mounted on the above-described photoelectric circuit board by interposing solder.

BRIEF DESCRIPTION OF THE DRAWINGS

FIG. 2A is a cross-sectional view taken along line A-A of the photoelectric circuit board shown in FIG. 1, and FIGS. 2B to 2D are cross-sectional views of a flex portion in other examples of the photoelectric circuit boards according to the embodiments of the present invention.

FIG. 4-1 is a cross-sectional view that schematically shows the photoelectric circuit board according to another embodiment of the present invention.

FIGS. 4-2A, 4-2B and 4-2C are cross-sectional views that schematically show the photoelectric circuit boards according to other embodiments of the present invention.

FIGS. 9-2B and 9-2C are partial cross-sectional views that schematically show the device for optical communication according to other embodiments of the present invention.

FIGS. 13A to 13C are cross-sectional views that schematically show a part of the method for manufacturing a photoelectric circuit board according to one embodiment of the present invention.

FIGS. 14A to 14C are cross-sectional views that schematically show a part of the method for manufacturing a photoelectric circuit board according to one embodiment of the present invention.

FIGS. 15A and 15B are cross-sectional views that schematically show a part of the method for manufacturing a photoelectric circuit board according to one embodiment of the present invention.

FIGS. 21A and 21B are cross-sectional views that schematically show a part of the method for manufacturing a photoelectric circuit board according to one embodiment of the present invention.

FIGS. 25A and 25B are cross-sectional views that schematically show a part of the method for manufacturing a photoelectric circuit board according to one embodiment of the present invention.

FIGS. 26A and 26B are cross-sectional views that schematically show a part of the method for manufacturing a photoelectric circuit board according to one embodiment of the present invention.

FIGS. 27A and 27B are cross-sectional views that schematically show a part of the method for manufacturing a photoelectric circuit board according to one embodiment of the present invention.

FIGS. 28A and 28B are cross-sectional views that schematically show a part of the method for manufacturing a photoelectric circuit board according to one embodiment of the present invention.

FIGS. 29A and 29B are cross-sectional views that schematically show a part of the method for manufacturing a photoelectric circuit board according to one embodiment of the present invention.

DESCRIPTION OF THE EMBODIMENTS

Figure 1:
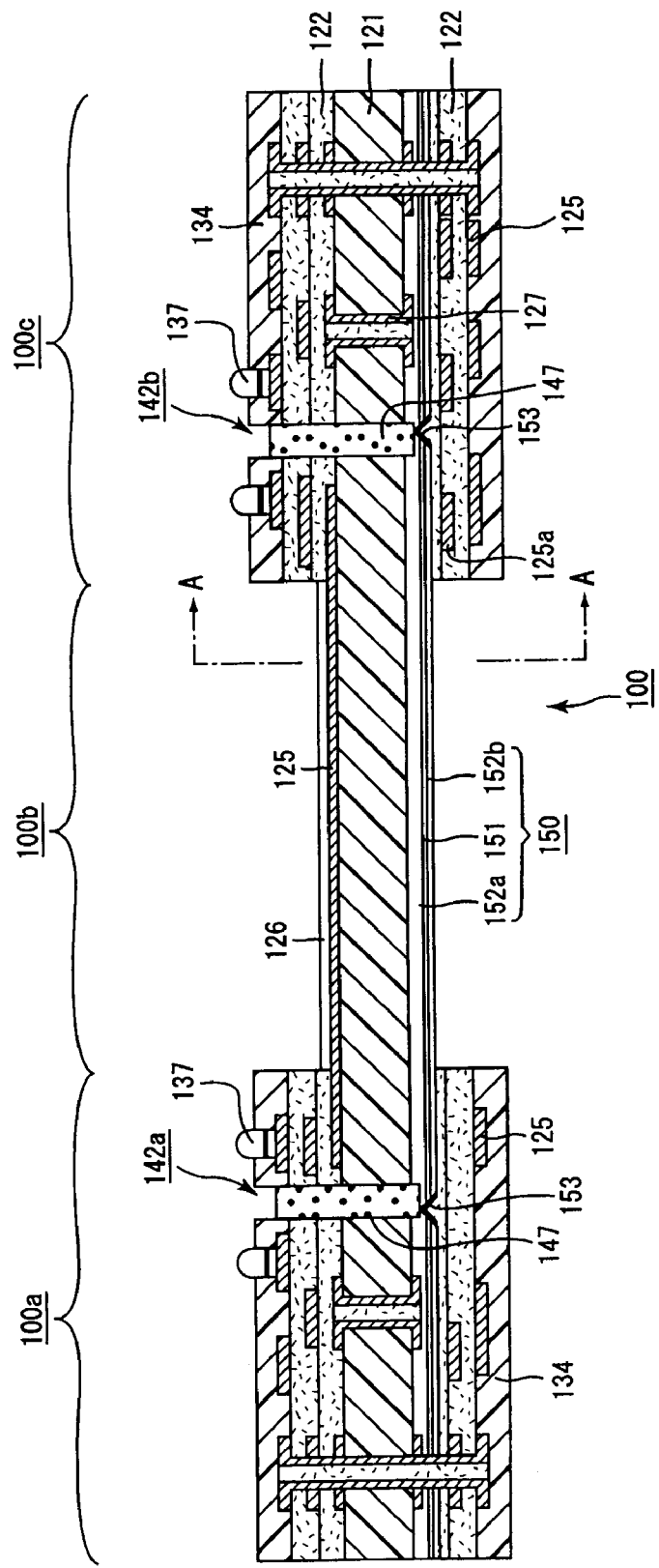
FIG. 1 is a cross-sectional view that schematically shows one example of a photoelectric circuit board according to one embodiment of the present invention.

The photoelectric circuit board according to the embodiments of the first aspect of the present invention is a photoelectric circuit board, wherein a rigid portion where at least conductor circuits and insulating layers are formed and layered and one or more flex portions that are bendable are integrated, external connection portions for mounting an optical element and/or a package substrate on which an optical element is mounted are formed in above-described rigid portion, and an optical circuit is formed in at least one of above-described flex portions.

The photoelectric circuit board according to the embodiments of the second aspect of the present invention is a photoelectric circuit board, wherein a rigid portion where at least a conductor circuit and an insulating layers are formed and layered and one or more flex portions that are bendable are integrated, external connection portions for mounting an optical element and/or a package substrate on which an optical element is mounted are formed and an optical signal transmitting region is formed in the above-described rigid portion, an optical circuit is formed in at least one of the above-described flex portions, and the above-described optical circuit is optically coupled with one end of the above-described optical signal transmitting region of the above-described rigid portion.

The photoelectric circuit boards according to the above-described first and the second aspects of the present invention show a relationship between superordinate and subordinate concepts, and are virtually included in one inventive concept. Therefore, these inventions are described without distinguishing them in the photoelectric circuit boards according to the following embodiments.

In the photoelectric circuit board according to the embodiments of the present invention, a rigid portion and a flex portion are integrated, external connection portions for mounting an optical element and/or a package substrate on which an optical element is mounted (hereinafter simply referred to as an optical element and the like) are formed in above-described rigid portion, and an optical circuit is formed in at least one of above-described flex portions.

Here, as described below, a solder resist layer may be formed as an outermost layer if necessary.

In addition, in the photoelectric circuit board according to the embodiments of the present invention, the structure in which a rigid portion and a flex portion are integrated means that they are configured so as to enable transmission of optical signals therebetween. The specific embodiments thereof are not particularly limited.

In addition, in the subsequent description of the photoelectric circuit board according to the embodiments of the present invention, a photoelectric circuit board according to one embodiment in which conductor circuits and insulating layers are formed and layered on both sides of a substrate is described. Here, in the above-described rigid portion, it is necessary that at least conductor circuits and insulating layers be formed and layered, and the rigid portion does not necessarily comprise a substrate.

In addition, after examination of conversion, to optical signals, of all the signals transmitted from the respective elements to be mounted, and a signal transmission between the respective elements only through optical signals, in this case, it has become clear that the resulting increase in parts count (in each of the elements, it is necessary to mount a light emitting element, a driver IC for driving a light emitting element, a light receiving element, an amplifier IC that adjusts an electrical signal after photoelectricity conversion, and the like) involves the necessity to increase areas of circuit boards, leading to prevention of miniaturization of the device; in addition, it causes a cost increase and economic disadvantage.

Furthermore, in the case where a signal transmission between the respective elements is carried out through an optical signal, it is necessary to perform power supply and connection to ground in each of the rigid portions; whereas in the case where part thereof is carried out through an optical signal and the rest thereof through an electrical signal, power supply and connection to ground tend to be conducted at one place.

The device for optical communication according to the embodiments of the first aspect of the present invention that has been manufactured based on these is a device for optical communication, wherein a rigid portion where at least a conductor circuit and an insulating layer are formed and layered and one or more flex portions that are bendable are integrated, an optical signal transmitting region and external connection terminals for mounting an optical element and/or a package substrate on which an optical element is mounted are formed, and the above-described optical signal transmitting region is formed in the above-described rigid portion, the above-described optical element and/or the above-described package substrate are connected to the above-described external connection terminals, and an optical circuit is formed in at least one of the above-described flex portions.

The device for optical communication according to the embodiments of the second aspect of the present invention is a device for optical communication comprising a photoelectric circuit board where a rigid portion where at least a conductor circuits and an insulating layer are formed and layered and one or more flex portions that are bendable are integrated, wherein an optical signal transmitting region and external connection portions for mounting an optical element and/or a package substrate on which an optical element is mounted are formed, and the above-described optical signal transmitting region is formed in the above-described rigid portion, the above-described optical element and/or the above-described package substrate are connected to the above-described external connection portions, an optical circuit is formed in at least one of the above-described flex portions, and the above-described optical circuit are optically coupled with and one end of the above-described optical signal transmitting region of the above-described rigid portion.

The devices for optical communication according to the above-described first and the second aspects of the present invention show a relationship between superordinate and subordinate concepts, and are virtually included in one inventive concept. Therefore, these inventions are described without distinguishing them in the devices for optical communication according to the following embodiments.

Hereinafter, a photoelectric circuit board according to the embodiments of the present invention is first described.

The photoelectric circuit board according to the embodiments of the present invention is described in reference to the drawings.

FIG. 1 is a cross-sectional view schematically showing one embodiment of the photoelectric circuit board of the present invention.

As shown in FIG. 1, a photoelectric circuit board 100 is configured by: rigid portions 100a, 100c, in which conductor circuits 125 and insulating layers 122 are formed and layered sequentially on both sides of a substrate 121 and non-penetrating via holes for connecting conductor circuits together are formed; and a flex portion 100b, in which conductor circuits 125 and an optical waveguide 150 are formed on different sides.

Here, the substrate that configures the rigid portions 100a, 100c, and the substrate that configures the flex portion 100b are one substrate 121. Therefore, the rigid portions 100a and 100c and the flex portion 100b are integrated.

In addition, the optical waveguide is formed on a substrate that configures a flex portion and a substrate that configures a rigid portion, and this optical waveguide 150 is formed of a lower clad 152a, a core 151, and an upper clad 152b. In addition, optical path conversion mirrors 153 are formed in the optical waveguide in such a manner that the angle formed between the optical path conversion mirrors and the side of the substrate 121 that makes contact with the optical waveguide 150 is 45°.

In addition, conductor circuits 125 are formed on the side opposite to the side where the optical waveguide 150 is formed on the substrate 121 in the flex portion, and furthermore, cover lays 126 are formed so as to protect the conductor circuits 125.

Furthermore, in rigid portions 100a, 100c, optical signal transmitting regions 142a, 142b are formed so as to penetrate through a substrate 121, one side of insulating layers 122 and one side of solder resist layers 134, and each one end portion of these optical signal transmitting regions 142a, 142b is optically coupled with an optical waveguide 150. More specifically, as illustrated, the optical waveguide where optical conversion mirrors 153 are formed right under the bottom of the optical signal transmitting regions 142a, 142b is provided.

In addition, a portion of inside of these optical signal transmitting regions 142a, 142b is filled in with a resin composite 147.

In addition, external connection portions 137 for mounting an optical element and the like are formed in outermost layers of the respective rigid portions 100a, 100c.

In addition, an optical waveguide 150 and a conductor circuit 125a are formed on different sides on a substrate 121 in a flex portion 100b.

In the photoelectric circuit board 100 having this configuration, one flex portion is formed, and a conductor circuit, as well as an optical circuit, is formed in this flex portion.

Therefore, in the photoelectric circuit board 100, a signal transmission between the rigid portions that configures the photoelectric circuit board 100 is more likely to be performed through an optical signal, and furthermore, an optical signal may be transmitted more easily.

In addition, in the photoelectric circuit board 100, an optical signal transmitting region is formed so as to penetrate through only a portion of a substrate and insulating layers that configures a rigid portion, namely, the substrate and the insulating layers 122 layered on one side thereof.

As thus described, in the case where the optical signal transmitting region is formed so as to penetrate through the substrate and a portion of the insulating layers that configure the rigid portion, since, on the layer through which the optical signal transmitting region does not penetrate in the substrate and insulating layers that configure a rigid portion, it may become easier to freely form conductor circuits, non-penetrating via holes, and the like without bypassing the optical signal transmitting region, it is suitable for achieving increase in the density of wires (circuits) with regard to an electric circuit.

In addition, as shown in FIG. 1, in the case where an end portion of the optical signal transmitting region are directly optically connected to an optical circuit (here, "directly optically connected" in this case means an embodiment in which an optical signal can be transmitted without interposing an insulating layer), since insulating layers do not need to be transparent, insulating layers can be formed using commercial products and the like, and a photoelectric circuit board is more likely to be manufactured at lower costs.

FIGS. 2A to 2D are cross-sectional views of a flex portion of a photoelectric circuit board according to one embodiment of the present invention.

FIG. 2A is an A-A line cross-sectional view of the photoelectric circuit board shown in FIG. 1. As shown in FIG. 2A, conductor circuits are formed on one side of a substrate 121 (upper in the figure), and the conductor circuits 125 are protected by a cover lay 126, and an optical waveguide comprising a core 151 and a clad 152 is formed on the other side thereof (lower in the figure)

Figures 1A, 9:
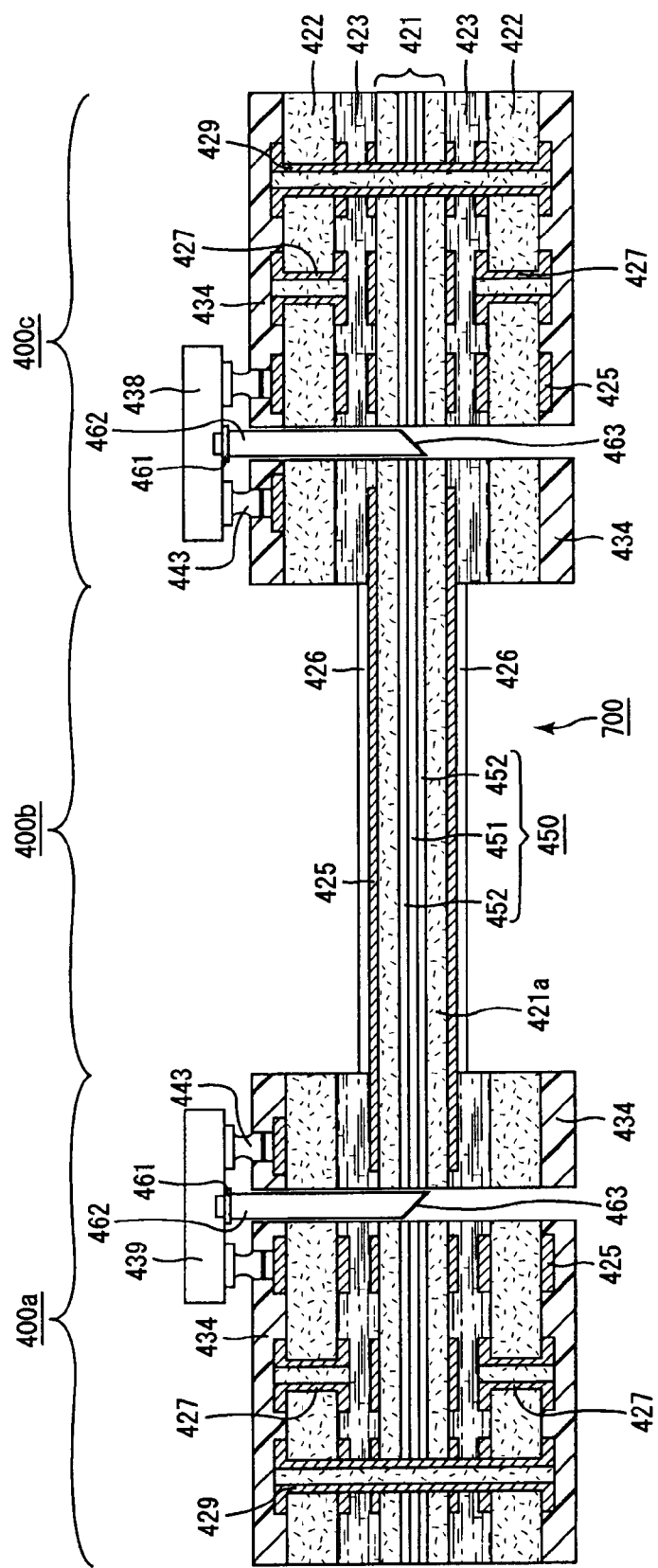
FIG. 9-1A is a cross-sectional view that schematically shows the device for optical communication according to another embodiment of the present invention.
Figures 2C, 9:
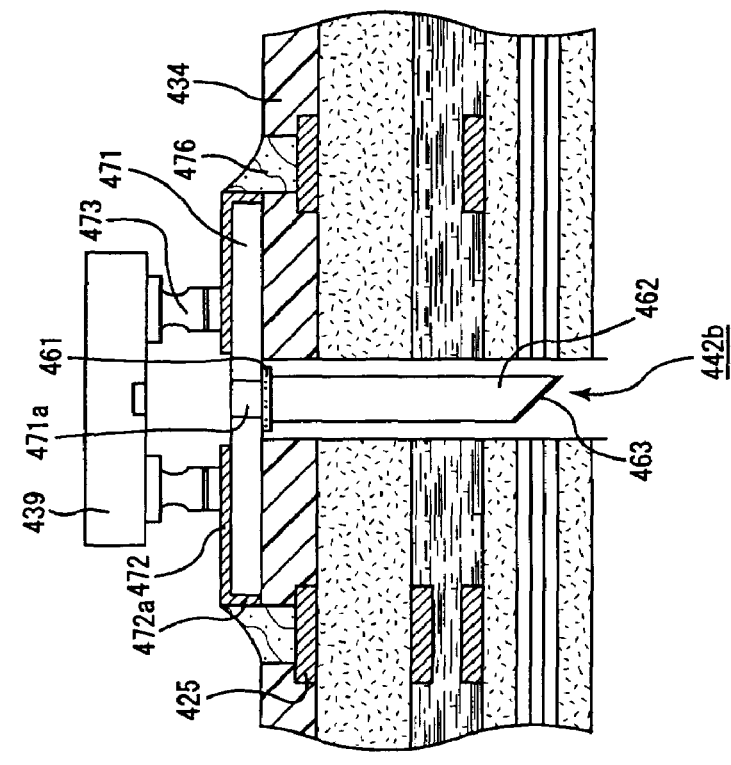
Figures 2B, 9:
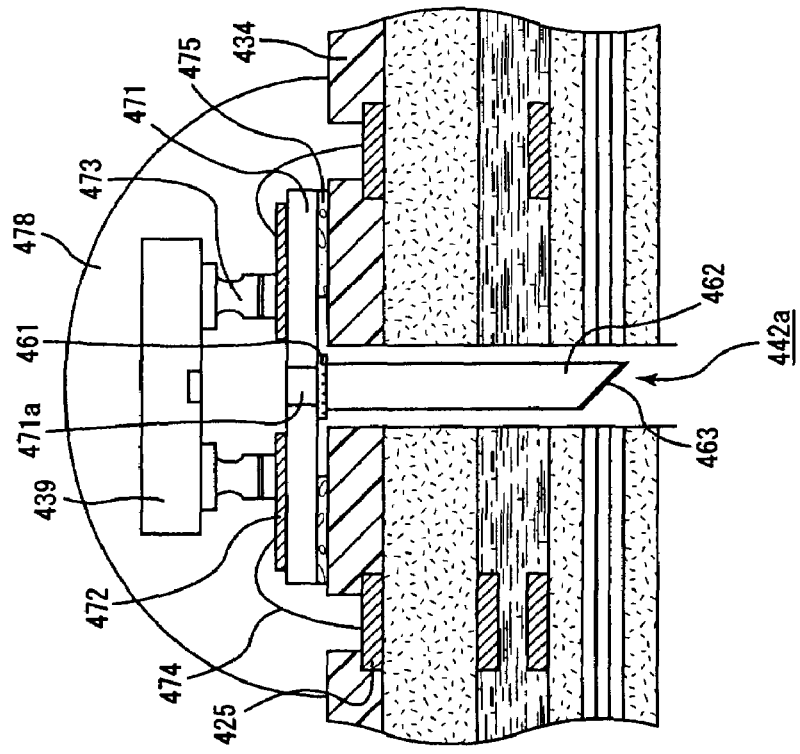

In addition, the structure of the flex portion configuring the photoelectric circuit board according to the embodiments of the present invention is not limited to that shown in FIG. 2A, and it may have structures shown in FIG. 2B to 2D.

FIGS. 2B to 2D are cross-sectional views schematically showing other embodiments of the flex portion configuring the photoelectric circuit board according to the embodiments of the present invention.

As shown in FIG. 2B, a flex portion may have a configuration where conductor circuits 125 functioning as a signal pattern is formed on one side of a substrate 121 (upper in the figure), a conductor circuit 125a functioning as a ground pattern is formed on the other side thereof (lower in the figure), and furthermore, an optical waveguide comprising a core and a clad is formed on the conductor circuit 125a. In such a flex portion, conductor circuits have s stripline structure.

Here, cover lays 126 are formed on the conductor circuits 125, just as in the case of the flex portion shown in FIG. 2A.

As shown in FIG. 2C, a flex portion may have a configuration where on one side of a substrate 121 (upper in the figure), conductor circuits 125 functioning as a signal pattern is formed and a conductor circuit 125a functioning as a ground pattern is formed by interposing insulating layers, and on the other side thereof (lower in the figure), a conductor circuit 125a functioning as a ground pattern is formed and an optical waveguide comprising a core and a clad is formed on the conductor circuit 125a. In such a flex portion, conductor circuits have a micro-stripline structure.

Here, cover lays 126 are formed on the conductor circuits 125, just as in the case of the flex portion shown in FIG. 2A.

As shown in FIG. 2D, a flex portion may have a configuration where conductor circuits 125, with differential line, functioning as a signal pattern is formed on one side of a substrate 121 (upper in the figure), a conductor circuit 125a functioning as a ground pattern is formed on the other side thereof (lower in the figure), and furthermore, an optical waveguide comprising a core and a clad is formed on the conductor circuit 125a. In such a flex portion, it may become possible to carry out differential transmission of an electrical signal. Here, cover lays 126 are formed on the conductor circuits 125, just as in the case of the flex portion shown in FIG. 2A.

Here, cover lays 126 are formed on the conductor circuits 125, just as in the case of the flex portion shown in FIG. 2A.

In addition, the flex portion that configures a photoelectric circuit board according to the embodiments of the present invention may have a configuration in which a power supply pattern instead of a ground pattern is formed in the flex portion shown in FIGS. 2B to 2D.

Figure 3:
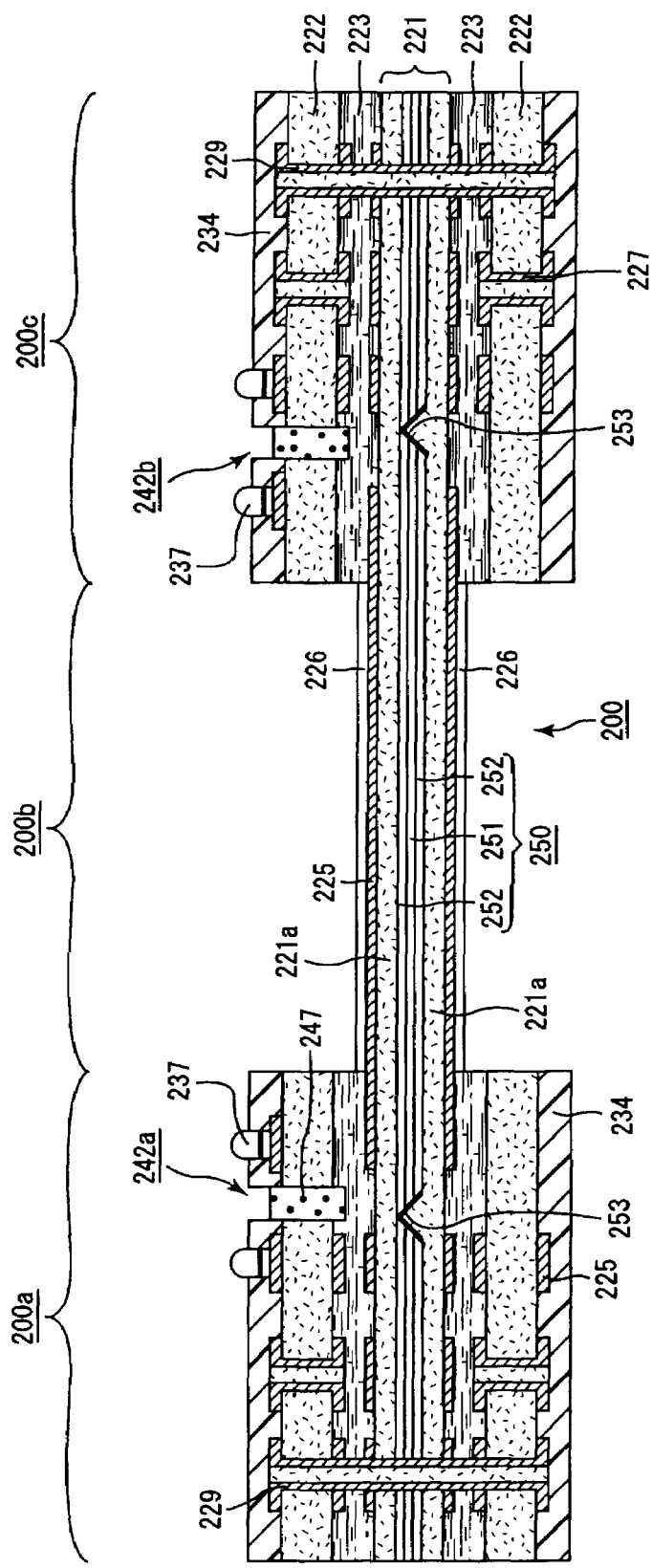
FIG. 3 is a cross-sectional view that schematically shows another example of a photoelectric circuit board according to one embodiment of the present invention.

In addition, a photoelectric circuit board according to the embodiments of the present invention may have a configuration shown in FIG. 3.

FIG. 3 is a cross-sectional view schematically showing another embodiment of the photoelectric circuit board of the present invention.

As shown in FIG. 3, in a photoelectric circuit board 200 is configured by: rigid portions 200a, 200c, in which conductor circuits 225 and insulating layers 223, 222 are formed and layered sequentially on both sides of a substrate 221 and non-penetrating via holes 227 are formed so as to connect conductor circuits together; and a flex portion 200b, in which conductor circuits 225 are formed on both sides of the substrate 221.

Here, the substrate that configures the rigid portions 200a, 200c, and the substrate that configures the flex portion 200b are one substrate 221. Therefore, the rigid portions 200a, 200c and the flex portion 200b are integrated.

Then, the substrate 221 is formed of an optical waveguide 250 and the adjacent resin layers (insulating layers) 221a.

In addition, since the resin layer 221a forms a portion of optical signal transmitting regions 242a, 242b, it has a certain transmittance to a transmission light.

Here, a specific material thereof is described later.

In addition, in the present specification, having a certain transmittance to a transmission light means about 60% /30 µm or more of transmittance of a transmission light at 25° C.

Having a certain transmittance to a transmission light is also referred to as transparent to a transmission light.

In addition, an optical waveguide film 250 is formed of a core 151 and a clad 252. In addition, optical path conversion mirrors 253 are formed in the optical waveguide 250.

In addition, conductor circuits 225 are formed on both sides of a substrate 221 in the flex portion, and furthermore, cover lays 226 are formed so as to protect the conductor circuits 225.

Furthermore, in rigid portions 200a, 200c, optical signal transmitting regions 242a, 242b are formed so as to penetrate through insulating layers 223, 222 on one side of a substrate 221 and solder resist layers 234 on one side thereof, and these optical signal transmitting regions 242a, 242b are optically coupled with the optical waveguide 250. More specifically, as illustrated, the optical conversion mirrors 253 are provided right under the optical signal transmitting regions 242a, 242b.

In addition, a portion of inside of these optical signal transmitting regions 242a, 242b is filled in with a resin composite 247.

In addition, external connection portions for mounting an optical element and the like are formed in outermost layers of the respective rigid portions 200a, 200c.

In addition, in a photoelectric circuit board 200 having this configuration, one flex portion is formed, and a conductor circuit, as well as an optical circuit, is formed in this flex portion.

Therefore, in the photoelectric circuit board 200, a signal transmission between the rigid portions that configures the photoelectric circuit board 200 is more likely to be performed through an optical signal, and furthermore, an optical signal may be transmitted more easily.

Each of the conductor circuits 225 formed in a flex portion 200b may be of any of a signal pattern, a power supply pattern, and a ground pattern, and a portion or the entirety thereof is desirably of a power supply pattern and/or a ground pattern.

In the case where a conductor circuit is not formed in the flex portion and only a optical circuit is formed, power supply needs to be provided in the respective rigid portions; whereas in the case where a conductor circuit formed in the flex portion is of a power supply pattern or a ground pattern, it is necessary to provide power supply in one of the plurality of the rigid portions, and it is suitable for miniaturization of the photoelectric circuit board and mounting with higher density of wires (circuits)

In addition, in the photoelectric circuit board 200, an optical signal transmitting region is formed so as to penetrate through only a portion of a substrate and insulating layers that configure a rigid portion, namely, a portion of the substrate 221, and the insulating layers 222, 223 layered on one side thereof.

In addition, a portion of the optical signal transmitting region 242 is formed of insulating layers (insulating layers 223 and the like) transparent to a transmission light. These transparent insulating layers can be formed using a material excellent in transparency to a transmission light (for example, a transmittance is about 90%/mm or more), but they can also be formed using a material with about 60%/30 µm or more of transmittance to a transmission light, and such a material is cheaper and economically advantageous.

The embodiment of the photoelectric circuit board with one flex portion has been described herein. Photoelectric circuit boards according to the embodiments of the present invention may have a plurality of flex portions.

Figures 1, 4:
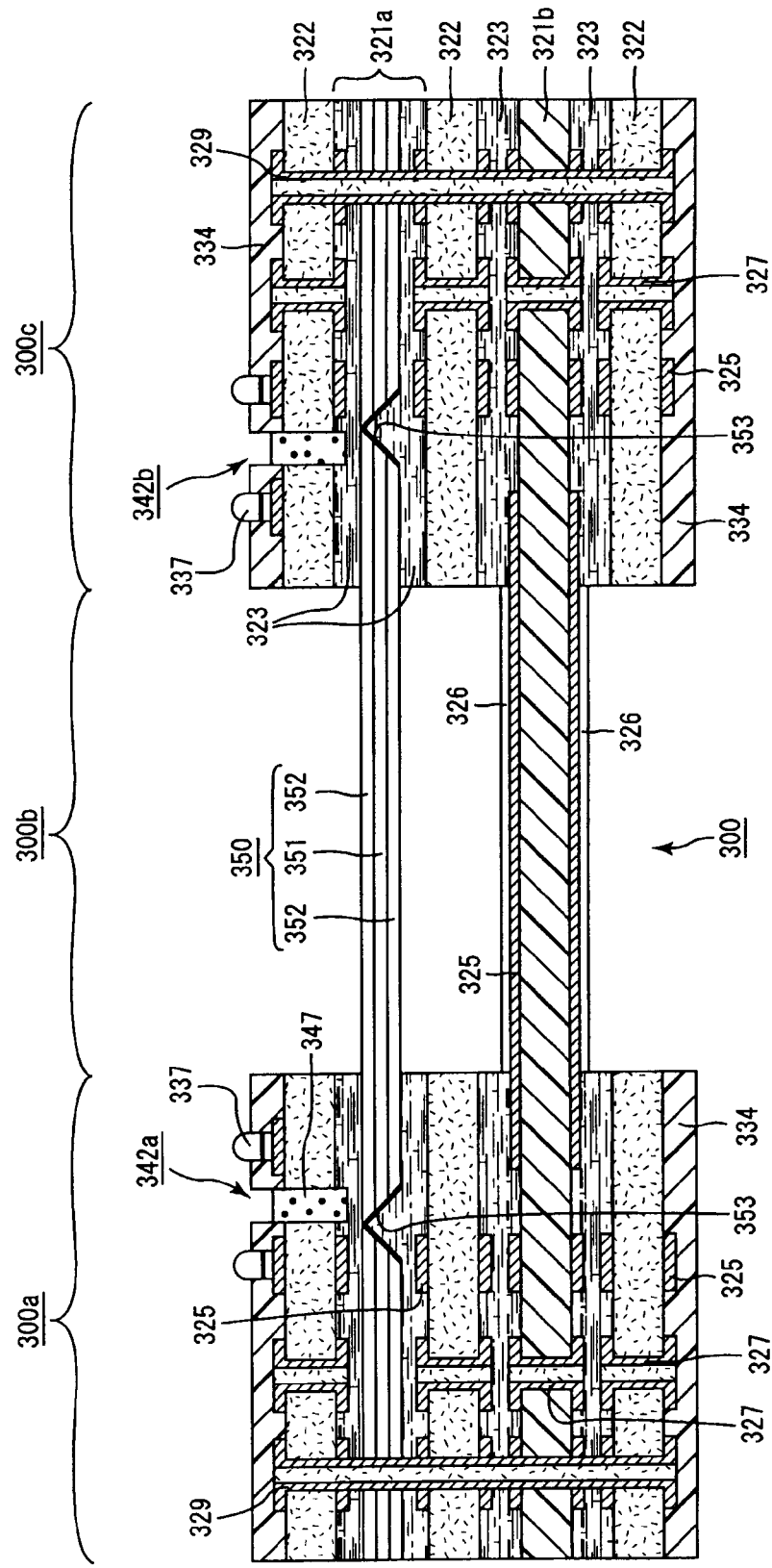

FIG. 4-1 is a cross-sectional view schematically showing a photoelectric circuit board according to another embodiment of the present invention.

As shown in FIG. 4-1, a photoelectric circuit board 300 is configured by: a substrate 321a comprising an optical waveguide film 350 and insulating layers that are formed so as to cover both ends thereof; a substrate 321b on both sides of which conductor circuits 325 are formed; insulating layers 323, 322; and conductor circuits 325.

In addition, non-penetrating via holes 327 for connecting conductor circuits together are formed.

Then, the portions where the insulating layers 322, 323 are layered on the substrates 321a, 321b configure rigid portions 300a, 300c, and the portions where an insulating layer is not layered configure the flex portion 300b. The substrates 321a, 321b are constituent materials of the rigid portions and the flex portion, and the rigid portions 300a, 300c, and the flex portion 300b are integrated.

The substrate 321a is configured in such a manner that the insulating layers 323 are formed so as to cover both ends of an optical waveguide film comprising a core 351 and a clad 352. Then, optical path conversion mirrors 353 are formed in the optical waveguide film 350.

In addition, conductor circuits 325 are formed on both sides of the substrate 321b, and furthermore, cover lays 326 are formed so as to protect the conductor circuits 325.

Furthermore, in rigid portions 300a, 300c, optical signal transmitting regions 342a, 342b are formed so as to penetrate through insulating layers 323 on one side of a substrate 321 (upper in the figure) and solder resist layers 334 on one side thereof, and these optical signal transmitting regions 342a, 342b are optically coupled with an optical waveguide 350. More specifically, as illustrated, optical conversion mirrors 353 are provided right under the optical signal transmitting regions 342a, 342b.

In addition, a portion of inside of these optical signal transmitting regions 342a, 342b is filled in with a resin composite 347.

In the photoelectric circuit board 300, the optical signal transmitting region is formed so as not to penetrate through a substrate.

In addition, external connection portions 337 for mounting an optical element and the like are formed in outermost layers of each of the rigid portions 300a, 300c.

In the photoelectric circuit board 300 having such a configuration, two flex portions are formed, only an optical circuit is formed in one flex portion, and only a conductor circuit is formed in the other flex portion.

Therefore, in the photoelectric circuit board 300, a signal transmission between rigid portions that configure the photoelectric circuit board 300 tends to be carried out through an optical signal, and furthermore, an electrical signal is more likely to be transmitted in the case where conductor circuits formed in the flex portion is of a signal pattern.

Here, each of the conductor circuits 325 formed in a flex portion 300b may be of any of a signal pattern, a power supply pattern, and a ground pattern, and a portion or the entirety thereof is desirably of a power supply pattern and/or a ground pattern.

The reasons therefor are as described above.

In addition, in the photoelectric circuit board 300 shown in FIG. 4-1, a plurality of flex portions where only either an optical circuit or a conductor circuit is formed are formed, and each of the flex portions is formed so as to be integrated in different layers. In the case where a plurality of flex portions where only either an optical circuit or a conductor circuit is formed are formed, each of the flex portions may have a configuration so that it is integrated in the same layer of the rigid portion.

More specifically, the photoelectric circuit board may have a configuration shown in FIG. 4-2A to 4-2C, for example.

FIG. 4-2A is a perspective view schematically showing a photoelectric circuit board according to another embodiment of the present invention, FIG. 4-2B is an A-A' line cross-sectional view of FIG. 4-2A, and FIG. 4-2C is a B-B' line cross-sectional view of FIG. 4-2A.

As shown in FIG. 4-2A, a photoelectric circuit board 900 is configured by integrating rigid portions 900a, 900c, and a flex portion 900b, and has a plurality of flex portions 900b (1900a, 1900b).

The flex portion 1900a is configured in such a manner that an optical waveguide 950 is formed on one side of a substrate 921a and cover lays 926 are formed on the side opposite to the side where the optical waveguide is formed; and the rigid portion 1900b is configured in such a manner that conductor circuits 925 are formed on both sides of a substrate 921b (in FIG. 4-2C, only one side of conductor circuits are shown) and cover lays are formed so as to protect these conductor circuits 925. The optical waveguide 950 is formed of a core 951 and a clad 952, and furthermore, optical conversion mirrors 953 are formed therein.

Rigid portions 900a, 900c are configured in such a manner that conductor circuits 925 and insulating layers 922 are formed and layered on both sides of the substrates 921a, 921b.

In addition, non-penetrating via holes 927 for connecting the conductor circuits together that sandwich the insulating layers are formed.

As thus described, the substrates 921a, 921b are constituent members of the rigid portions and the flex portion, and the rigid portions 900a, 900c and the flex portion 900b are integrated.

In addition, both the substrates 921a and 921b configures the same layer of the rigid portions, and the respective rigid portions have a configuration in which the rigid portions are integrated in the same layer.

Furthermore, in rigid portions 900a, 900c, optical signal transmitting regions 942a, 942b (see FIG. 4-2B) are formed so as to penetrate through insulating layers 922 on one side of a substrate 921a (upper in the figure) and solder resist layers 934 on one side thereof, and these optical signal transmitting regions 942a, 942b are optically coupled with an optical waveguide 950. More specifically, as illustrated, optical conversion mirrors 953 are provided right under the optical signal transmitting regions 942a, 942b.

In addition, a portion of inside of these optical signal transmitting regions 942a, 942b is filled in with a resin composite 947.

In the photoelectric circuit board 900, the optical signal transmitting region is formed so as not to penetrate through a substrate.

In addition, external connection portions 937 for mounting an optical element and the like are formed in outermost layers of each of the rigid portions 900a, 900c.

In the photoelectric circuit board 900 having such a configuration, two flex portions are formed, only an optical circuit is formed on the substrate in one flex portion, only a conductor circuit is formed on the substrate in the other flex portion, and the flex portion where an optical circuit is formed and the flex portion where a conductor circuit is formed are formed in the same layer.

Therefore, in the photoelectric circuit board 900, a signal transmission between rigid portions that configure the photoelectric circuit board 300 tends to be carried out through an optical signal, and furthermore, an electrical signal is also more likely to be transmitted in the case where conductor circuits formed in the flex portion is of a signal pattern.

Here, each of the conductor circuits 925 formed in a flex portion 900b may be of any of a signal pattern, a power supply pattern, and a ground pattern, and a portion or the entirety thereof is desirably of a power supply pattern and/or a ground pattern.

The reasons therefor are as described above.

In addition, as shown in FIG. 4-2A, in the case where the flex portion where an optical circuit is formed and the flex portion where a conductor circuit is formed are formed in the same layer, the freedom of design will be improved.

This is because, although in the layer where a flex portion is integrated with rigid portions, it is hard to form a conductor circuit, a conductor circuit is not formed, and there tend to many areas consisting only of insulating layers; conductor circuits are more likely to be formed in insulating layers in other layers more efficiently by configuring the flex portion where an optical circuit is formed and the flex portion where a conductor circuit is formed.

As shown in FIGS. 4-1, 4-2A, in the photoelectric circuit boards 300, 900, a plurality of flex portions are formed, and either an optical circuit or a conductor circuit is formed in the respective flex portions, but the photoelectric circuit boards according to the embodiments of the present invention are not necessarily limited to those where either an optical circuit or a conductor circuit is formed in the respective flex portions, and both an optical circuit and a conductor circuit may be formed in one flex portion just as in the case of the photoelectric circuit board 100, shown in FIG. 1, and the like.

The thickness of the flex portion is more likely to be reduced in the configuration where either an optical circuit or a conductor circuit is formed in the flex portion than in the configuration where both thereof are formed, and the flex portion may be bent more easily, whereby the freedom of transformation will be enhanced in using a photoelectric circuit board.

In addition, in the case where only the optical circuit is formed in the flex portion, since this flex portion is not formed of hardly bendable metal layers but only of easily bendable resin, stress concentration due to a bent flex portion tends to be alleviated, and stress is applied on the entirety of the flex portion, facilitating prevention of increase in transmission loss of an optical signal caused by the bent flex portion. In addition, since the thickness of the flex portion is more likely to be reduced in the case where a conductor circuit is formed in the flex portion, stress concentration in bending tends to be alleviated.

In addition, formation of only either an optical circuit or a conductor circuit is more likely to reduce the number of processes, making it easier to manufacture a flex portion.

In addition, in the case where an optical circuit and a conductor circuit are formed in the same flex portion, cracks in the optical circuit may occur due to the difference in the coefficient of thermal expansion of both of them; whereas in the case where only either one thereof is formed, the matching of the coefficient of thermal expansion may be achieved more easily, and occurrence of cracks is more likely to be prevented, tending to improve the reliability thereof.

Figure 5:
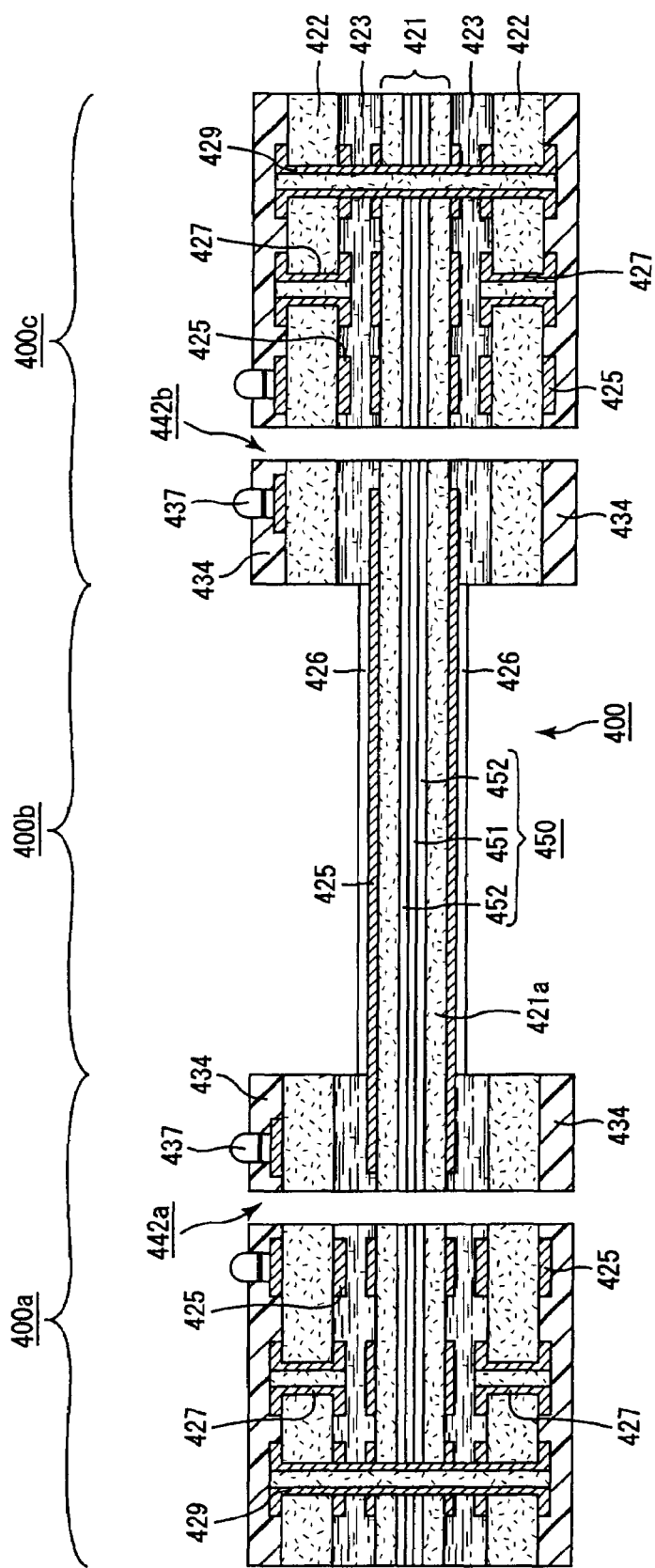
FIG. 5 is a cross-sectional view that schematically shows the photoelectric circuit board according to another embodiment of the present invention.
Figure 6:
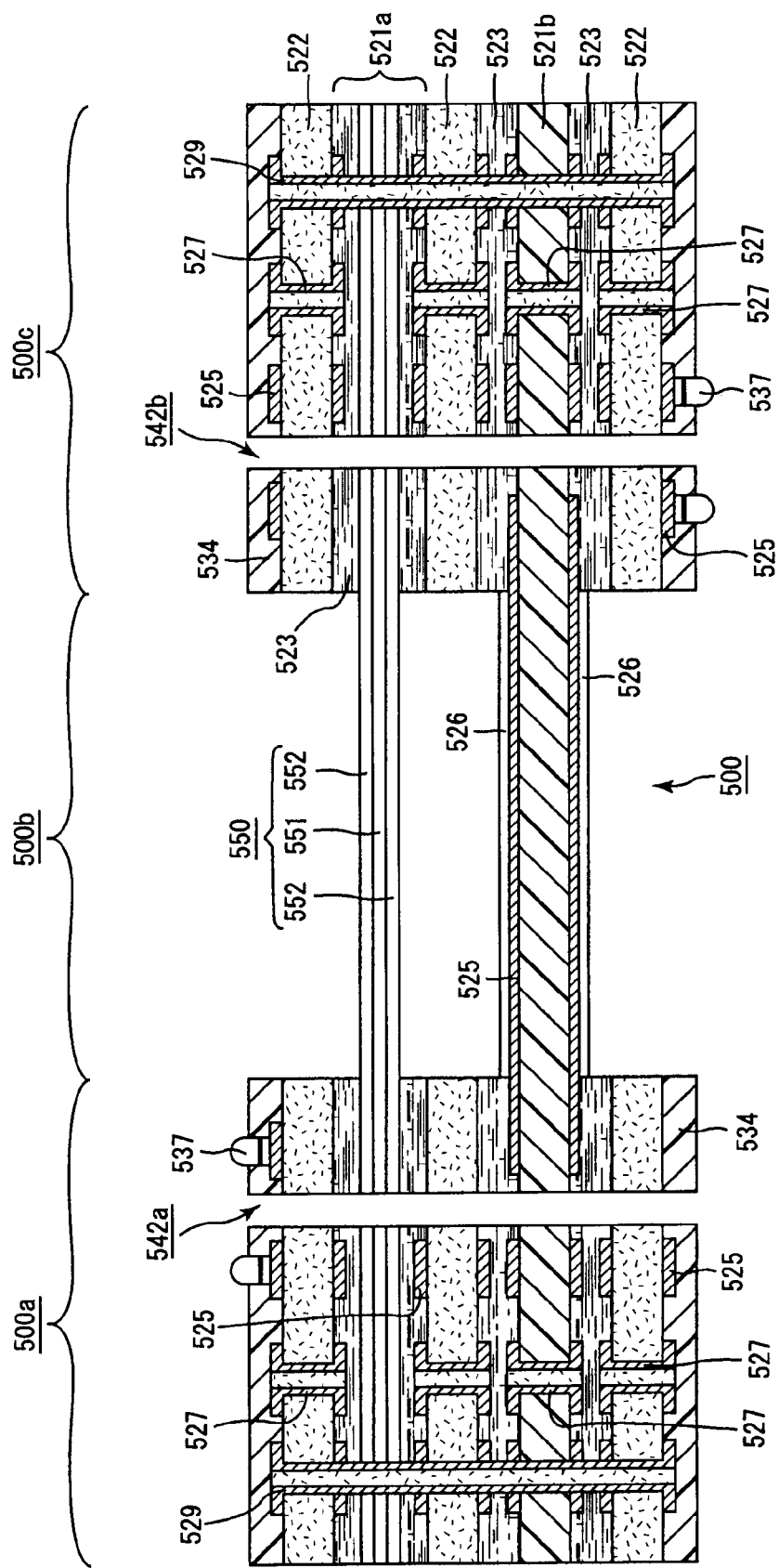
FIG. 6 is a cross-sectional view that schematically shows the photoelectric circuit board according to another embodiment of the present invention.

In addition, the photoelectric circuit board according to the embodiments of the present invention may have embodiments shown in FIGS. 5, 6.

FIGS. 5, 6 are cross-sectional views schematically showing another embodiment of the photoelectric circuit board of the present invention.

A photoelectric circuit board 400 shown in FIG. 5 has approximately the same configuration as in the photoelectric circuit board 200 shown in FIG. 3, but the configurations of a substrate 421 and optical signal transmitting regions 442a and 442b in FIG. 5 slightly differ from those of the corresponding portions in FIG. 3. Therefore, only the differences are herein described in detail.

The substrate 421 configuring the photoelectric circuit board 400 is the same as the photoelectric circuit board shown in FIG. 3 in that insulating layers 423 and conductor circuits 425 are formed and layered on both sides of an optical waveguide 450, but different in that optical path conversion mirrors are not formed in the optical waveguide.

In addition, optical signal transmitting regions 442a, 442b are formed so as to penetrate through the entirety of rigid portions 400a, 400c, and the entirety of the optical signal transmitting regions are formed of an opening.

In addition, a photoelectric circuit board 500 shown in FIG. 6 has approximately the same configuration as in the photoelectric circuit board 300 shown in FIG. 4-1, but the configurations of a substrate 521a and optical signal transmitting regions 542a and 542b in FIG. 6 slightly differ from those of the corresponding portions in FIG. 4-1.

Therefore, only the differences are herein described in detail.

The substrate 521a configuring the photoelectric circuit board 400 in FIG. 6 is the same as the corresponding portions in 4-1 in that insulating layers 523 and conductor circuits 525, which are formed and layered on both sides of an optical waveguide 550, are provided on the periphery of both end portions of the substrate 521a, but different in that optical path conversion mirrors are not formed in an optical waveguide.

In addition, optical signal transmitting regions 542a, 542b are formed so as to penetrate through the entirety of rigid portions 500a, 500c, and the entirety of these optical signal transmitting regions is formed of an opening.

In addition, the photoelectric circuit boards 400, 500 having such a configuration are also one embodiment of the photoelectric circuit boards of the present invention.

Then, in the case where an optical element and the like are mounted on the photoelectric circuit board of this kind, an optical path conversion member will be provided in order to facilitate transmission of an optical signal between the optical element and the like and the optical circuit. This is described in detail later.

In addition, in the photoelectric circuit boards according to the embodiments shown in FIGS. 5, 6, optical signal transmitting regions are formed so as to penetrate through the substrate and all the insulating layers that configure the rigid portion.

In this case, since it may become easier to form an optical signal transmitting region after forming and layering all the insulating layers on both sides of a substrate (furthermore, after forming solder resist layers), formation of the optical signal transmitting region may become easier.

In addition, in the case where the optical path transmitting region of this kind is formed, the optical path conversion member is provided as described above. In this case, since the optical path conversion member is provided by positioning and fixing it with an adhesive, positional accuracy with regard to the formation position itself of the optical signal transmitting region is not necessarily high and processing thereof is easy.

In addition, since insulating layers are not necessarily transparent to a transmission light, the insulating layers can be formed by using commercial products that have been used for conventional printed circuit boards, and it may become easier to manufacture a photoelectric circuit board at lower costs.

In addition, in the embodiments of the photoelectric circuit boards described so far in reference to the drawings, an optical waveguide is formed as an optical circuit, but in the photoelectric circuit board according to the embodiments of the present invention, an optical fiber sheet instead of an optical waveguide may be formed as an optical circuit.

In addition, the embodiments of the photoelectric circuit board of the present invention are not necessarily limited to those illustrated, and the formation position of an optical circuit and a conductor circuit is not particularly limited.

In addition, in the flex portion, the optical circuit may be formed on the both sides thereof, and furthermore, and the conductor circuit and the optical circuit may be layered. In addition, the number of layers in a rigid portion is not limited, and may be further integrated with a flex portion in any of the layers.

The following description will discuss members configuring the photoelectric circuit board according to embodiments of the present invention.

Examples of the optical circuit include an optical waveguide, an optical fiber sheet and the like.

Examples of the optical waveguide include an organic optical waveguide comprising a polymer material and the like. This is because, the optical waveguide of this kind has an excellent adhesion with an insulating layer, and thus processing becomes easy.

The above-described polymer material is not particularly limited, as long as it has little absorption for a wavelength band for communication, and a thermosetting resin, a thermoplastic resin, a photosensitive resin, a resin where a portion of a thermosetting resin is made photosensitive, a resin compound of a thermosetting resin and a thermoplastic resin, a compound of a photosensitive resin and a thermoplastic resin, and the like can be cited.

Specifically, polymers manufactured from an acryl resin such as PMMA (polymethyl methacrylate), deuterated PMMA and deuterated PMMA fluoride, a polyimide resin such as polyimide fluoride, an epoxy resin, a UV (ultraviolet) curing epoxy resin, a polyolefin based resin, a silicone resin such as deuterated silicone resin, a siloxane resin, benzocyclobutene or the like can be cited.

In addition, the thickness of the core portion of the above-described optical waveguide is desirably set to at least about 1 μm and at most about 100 μm, and the width thereof is desirably set to at least about 1 μm and at most about 100 μm. In the case where the thickness and width of the core portion are about 1 μm or more, the formation thereof may become easier, while in the case where the thickness and width of the core portion are about 100 μm or less, the freedom of design of the conductor circuit configuring the photoelectric circuit board is not likely to be deteriorated.

In addition, the ratio of the thickness to the width in the core portion of the optical waveguide is desirably set close to about (1:1). This is because, a planer shape of the light receiving portion of the above-described light receiving element and a planer shape of the light emitting portion of the above-described light emitting element are a circular shape in a plan view.

Here, the ratio of the thickness to the width is not particularly limited, as long as the ratio falls in the range of about (1:2) to about (2:1).

Furthermore, the optical waveguide is desirably a multi-mode optical waveguide, and in the case where the optical waveguide is a multimode optical waveguide with a wavelength for communication of 0.85 μm, the thickness and the width of the core portion are desirably set to at least about 20 μm and at most about 80 μm, and more desirably set to about 50 μm.

The multi-mode optical waveguide is desirable, because positional alignment between the optical waveguide and an optical element is relatively easy, and an allowed band for a positional difference tends to become larger, as compared with a single-mode optical waveguide.

The optical waveguide may include particles. This is because, when particles are mixed in, it becomes difficult for cracks to occur in the optical waveguide. In other words, in the case where no particles are mixed in the optical waveguide, cracks may sometimes occur in the optical waveguide due to the difference in the coefficient of thermal expansion between the optical waveguide and the other layer (for example, an insulating layer or the like); thus, in the case where the difference in the coefficient of thermal expansion between the optical waveguide and the above-described other layer is made small by adjusting the coefficient of thermal expansion by mixing particles into the optical waveguide, it becomes difficult for cracks to occur in the optical waveguide.

Examples of the particles include particles which are the same as the particles contained in the resin composite forming an optical signal transmitting region mentioned below. Those particles may be used alone or in a combination of two kinds or more.

As the above-described particles, inorganic particles are desirable, and particles comprising silica, titania or alumina are desirable. In addition, particles comprising a mixed composition formed by mixing and melting at least two kinds selected from the group consisting of silica, titania and alumina are also desirable.

The form of the particle such as resin particle is not particularly limited, and sphere shape, elliptical sphere shape, crashed shape, polyhedron shape and the like can be cited.

The particle diameter of the above-described particle is desirably shorter than the wavelength for communication. This is because, in the case where the particle diameter is shorter than the wavelength for communication, transmission of an optical signal tends not to be interrupted. More desirably, the lower limit of the particle diameter is about 0.01 μm and the upper limit thereof is about 0.8 μm. This is because, in the case where particles having a particle diameter within this range are included, distribution in the particle size tends not to be too wide, and inconsistency (deviation) of the viscosity of the resin composite tends not to become too great when the particles are mixed into the resin composite, and thus, reproducibility in manufacturing the resin composite tends not to become worse, and thereby, it may tend not to become difficult to manufacture a resin composite having a predetermined viscosity. Moreover, when the upper limit of the particle diameter is about 0.8 μm, the particle diameter is to become 0.85 μm or less of the multimode wavelength.

Still more desirably, the lower limit of the particle diameter is about 0.1 μm and the upper limit thereof is about 0.8 μm. This is because, in the case where the particle diameter is within this range, it is appropriate for the resin composite to be applied using spin coating, roll coating or the like, and it may become easier to manufacture a resin composite having a predetermined viscosity when the resin composite is manufactured by mixing in particles.

It is particularly desirable for the lower limit of the particle diameter to be about 0.2 μm and the upper limit to be about 0.6

μm. This range is particularly appropriate for the application of the resin composite and formation of the core portion of the optical waveguide. Furthermore, inconsistency (deviation) in the formed optical waveguides becomes very small, in particular, inconsistency (deviation) in the core portion, becomes the smallest, and the properties of the photoelectric circuit board become particularly excellent.

In addition, particles with two or more different particle diameters may be included, as long as the particles have a particle diameter within this range.

A desirable lower limit for the amount of particles mixed therein as described above is about 10% by weight, and a more desirable lower limit is about 20% by weight. On the other hand, a desirable upper limit for the above-described particles is about 80% by weight, and a more desirable upper limit is about 70% by weight. This is because, in the case where the amount of particles mixed in is about 10% by weight or more, it may become easier to obtain the effects of mixing particles, and in the case where the amount of particles mixed in is about 80% by weight or less, transmission of an optical signal tends not to be obstructed.

Although the form of the optical waveguide is not particularly limited, sheet form is preferable, because it is easily formed.

In the case where the optical waveguide comprises a core portion and a clad portion, though the particles may be mixed into both the core portion and the clad portion, desirably, the particles are not mixed in the core portion and mixed only in the clad portion that covers the surrounding of this core portion. The reason for this is as follows.

That is to say, in the case where particles are mixed in an optical waveguide, an air layer may be generated in the interface between the particles and the resin component, depending on the adhesiveness between these particles and the resin component of the optical waveguide, and in such a case, the direction of refraction of light is changed by this air layer, and thus the transmission loss of the optical waveguide may be increased; and on the other hand, in the case where particles are mixed only in the clad portion, even when particles are mixed in as described above, problems such as increase in transmission loss of the optical waveguide may be more easily prevented from occurring, and also it may become easier to exert the above-described effects such as less occurrence of cracks in the optical waveguide.

Examples of the optical fiber sheet include a optical fiber sheet in which a plurality of optical fibers placed in parallel are covered with a coating resin layer comprising a resin composite and the like, and formed in a film shape. In this case, the optical fiber may be placed in parallel in one tier, or the optical fiber placed in parallel may be layered in a plurality of tiers.

The optical fiber is not particularly limited, and examples thereof include a silica glass optical fiber (SOF), a polymer clad optical fiber (PCF), a hard polymer clad optical fiber (HPCF), plastic optical fiber (POF), and the like. Among them, the silica glass optical fiber (SOF) is desirable from the viewpoint that the thickness can be reduced. When the bending angle of the flex portion is small, the silica glass optical fiber (SOF) is desirably used, and when the ending angle of the flex portion is large, the plastic optical fiber (POF) is desirably used.

Moreover, an optical fiber sheet which is formed by coating the periphery of only one optical fiber and formed into a film shape, may be used.

In addition, it is desirable for an optical path conversion mirror to be formed on the optical circuit. By forming an optical path conversion mirror, it becomes possible to change the optical path by a desired angle, and it becomes easier to optically connect with an end portion of the optical signal transmitting region. In this case, the optical path conversion mirror may contact air, a resin having a different index of refraction and the like, or a metal vapor deposition layer may be on the optical path conversion mirror. Examples of the metal for the metal vapor deposition layer include gold, silver, platinum, copper, nickel, palladium, aluminum, chrome, an alloy of the metals, and the like. Those metals may be used alone or in a combination thereof.

The optical path conversion mirror can be formed by cutting a optical circuit and further, if necessary, forming a metal vapor deposition thereon as will be described in the following. Alternatively, instead of forming the optical path conversion mirror on the optical circuit, a member having the optical path conversion portion (optical path conversion member) may be provided at a tip of an end portion of the optical circuit by interposing an adhesive agent.

In the case where the optical path conversion mirror is formed, the angle to be formed is not particularly limited, and may be appropriately set depending on the optical path. However, the optical path conversion mirror is usually formed in such a manner that a surface of the optical path conversion mirror makes contact with the insulating layer at an angle of about 45 degrees or about 135 degrees. It is particularly preferable that the optical path conversion mirror be formed so as to set the above angle at about 45 degrees, and in this case, the formation is particularly easy.

It is desirable that an optical signal transmitting region be formed in the photoelectric circuit board according to the embodiments of the present invention. This is because, formation of the optical signal transmitting region should further improve the freedom of design of the optical circuit.

The above-described optical signal transmitting region may be formed only of an opening, or a portion or the entirety of the optical signal transmitting region may be filled in with a resin composite. In the case where the entirety of the optical signal transmitting region is filled in with the resin composite, the optical signal transmitting region is formed of the resin composite.

The resin component of the resin composite is not particularly limited as long as it has little absorption in the wavelength band for communication, and a thermosetting resin, a thermoplastic resin, a photosensitive resin, a resin of which a portion of a thermosetting resin is converted to have photosensitivity, and the like can be cited as examples.

Specifically, an epoxy resin, an UV (ultraviolet) curing epoxy resin, a polyolefin based resin, an acryl resin such as PMMA (polymethyl methacrylate), deuterated PMMA and deuterated PMMA fluoride, a polyimide resin such as polyimide fluoride, a silicone resin such as a deuterated silicone resin, a polymer manufactured from benzocyclobutene and the like can be cited as examples.

In addition, the resin composite may include particles, for example, resin particles, inorganic particles, metal particles or the like, in addition to the resin component. The matching of the coefficient of thermal expansion may be more easily achieved between the optical signal transmitting region and the insulating layer and the like and, in addition, it may become easier to impart incombustibility depending on the kind of particles.

Examples of the particles include inorganic particles, resin particles, metal particles and the like.

As for the inorganic particles, particles comprising aluminum compounds such as alumina and aluminum hydroxide, calcium compounds such as calcium carbonate and calcium hydroxide, potassium compounds such as potassium carbonate, magnesium compounds such as magnesia, dolomite, basic magnesium carbonate and talc, silicon compounds such as silica and zeolite, titanium compounds such as titania and the like can be cited as examples. In addition, particles comprising a mixed component where at least two kinds of inorganic materials are mixed and melted together may be used.

Examples of the resin particles include particles comprising, for example, a thermosetting resin, a thermoplastic resin, and the like, and concrete examples thereof include particles comprising an amino resin (such as a melamine resin, a urea resin and a guanamine resin), an epoxy resin, a phenolic resin, a phenoxy resin, a polyimide resin, a polyphenylene resin, a polyolefin resin, a fluorine resin, a bismaleimide-triazine resin and the like.

Examples of the metal particles include gold, silver, copper, tin, zinc, a stainless steel, aluminum, nickel, iron, lead and the like. It is desirable for the surface layer of the metal particles to be coated with a resin or the like in order to secure insulating properties.

Moreover, these particles may be solely used or two or more kinds may be used together.

Furthermore, it is desirable that the shape, the length of the longest portion, the contents and the like of the above-described particle be the same as those of the particle contained in the optical waveguide.

In the photoelectric circuit board according to the embodiments of the present invention, when the optical signal transmitting region is filled in with the resin composite, it is desirable for the transmittance of a transmission light transmitting through this resin composite to be about 70%/mm or more. This is because in the case where the above-described transmittance is 70%/mm or more, sufficient optical signal transmitting performance can be more easily gained. It is more desirable for the above-described transmittance to be 90%/mm or more.

Here, in the present specification, transmittance of a resin composite refers to the transmittance of a transmission light per length of 1 mm. In addition, the above-described transmittance refers to transmittance measured at 25° C.

The form of the optical signal transmitting region may be a form which can transmit an optical signal through a single-channel optical circuit, or may be a form which can transmit an optical signal via a multi-channel optical circuit.

The optical signal transmitting region which can transmit an optical signal via a multi-channel optical circuit may have a collective through hole structure capable of transmitting optical signals of all channels or an individual through hole structure capable of transmitting an optical signal of each channel. Here, in both cases, there is no limitation on the number of the channels.

Moreover, both an optical signal transmitting region in the collective through hole structure and an optical signal transmitting region in the individual through hole structure may exist in a single photoelectric circuit board.

With regard to the form of the optical signal transmitting region in the collective through hole structure, a round pillar shape, a rectangular pillar shape, a cylindroid shape, a form where a number of round pillars are aligned in parallel and portions of side faces of adjacent round pillars are connected to each other, a pillar form having a bottom face framed by a line and an arc and the like can be cited as examples.

In addition, in the case where the form of the optical signal transmitting region is a form where a number of round pillars are aligned in parallel and portions of side faces of adjacent round pillars are connected to each other, a dummy round pillar, which does not actually function as an optical signal transmitting region, may be formed among some of the round pillars.

A desirable size of the optical signal transmitting region in the collective through hole structure is a size of at least about 100 μm and at most about 5 mm with respect to the length and width thereof.

In the case where the form of the optical signal transmitting region is a round pillar shape, the diameter is desirably set in the above-described range.

When the diameter of the cross section is about 100 μm or more, transmission of the optical signal tends not to be inhibited, and on the other hand, when the diameter exceeds about 5 mm, the transmission loss of an optical signal is not improved and miniaturization of the photoelectric circuit board may become difficult, and therefore, the diameter of about 5 mm or less is desirable.

With regard to the form of the each optical signal transmitting region in the individual through hole structure, a round pillar shape, a rectangular pillar shape, a cylindroid shape, a pillar form having a bottom face framed by a line and an arc and the like can be cited as examples.

In the optical signal transmitting region in the individual through hole structure, with regard to the size of each optical signal transmitting region, the lower limit of the cross-sectional diameter is desirably set to about 100 μm, and the upper limit thereof is desirably set to about 500 μm.

In the case where the diameter is about 100 μm or more, the optical paths may be less likely to be clogged and filling of an uncured resin composite into the optical signal transmitting region may be less likely to be difficult. Meanwhile, in the case of the diameter exceeding about 500 μm, the transmission property for an optical signal is hardly increased, and freedom of design of the conductor circuits and the like that configure the photoelectric circuit board may be hindered, and thus from this point of view, the diameter is desirably about 500 μm or less.

A more desirable lower limit for the diameter is about 250 μm, and a more desirable upper limit for the diameter is about 350 μm.

Here, the cross-sectional diameter of the portion of the optical signal transmitting region of the individual through hole structure which penetrates through the substrate and the insulating layers means the diameter of the cross section in the case where the optical signal transmitting region is in a round pillar shape, the long diameter of the cross section in the case where the optical signal transmitting region is in a cylindroid shape, and the length of the longest portion in the cross section in the case where the optical paths for transmitting an optical signal have a rectangular or a polygonal pillar shape. In addition, in the present invention, cross section of the optical signal transmitting region means the cross section in parallel with the main surface of the rigid portion of the photoelectric circuit board.

Here, it is desirable for the optical signal transmitting region to be formed so as to have a size which prevents transmission light from being reflected from the wall surface upon transmission of the optical signal.

This is because the risk of influence from irregularity of the wall surface of the optical signal transmitting region may be eliminated.

Moreover, it is preferably designed to be such that, by providing the below described microlens, collimated light is allowed to transmit via the optical signal transmitting region.

The wall surfaces of the above-described optical signal transmitting region may be formed of resin or metal.

Here, an insulating layer is usually exposed from the wall surface of the above-described optical signal transmitting region, and therefore, the wall surface is formed of the same material as the insulating layers. Accordingly, in the case where the insulating layer comprises a resin, the wall surface of the above-described optical signal transmitting region is formed of the resin without any particular processing.

Here, a resin layer may be separately formed on the wall surface of the above-described optical signal transmitting region, and in this case, it is desirable that the resin layer to be formed functions as a clad, and the resin composite with which the above-described optical signal transmitting region is filled in functions as a core.

In addition, in the case where the wall surface of the above-described optical signal transmitting region is formed of metal, examples of the material include copper, nickel, chromium, titanium, precious metals, and the like.

In addition, in the case where the wall surface of the above-described optical signal transmitting region is formed of a metal, that is to say, in the case where a metal layer is formed on the wall surface of the optical signal transmitting region, this metal layer may be formed of one layer or two or more layers.

In addition, depending on the case, the above-described metal layer may function as a through hole, that is to say, may more easily electrically connect conductor circuits sandwiching a substrate or conductor circuits sandwiching a substrate and an insulating layer.

In addition, in the case where a resin layer or a metal layer is formed on the wall surface of the above-described optical signal transmitting region, it is desirable for the surface (surface which makes contact with the resin composite with which the inside is filled in) to be made coarse, so that the surface roughness (Ra) becomes at least about 0.1 μm and at most about 5 μm. This is because the adhesiveness with the resin composite increases.

Here, the above-described surface may be made coarse through an etching process and the like.

Here, in the photoelectric circuit board according to the embodiments of the present invention, the form, the location to be formed and the number of the above-described optical signal transmitting region are not particularly limited, and an appropriate form, location and number can be selected taking into consideration the design of the photoelectric circuit board, that is to say, the locations in which external connection portions are mounted and the locations where optical waveguides and conductor circuits are formed.

In the meantime, it is desirable for the optical signal transmitting region to be formed so as to penetrate through one of the outermost insulating layers, and it is desirable that a conductor circuit and/or a pad be formed on an external side of the other outermost insulating layer corresponding to the extension of the side of the optical signal transmitting region which is optically coupled with an optical circuit.

With this structure, it becomes easier to achieve higher density of wiring (circuits) of the optical circuit and the conductor circuit, and further, it becomes possible to achieve higher density of mounting of an optical element and various electronic parts.

Here, the pad is provided for mounting the optical element and the various electronic parts.

In the case where an optical signal transmitting region is formed in the photoelectric circuit board according to the embodiments of the present invention, a microlens may be provided on an end portion and the like on the side opposite to the side of the optical signal transmitting region which is optically coupled with an optical circuit. The above-described microlens may be provided directly, or may be provided via an optical adhesive.

This is because when a microlens is provided, optical signals can be focused through the microlens, making it possible for optical signals to be transmitted more certainly.

The above-described microlens is not particularly limited, and microlenses used as an optical lens can be cited, and as specific examples of the material, optical glass, resins for optical lenses, and the like can be cited. As the above-described resins for optical lenses, the same materials as the above-described polymer materials described as resin composites, such as acrylic resins and epoxy resins, with which the above-described optical signal transmitting region is filled in can be cited as examples.

In addition, as the form of the above-described microlens, a form of a convex lens having a convex surface only on one side can be cited as an example, and in this case, an appropriate radius of curvature for the above-described convex lens surface can be selected taking the design of the optical signal transmitting region into consideration. Specifically, it is desirable to increase the radius of curvature, for example, when it is necessary to increase the focal distance, and it is desirable to decrease the radius of curvature when it is necessary to decrease the focal distance.

Here, the form of the above-described microlens is not limited to a form of a convex lens, and may be any form which allows optical signals to be focused in a desired direction.

It is desirable for the transmittance of the above-described microlens for light having the communication wavelength to be about 70%/mm or more.

This is because in the case where the transmittance of light having the communication wavelength is 70%/mm or more, loss of optical signals tends not to be too great, which may not lead to reduction in the transmission of optical signals. It is more desirable for the above-described transmittance to be about 90%/mm or more.

The microlens is provided by using an inkjet apparatus, a dispenser or the like.

A desirable lower limit for the amount of particles mixed in with and included in the above-described microlens is about 5% by weight, and a more desirable lower limit is about 10% by weight. Meanwhile, a desirable upper limit for the above-described amount of particles mixed in is about 60% by weight, and a more desirable upper limit is about 50% by weight. This is because, in the case where the amount of particles mixed in is about 5% by weight or more, the effects of mixing particles may be more easily gained, while in the case where the amount of particles mixed in is about 60% by weight or less, transmission of optical signals tends not to be hindered.

Here, in the case where the photoelectric circuit board according to the embodiments of the present invention has an optical circuit having multiple channels and this photoelectric circuit board is provided with microlenses, these microlenses may be microlenses that are independent of each other or may form a microlens array where a plurality of lenses are arranged in parallel.

Moreover, in the case where a microlens is provided, the microlens provided on the side facing the light emitting element is preferably designed to set the focus at the core of an optical waveguide which is located on the side opposite to the side facing the light emitting element, and the microlens provided on the side facing the light receiving element is preferably designed to transform a light transmitted from the optical waveguide into a collimated light.

Though the above-described microlenses may be provided directly as described above, or provided by interposing an optical adhesive, it is desirable for them to be provided directly.

The above-described optical adhesive is not particularly limited, and an epoxy resin based, acryl resin based or silicone resin based optical adhesive and the like can be used.

As for the properties of the above-described optical adhesive, the following is desirable: a viscosity of at least about 0.2 Pa·s and at most about 1.0 Pa·s, an index of refraction of at least about 1.4 and at most about 1.6, light transmittance of about 80%/mm or more, a coefficient of thermal expansion (CTE) of at least about $4.0 \times 10^{-5}$ (/° C.) and at most about $9.0 \times 10^{-5}$ /° C.).

Specific examples of the optical adhesive include Optdyne UV-4000 (a registered trade mark) available from Daikin Industries and an adhesive for connecting optical paths (index of refraction: 1.46 to 1.57) available from NTT Advanced Technology Corporation.

In addition, it is desirable for the thickness of the above-described optical adhesive to be about 50 μm or less.

In addition, in the case where the above-described microlens is provided, a surface process may be carried out in the region in which the microlens is provided.

When a resin is applied in order to form a microlens using an inkjet apparatus and the like, there tends to be inconsistency in the form of the microlens, specifically the degree of sagging, due to inconsistency in the conditions for the process up to the formation of the solder resist layer and inconsistency in the wet ability in the portion in which the microlens is provided, caused by the difference in the length of time over which the solder resist layer is left, but inconsistency in the degree of sagging may be more easily reduced by carrying out a surface process with a water repellant coating agent, and the like.

As the above-described surface process, a process using a water repellant coating agent such as a fluorine based polymer coating agent (surface tension: about 10 mN/m to about 12 mN/m), a water repellant process using $CF_4$ plasma, a hydrophilic process using $O_2$ plasma or the like can be cited as examples.

In addition, the above-described microlens may be provided by interposing a lens marker.

As the above-described lens marker, one disclosed in JP-A 2002-331532 can be cited as an example. The contents of JP-A 2002-331532 are incorporated herein by reference in their entirety.

In addition, in the case where a lens marker is formed, it is desirable for the microlens to be provided on a lens marker on which a water repellent process or a hydrophilic process is carried out.

This is because, in the case where the surface of the lens marker is dirty, the resin composite (resin composite for a lens) used for the formation of the microlens does not spread uniformly, leading to a problem that a microlens having a desired form cannot be formed, but the dirt on the surface of the lens marker may be more easily removed by carrying out a water repellent process or a hydrophilic process as described above, and thus, the above-described resin component for a lens may be more easily spread uniformly over the lens marker.

Furthermore, it is desirable for a hydrophilic process to be carried out, rather than a water repellant process, on the lens marker.

This is because in the case where a hydrophilic process is carried out, the resin composite for a lens that has been dropped onto the lens marker becomes more likely to spread over the entirety of the lens marker when the microlens is provided, and in addition, the spread of this resin can be stopped at the outer periphery of the lens marker without fail, which is suitable for the formation of a microlens having a predetermined form, due to the surface tension.

The following description will discuss a method for manufacturing a photoelectric circuit board.

As the method for manufacturing the photoelectric circuit board according to the embodiments of the present invention, a method comprising preparing a substrate on which an optical circuit and/or a conductor circuit is formed, an insulating layer on which a conductor circuit or a solid conductor layer is formed, an optical circuit, an adhesive insulating material such as prepreg and the like, and properly layering them (first manufacturing method), or a method comprising preparing a substrate on which an optical circuit and/or a conductor circuit is formed as a starting material, and layering thereon an insulating layer or a conductor circuit sequentially (second manufacturing method) may be used.

First, an embodiment of the first manufacturing method will be discussed.

(1) Preparation of Substrate on which Optical Circuit and/or Conductor Circuit are/is Formed Specifically, a flexible resin substrate or the like such as an epoxy resin substrate, a bismaleimide triazine (BT) resin or the like is prepared as a starting material, and an optical circuit and/or a conductor circuit are/is formed thereon.

As the substrate, a substrate comprising a liquid crystal polymer can be also used. The liquid crystal polymer, which has a high strength and a low coefficient of thermal expansion, is suitable for high speed electronic transmission.

A conductor circuit can be manufactured by forming a solid conductor layer on the substrate by electroless deposition and the like, and then carrying out an etching treatment. As the substrate on which a solid conductor layer is formed, a copper-clad laminate and an RCC substrate and the like can be also used.

Moreover, the conductor circuit may be also formed by completing up to the formation of a solid conductor layer, not up to the formation of the conductor circuit, at this stage, and later carrying out an etching treatment and the like in a following process.

Here, depending on the design of the photoelectric circuit board, a conductor layer having a solid shape, a mesh shape or a shape including a plurality of patterns connecting to one another is formed into a conductor circuit functioning as a power supply pattern or a ground pattern.

Moreover, if necessary, non-penetrating via holes for connecting conductor circuits which sandwich the above-described substrate may be formed. The non-penetrating via holes can be formed by making holes by drilling or the like in the above-described substrate and carrying out a plating treatment on the wall surface of the holes.

The optical waveguide or the optical circuit such as an optical fiber sheet and the like may be formed by the following method.

Here, the optical circuit may be formed on the above-described substrate directly or by interposing a conductor circuit.

As the method for forming an optical waveguide comprising a polymer material, (1) a method of forming an optical waveguide on a substrate such as a glass substrate and a silicone substrate in advance, peeling the optical waveguide portions, and attaching the optical waveguide film to an insulating layer, or (2) a method of forming the optical waveguide directly on an insulating layer by sequentially forming and laminating a lower clad, a core, and an upper clad on the insulating layer. Here, a higher positional accuracy can be achieved in the latter method.

As the method for forming the optical waveguide, the same method can be used in both cases of forming the optical waveguide on a glass substrate and the like and forming the optical waveguide on an insulating layer and the like.

In the case of forming the optical waveguide film, a template material such as a silicon resin may be preliminary applied on the glass substrate and the like. It is also possible to form the optical waveguide film by preliminary forming the optical waveguide on the glass substrate and the like by a light exposure and developing method, a molding method and the like, and peeling the optical waveguide by immersion in an about 3% hydrofluoric acid and the like.

Moreover, when a polymer material having a curing temperature of less than about 200° C. is used for forming the optical waveguide comprising a polymer material, the method of forming directly on the substrate is more suitable; on the other hand, when a polymer material having a curing temperature of about 200° C. or more is used, a preferable manner includes forming an optical waveguide separately on a substrate, peeling off, and then attaching by an optical adhesive and the like.

Specifically, a method using reactive ion etching, a process including exposure to light and development, a mold forming method, a resist forming method or a method combining these methods is used.

In the method using the reactive ion etching, (i) first, a lower clad is formed on a base material or a substrate (hereinafter, simply referred to as a substrate or the like) and (ii) next, a resin composite for a core is applied to the top of this lower clad, and furthermore, a curing process is carried out, if necessary, to provide a resin layer for forming a core. After that, (iii) a resin layer for forming a mask is formed on the resin layer for forming a core, and then a process including exposure to light and development is carried out on the resin layer for forming a mask, and thereby, a mask (etching resist) is formed on the resin layer for forming a core.

Next, (iv) reactive ion etching is carried out on the resin layer for forming a core to remove the resin layer for forming a core on the mask non-forming portion so that a core is formed on the lower clad. Finally, (v) an upper clad is formed on the lower clad so as to cover the core, and thus, an optical waveguide is provided.

This method using reactive ion etching provides easy forming of an optical waveguide having excellent dimensional reliability. In addition, this method is also excellent in reproducibility.

In addition, in the process including exposure to light and development, (i) first, a lower clad is formed on a substrate or the like, and (ii) next, a resin composite for a core is applied to the top of this lower clad, and furthermore, a semi-curing process is carried out, if necessary, so that a layer of a resin composite for forming a core is formed.

Next, (iii) a mask where a pattern corresponding to the portion for forming the core is drawn is placed on the layer of the resin composite for forming a core, and after that, a process including exposure to light and development is carried out so that a core is formed on the lower clad. Lastly, (iv) an upper clad is formed on the lower clad so as to cover the core, and thus, an optical waveguide is provided.

This method, including exposure to light and development, may be appropriately used when an optical waveguide is mass produced, since its number of processes is small, and in addition, because this method has a small number of heating processes, stress hardly occurs in the optical waveguide.

In the mold forming method, (i) first, a lower clad is formed on a substrate or the like, and (ii) next, a trench for forming a core is formed in the lower clad through mold formation.

Furthermore, (iii) the above-described trench is filled in with a resin composite for a core through printing, and after that, a core is formed by carrying out a curing process. Finally, (iv), an upper clad is formed on the lower clad so as to cover the core, and thus, an optical waveguide is provided.

This mold forming method may be appropriately used when an optical waveguide is mass produced, and forming an optical waveguide having excellent dimensional reliability may be more easily carried out. In addition, this method is excellent in reproducibility.

In the resist forming method, (i) first, a lower clad is formed on a substrate or the like, and then, (ii) a resin composite for a resist is applied to the top of this lower clad, and after that, a process including exposure to light and development is carried out, and thereby, a resist for forming a core is formed in the core non-forming portion on the above-described lower clad.

(iii) Next, a resin composite for a core is applied to the resist non-forming portion on the lower clad, and (iv) furthermore, the resin composite for a core is cured, and after that, the resist for forming a core is peeled off, and thereby, a core is formed on the lower clad. Lastly, (v) an upper clad is formed on the lower clad so as to cover the core, and thus, an optical waveguide is provided.

This resist forming method may be appropriately used when an optical waveguide is mass produced, and allows an easy forming of an optical waveguide having excellent dimensional reliability. In addition, this method is also excellent in reproducibility.

In the case where an optical waveguide comprising a polymer material is formed using these methods, and an optical waveguide where particles are mixed into the core is formed, a mold forming method is desirable in comparison with a process including exposure to light and development. The reason for this is as follows.

That is to say, in the case where a trench for forming a core is formed in the lower clad through mold formation, and then a core is formed within this trench in accordance with a mold forming method for forming a core, it becomes possible for all of the particles mixed into the core to be contained in the core more easily, and as a result, the surface of the core becomes flat, providing excellent transmissivity of an optical signal. On the other hand, when the core is formed in a process including exposure to light and development, in the core after the development process, part of the particles may extrude from the surface of the core, or a recess may be formed in the surface of the core due to coming off of the particles, making the surface of the core uneven, and this unevenness may make it difficult for light to be reflected in a desired direction, and as a result of this, there may be a case where the transmission property of an optical signal is lowered.

Though different resin composites are prepared as the resin composite for a core and the resin composite for a clad for the formation of an optical waveguide in accordance with the methods for forming the optical waveguide described in the above, the optical waveguide may be formed in accordance with, for example, a photo-bleaching method, where only a resin composite for a clad is prepared and a core is formed by changing the index of refraction of the resin composite for a clad by using a single pulse laser, for example, a femtosecond laser, or through exposure to light.

Moreover, in the case where an optical waveguides is formed through a conductor circuit, it is desirable for a lower clad to be formed so as to be thicker than the conductor circuit. This is because undulation and the like may be more easily prevented from being caused in the optical waveguides.

Furthermore, in the case where a resin composite for a clad is applied using a spin coater at the time of formation of the lower clad, a lower clad having a flat surface may be more easily formed by applying a large amount and adjusting the rotational speed so that a sufficient amount of the resin composite can be supplied into the space between the conductor circuits.

In addition, at the time of formation of the lower clad, a flattening process may be carried out, in such a manner that after the application of the resin composite for a clad, a film is mounted, and pressure is applied using a flat plate.

Here, the resin composite for an optical waveguide (resin composite for a clad, resin composite for a core) can be applied using a roll coater, a bar coater, a curtain coater and the like, in addition to a spin coater.

In the case where an optical fiber sheet is formed as optical circuits, an optical fiber sheet that has been manufactured in advance may be attached to a predetermined location by interposing an adhesive material and the like.

Moreover, the optical fiber sheet can be formed by wiring a required number of optical fibers on a base film (cover resin layer) comprising a polyimide resin and the like using an optical fiber wiring apparatus, and after that, coating the surroundings of the optical fibers with a protective film (cover resin layer) comprising a polyimide resin and the like. Here, a commercially available optical fiber sheet can also be used.

In addition, an optical path conversion mirror is formed in the above-described optical circuit.

Though the above-described optical path conversion mirrors may be formed before the attachment of the optical circuits to the substrate, or may be formed after the attachment of the optical circuits to the substrate, it is desirable to form optical path conversion mirrors in advance, except in the case where the optical circuits are formed directly on the substrate. This is because operation may be more easily carried out and there is no risk of scratching or damaging other members that configure the photoelectric circuit board, the substrate, the conductor circuits, the insulating layers and the like at the time of the operation. Here, the precision is improved when the optical path conversion mirrors are formed after attachment of the optical circuits to the substrate.

The method for forming the above-described optical path conversion mirrors is not particularly limited, and conventional known methods for formation can be used. Specifically, a machine process using a diamond saw having an end in V shape with an angle of about 90°, a cutting instrument or a blade, a process using reactive ion etching, laser ablation and the like can be used.

Moreover, in the case where optical path conversion mirrors are formed on both ends of an optical waveguide film and the like, the optical path conversion mirrors may be formed by securing the optical waveguide film and the like to a jig of a polishing machine and then polishing the two ends. Furthermore, a metal vapor deposition layer may be formed on the reflective surface of the optical path conversion mirror. In addition, buried optical path diverting members may be formed instead of optical path conversion mirrors.

In addition, in the case where optical path conversion mirrors are formed in the optical waveguides with an angle of about 90 degrees, the angle formed between the surface on which the lower clad makes contact with the substrate or the insulating layer and the surface for diverting the optical path may be about 45 degrees or about 135 degrees.

The substrate on which an optical circuit and a conductor circuit are formed may be formed, for example, by forming a conductor circuit (including a solid conductor layer) on the surface of a substrate having an optical circuit formed therein.

In this case, for example, a resin-clad, one-sided copper foil is pressed (heat pressed) on both sides of the optical circuit film or the optical fiber sheet, each having an optical path conversion mirror depending on the needs, and further an etching treatment may be carried out thereon, if necessary.

At the stage when pressing of the resin-clad copper foil is completed, the solid conductor layer has been formed on both sides of the substrate, and by an etching treatment carried thereon, a conductor circuit is provided.

On the other hand, in the case of forming the substrate having an optical circuit formed therein, the optical circuit is desirably made to have a size that allows carrying out pin lamination. Specifically, the optical circuit desirably has a size in the length direction that is almost the same size of the substrate and a size in the width direction that is in the range from a slightly larger size of the signal transmitting region of the core to almost the same size of the substrate.

It is also preferable that the optical circuit have a size in the length direction that is smaller than the substrate, and has a substrate in which an optical signal conversion mirror is formed on its both ends.

Moreover, the substrate on which an optical circuit and a conductor circuit are formed may be formed by forming a resin mask on an optical waveguide film by a light exposure and developing treatment, carrying out copper sputtering to form a copper pattern on the clad, and further carrying out a copper plating treatment on the copper pattern to form a conductor circuit.

(2) Preparation of Insulating Layer on which Conductor Circuit or Solid Conductor Layer is Formed A solid conductor layer or a conductor circuit may be formed on the insulating layer (substrate) in the same manner as in the above-described process (1).

Examples of materials for the insulating layer include epoxy resin, BT resin and the like. Here, it is desirable that the same material be used for the substrate and the insulating layer.

An optical signal transmitting region may be formed in the insulating layer, if needed. Specifically, the following processes (a) to (c) can be carried out.

(a) A through hole for an optical path is formed so as to penetrate through the substrate, the insulating layers and the conductor layers.

The above-described through hole for an optical path is formed through, for example, a drilling process, a router process, a laser process and the like.

As the laser used in the above-described laser process, the same lasers as those that can be used for the creation of openings for via holes in the second manufacturing method can be cited.

It is desirable in the above-described drilling process to use an apparatus with a function for recognizing recognition marks (alignment marks) which allows for correction of the location for processing for carrying out a drilling process by reading recognition marks on the multilayer printed circuit board.

Here, a through hole for an optical path corresponding to an optical signal transmitting region having a collective through hole structure or an individual through hole structure is formed in accordance with the design.

Moreover, in the case where a through hole for an optical path having a form where a plurality of round pillars are aligned in parallel and portions on the sides of adjacent round pillars are connected is formed, in this process, it is desirable for the number of formed round pillars to be an odd number, and in addition, it is desirable to first form round pillars which are not adjacent to each other, and later form adjacent round pillars of which portions of the sides are connected to each other between the round pillars which are not adjacent to each other.

This is because in the case where adjacent round pillars of which portions on the sides are connected are attempted to be formed in sequence, the end of the drill tends to escape toward the already formed round pillar, causing deviation of the end of the drill, and thus, the precision of the drilling process may lower.

In addition, after the creation of through hole for an optical path, a desmearing treatment may be carried out on the wall surface of the through hole for an optical path if necessary.

The above-described desmearing treatment can be carried out using, for example, a process using a permanganic acid solution, a plasma process, a corona process and the like. Here, resin residue, burrs and the like may be more easily removed from the inside of the through hole for an optical path by carrying out a desmearing treatment as described above, and thus, transmission loss of optical signals caused by diffuse reflection of light from the wall surface may be more easily prevented from increasing in the completed optical signal transmitting regions.

Moreover, a grinding treatment may be carried out on the wall surface of the through hole for an optical path by using a grinding stone having a round pillar shape and the like.

(b) Next, the through hole for an optical path is filled in with a resin composite.

The through hole for an optical path is filled in with an uncured resin composite, and after that, a curing process is carried out, whereby optical signal transmitting regions of which end portions protrude from the surface of the outermost insulating layers can be formed.

The method for filling in the holes with an uncured resin composite is not particularly limited, and specifically, a method for printing, potting, or the like for example, can be used.

Moreover, after the through hole for an optical path is formed, prior to filling of the resin composite, a metal layer or a resin layer may be formed on the wall surface of the through hole for an optical path.

Further, when a metal layer is formed, it is desirable for the surface to have a rough surface with the surface roughness (Ra) of at least about 0.1 µm and at most about 5 µm.

(3) Preparation of Optical Circuit

An optical circuit may be prepared by manufacturing an optical waveguide film and an optical fiber sheet in the same manner as in the above-described process (1), and an optical path conversion mirror is formed, if necessary.

(4) Preparation of Adhesive Insulating Material

Examples of the adhesive insulating material include a sheet-shaped material such as a prepreg and an adhesive film and a liquid resin composite. For the material of the adhesive insulating material, an epoxy resin, a BT resin and the like may be cited.

The adhesive insulating material such as a prepreg in some cases forms a part of the optical signal transmitting region, and in such cases, it is desirable that the adhesive insulating material have a certain degree of transparency to the transmitting light, that is, transmittance of about 60% or more at a thickness of 30 µm. Here, an allowable optical transmission loss is speculated by using the above-described transmittance.

The calculation results are as follows. In the case where the transmittance is about 60%/30 µm, transmittance per 1 mm is about $4.0 \times 10^{-6}$%, and transmission loss when used in a thickness of 35 µm and 50 µm are 2.5 dB and 3.7 dB, respectively; in the case where the transmittance is about 70%/30 µm, transmittance per 1 mm is about $6.9 \times 10^{-4}$%, and transmission loss when used in a thickness of 35 µm and 50 µm are 1.8 dB and 2.6 dB, respectively; in the case where the transmittance is about 80%/30 µm, transmittance per 1 mm is about $5.9 \times 10^{-2}$%, and transmission loss when used in a thickness of 35 µm and 50 µm can be calculated to be 1.1 dB and 1.6 dB, respectively; in the case where the transmittance is about 90%/30 µm, transmittance per 1 mm is about 3.0%, and transmission loss when used in a thickness of 35 µm and 50 µm are 0.53 dB and 0.76 dB, respectively; in the case where the transmittance is about 97%/37 µm, transmittance per 1 mm is about 36%, and transmission loss when used in a thickness of 35 µm and 50 µm are 0.15 dB and 0.22 dB, respectively, and this level of loss is relatively small as compared to the allowable loss of 18 dB for the 2.5 Gbps optical transmission in a photoelectric circuit, or the commonly known allowable loss of 14 dB for the 10 Gbps optical transmission, and therefore an optical signal presumably tends to be transmitted.

Here, it has been shown that the transmittance may be chosen depending on the transmission distance, specifically, in the case of a long distance optical transmission of at least about 50 cm and at most about 100 cm, it is desirable that a material having a high transparency be used to reduce transmission loss as much as possible, while in the case of a short distance optical transmission of about 30 cm or less, a material having a certain level of transparency may be used.

For the above-described adhesive insulating material, a transparent resin having a high transmittance such as the same resin as that used for a resin for forming an optical waveguide.

When a resin having a high transmittance of this kind is used, the transmission loss can be reduced to a very low level, more specifically, when a resin having a transmittance of about 70%/mm is used with a thickness of 30 µm, the transmission loss becomes about 0.05 dB, and when a resin having a transmittance of about 90%/mm is used with a thickness of 30 µm, the transmission loss becomes around 0.01 dB.

Moreover, when an insulating layer comprising the adhesive insulating material forms a part of the optical signal transmitting region, it is desirable that the resin composite forming the optical signal transmitting region and the adhesive insulating layer have the same index of refraction. This is because reflection and refraction in the interface between them tend not to occur.

(5) A substrate in which an optical circuit and/or a conductor circuit are/is formed, an insulating layer in which a conductor circuit and a solid conductor layer are formed, an optical circuit, and an adhesive insulating material are prepared by carrying out the above processes (1) to (4), and then among those members, necessary members are layered in a predetermined order while carrying out positional alignment to the predetermined positions by a pin lamination method or a mass lamination method, followed by pressing, so that they are integrated.

Here, when the lamination is carried out according to a pin lamination system, a guide hole is preliminary opened in each material.

Moreover, positional alignment may be carried out, for example, by using an alignment mark (recognition mark) formed preliminary in the core as a fiducial.

Furthermore, the adhesive insulating layer may be used in the B-stage state, or may be applied to one side or both sides of other members.

The above-described pressing may be carried out by first carrying out positional alignment by a pin lamination method or a mass lamination method, followed by layering, and after being sandwiched by hot plates (SUS plate and the like), carrying out heating and pressing.

The pressing may be carried out in a vacuum atmosphere. In the case where the pressing is carried out in the above-described manner, it is desirable that an outermost layer (layer to be contacted to a hot plate) comprise a solid conductor layer.

In the case where conductor circuits are formed in an outermost layer, for example, the pressure applied by the hot plates becomes uneven (pressure applied to regions where conductor circuits are formed becomes great in comparison with regions where conductor circuits are not formed), and as a result, undulation may be caused in the conductor circuits, insulating layers and optical circuits which form each layer. In particular, in the case where undulation is caused in optical circuits, this becomes a cause of increase in the transmission loss, and uneven pressure becomes the cause of positional deviation of optical circuits.

In terms of the conditions for the above-described pressing, an example where the pressure is at least about 20 kg/cm$^2$ and at most about 50 kg/cm$^2$, the time for pressing at a temperature of about 180° C. or more is about 40 minutes or more, the total time for pressing is about 150 minutes and the like can be cited.

By carrying out those processes, it is possible to manufacture a circuit board comprising the rigid portion and the flex portion which are integrated.

A cover lay may be formed in the flex portion, if necessary. In the case where a plating treatment and the like are carried out in a later process, in order to protect the flex portion from the plating solution and the like, a dry film or a plating resist may be layered thereon, and then peeled off after completion of the process.

(6) Next, via holes (penetrating via holes) which penetrate through all of the insulating layers of the rigid portion are formed, if necessary.

The above-described penetrating via holes can be formed by forming through holes which penetrate through all of the insulating layers of the rigid portion through a drilling process, and after that, forming a conductor layer on the wall surface of these through holes through plating and the like, for example.

In addition, in this process, through holes for an optical path (optical signal transmitting regions) which penetrate through all of the insulating layers may be formed, and in this case, it is desirable to form optical circuits in the outermost layers. The diameter of the through hole for an optical path is desirably at least about 0.3 mm and at most about 0.5 mm, although not limited thereto.

Here, the through hole for a via hole and the through hole for an optical path may be carried out simultaneously or separately. The method for forming the through hole for an optical path is as described in the above.

Moreover, conductor circuits which sandwich all the insulating layers in the rigid portion may be connected by a plurality of non-penetrating via holes.

Those non-penetrating via holes may be formed, for example, by forming non-penetrating holes from both sides of the laminated insulating layer in the direction of one conductor circuit formed in the inner layers by laser processing (in this case, each of the non-penetrating holes becomes a bottomed hole in which the bottom portion corresponds to one of the both sides of the above-described conductor circuit), and thereafter forming a conductor layer on the wall portion (may be the whole inside portion) of the non-penetrating holes by plating and the like.

Furthermore, in the case where the outermost layer is formed of a solid conductor, it is possible to form the conductor circuit as the outermost layer by an etching treatment and the like.

(7) Next, a solder resist layer is formed as the outermost layer of the rigid portion, if necessary.

The above-described solder resist layer can be formed by carrying out a hardening process after an uncured solder resist composition has been applied to the rigid portion, or by making a film comprising the above-described solder resist composition adhere to the rigid portion through pressure, and if necessary, carrying out a hardening process.

Moreover, in this process, when a solder resist layer having a not high transmittance is formed as the solder resist layer, an opening for optical path capable of functioning as an optical signal transmitting region is formed simultaneously when the solder resist layer is formed.

Here, when a solder resist layer which is transparent to a transmission light is formed, it is not necessary to form the opening for optical path.

The opening for an optical path may be formed, for example, by applying the above-described solder resist composition, and then carrying out a light exposure and developing treatment.

Moreover, an opening for forming a solder bump (opening for mounting an IC chip or an optical element) may be formed simultaneously when the opening for an optical path is formed. Of course, the opening for an optical path and the opening for forming a solder bump may be formed separately.

Furthermore, when a solder resist layer is formed, a resin film having openings at desired position is manufactured in advance, and the solder resist layer having openings for optical paths or openings for forming solder bumps may be formed by pasting this resin film to the rigid portion.

In addition, the opening for an optical path formed in this process may be filled in with the same resin composite as that used for filling in the through hole for an optical path. Here, it is possible to carry out the formation itself of the through hole for an optical path after formation of the solder resist layer.

(8) Next, a microlens is provided at an end portion of the optical signal transmitting region, if necessary. Here, when a transparent solder resist layer is formed as the above-described solder resist layer, the microlens may be provided on the solder resist layer.

In addition, in the case where a microlens is provided, a surface treatment, such as a process using a water repellent coating material, a water repellant process using $CF_4$ plasma, a hydrophilic process using $O_2$ plasma or the like, may be carried out in advance. It is because, the form of the microlens, in particular the degree of sagging, may easily vary, depending on the wettability in the portion where the above-described microlens is provided, but the varying degree of sagging may be more easily reduced by carrying out a surface treatment.

Concrete methods for the surface treatments described above are briefly described.

In the case where a process using a water repellent coating agent as described above is carried out, first, masking is carried out in such a manner that an opening is provided in a portion which corresponds to the portion where the microlens is to be formed, and then a water repellent coating agent is applied through spraying, using a spin coater or the like, and after that, the water repellent coating agent is naturally dried and the mask is peeled off to complete the surface treatment. Desirably, the thickness of the water repellent coating agent layer is usually about 1 μm.

Here, a mesh plate, a mask where a resist is formed or the like may be used.

When a process using a water repellent coating agent is carried out, the process may be carried out on the entire surfaces of the solder resist layer without using a mask.

On the other hand, in the case where a water repellent process using $CF_4$ plasma as described above is carried out, first, masking is carried out in such a manner that an opening is provided in a portion which corresponds to the portion of the solder resist layer where the microlens is to be formed, after which a $CF_4$ plasma process is carried out, and furthermore, the mask is peeled off to complete the surface treatment.

Here, a mask where a resist is formed may be used. In the case where a hydrophilic process using the above-described $O_2$ plasma is carried out, first, masking is carried out in such a manner that an opening is provided in a portion which corresponds to the portion of the solder resist layer where the microlens is to be formed, after which a $O_2$ plasma process is carried out, and furthermore, the mask is peeled off to complete the surface treatment.

Here, a metal plate or a mask where a resist is formed may be used.

Here, it is desirable to carry out the water repellent process (including a process using a water repellent coating agent) and a hydrophilic process in combination.

Moreover, the microlens may be provided directly or by interposing an optical adhesive agent. Furthermore, the microlens may be provided by interposing a lens marker. In the case where the microlens is provided by interposing a lens marker, a surface treatment may be carried out on the site for providing the microlens.

As the method for providing a microlens directly on the solder resist layer, a method for dropping an appropriate amount of uncured resin for an optical lens onto the solder resist layer and carrying out a curing process on this uncured resin for an optical lens that has been dropped can be cited, for example.

In the above-described method, when dropping appropriate amount of uncured resin for an optical lens onto the solder resist layer, an apparatus such as a dispenser, an inkjet, a micro pipette or a micro syringe can be used. In addition, the uncured resin for an optical lens that has been dropped onto the solder resist layer using such an apparatus tends to be spherical, due to its surface tension, and therefore, it becomes of a hemispherical form on the solder resist layer, and after that, a curing process is carried out on the uncured resin for an optical lens in hemispherical form, and thereby, a microlens in hemispherical form can be formed on the solder resist layer.

Here, the form of the microlens that is formed in this manner, including the diameter and the curve, can be controlled by adjusting the viscosity and the like of the uncured resin for an optical lens to an appropriate degree taking into consideration the wettability of the solder resist layer for the uncured resin for an optical lens.

(9) Next, solder pads and solder bumps are formed in accordance with the following method.

That is to say, the portions of the conductor circuit that have been exposed from the openings for forming solder bumps are coated with an anti-corrosive metal, such as nickel, palladium, gold, silver, platinum or the like, if necessary, so that solder pads are formed.

The above-described coating layer may be formed through plating, vapor deposition, electrodeposition, and the like, and among these, formation through plating is desirable from the viewpoint of a high uniformity in the coating layer.

Here, the pads may be formed before the process for providing a microlens.

Furthermore, the space for the solder pads is filled in with a solder paste using a mask where openings are formed in portions corresponding to the solder pads, and after that, the solder bumps are formed by using reflow. Here, gold bumps may be formed instead of solder bumps.

Here, the composition of the solder used here is not particularly limited, and may be any composition such as Sn/Pb, Sn/Pb/Ag, Sn/Ag/Cu and Sn/Cu.

Moreover, through these processes, the photoelectric circuit board according to the embodiments of the present invention can be manufactured.

Here, in the manufacturing method according to the embodiment, the method for forming the insulating layer and the conductor circuit is not particularly limited, and an additive method, a subtractive method, or some other methods may be used.

Next, an embodiment of the second manufacturing method will be discussed.

In the embodiment of the second manufacturing method, a substrate on which an optical circuit and/or a conductor circuit are/is formed is used as a starting material, and an insulating layer or a conductor circuit is sequentially layered thereon.

Also, in the embodiment of the second manufacturing method, the insulating layer or the conductor circuit may be layered simultaneously on both sides of the substrate which serves as a starting material; however, in the case where a process of forming an optical signal transmitting region is necessary, the insulating layer or the conductor circuit is desirably formed and layered on one side and then the other.

(1) In the present method, a substrate on which an optical circuit and/or a conductor circuit are/is formed is used as a starting material.

The above-described substrate may be manufactured by the same manner as the processes in the above-described (1).

(2) Next, an insulating layer having openings for via holes is formed and layered on the substrate in the position for forming a rigid portion.

The insulating layer may be formed of a thermosetting resin, a photosensitive resin, a resin where a photosensitive group is added to a portion of a thermosetting resin, a resin compound including any of these and a thermoplastic resin or the like.

Specifically, for example, first, an uncured resin is applied using a roll coater, a curtain coater and the like, or a resin film is bonded through thermocompression so that a resin layer is formed, and after that a curing process is carried out if necessary, and openings for via holes are formed in accordance with a laser process, an exposure and development process or the like, and accordingly, an insulating layer can be formed.

In addition, it is possible to form a resin layer comprising the above-described thermoplastic resin by, for example, thermocompression bonding a resin mold in film form.

Examples of the thermosetting resin include an epoxy resin, a phenolic resin, a polyimide resin, a polyester resin, a bismaleimide resin, a polyolefin based resin, a polyphenylene ether resin, a polyphenylene resin, a fluorine resin and the like.

An acryl resin and the like can be cited as an example of the above-described photosensitive resin.

In addition, as for the resin where a photosensitive group is added to a portion of the above-described thermosetting resin, a resin gained by making the thermosetting group of any of the above-described thermosetting resins, methacrylic acid or acrylic acid react with each other in order to bring about acrylic conversion and the like can be cited as an example.

As for the above-described thermoplastic resin, a phenoxy resin, polyether sulfone (PES), polysulfone (PSF), polyphenylene sulfone (PPS), polyphenylene sulfide (PPES), polyphenylene ether (PPE) and polyether imide (PI) and the like can be cited as examples.

Moreover, the insulating layer may be formed by using a resin composite for the formation of a coarse surface.

As the resin composite for the formation of a coarse surface, those prepared by dispersing a substance which is soluble in a coarsening liquid comprising at least one member selected from acid, alkali and an oxidant, in an uncured, heat resistant resin matrix which is insoluble in a coarsening liquid comprising at least one member selected from acid, alkali and an oxidant can be cited as an example.

Here, with regard to the words "insoluble" and "soluble," for the sake of convenience, substances having a relatively high dissolution rate is referred to as "soluble," whereas those having a relatively low dissolution rate is referred to a "insoluble" in the case where those substances are immersed in the same coarsening liquid for the same period of time.

As the laser that is used in the laser process, a gas carbonate laser, an ultraviolet ray laser, an excimer laser and the like can be cited as examples. After the formation of openings for via holes, a desmearing treatment may be carried out if necessary.

In addition, in this process, holes for via holes penetrating all the insulating layers may be formed, if necessary.

(3) Next, if necessary, a conductor circuit is formed on the surface of the insulating layer including the inner walls of the openings for via holes.

First, a method of forming a conductor circuit by a semi-additive method will be described.

Specifically, first, a thin film conductor layer is formed on the surface of the insulating layer through electroless plating, sputtering or the like, and then, a plating resist is formed on part of the surface, and after that, an electrolytic plating layer is formed in the portion where the plating resist is not formed. Next, the plating resist and the thin film conductor layer beneath this plating resist are removed, so that a conductor circuit is formed.

As the material for the thin film conductor layer, examples thereof include: copper, nickel, tin, zinc, cobalt, thallium, lead and the like.

The desirable material is copper or those comprised of copper and nickel, in order to obtain excellent electrical properties and from an economical point of view.

The thickness of the thin film conductor layer is desirably at least about 0.1 µm and at most about 2.0 µm. Moreover, a coarse surface may be formed on the surface of the insulating layer before formation of the above-described thin film conductor layer.

The plating resist can be formed through exposure to light and development after a photosensitive dry film is attached, and the like.

Here, the thickness of the electrolytic plating layer is desirably at least about 5 µm and at most about 20 µm. Copper plating is desirable as the electrolytic plating for the formation of the electrolytic plating layer.

The plating resist may be removed by using, for example, an alkaline solution and the like, and the thin film conductor layer may be removed using an etchant, such as a mixed liquid of sulfuric acid and hydrogen peroxide, sodium persulfate, ammonium persulfate, ferric chloride, cupric chloride or the like.

In addition, the catalyst on the insulating layer may be removed using acid or an oxidant if necessary after the formation of the conductor circuit.

With this arrangement, deterioration of electrical characteristics may be more easily prevented.

In addition, the above-described conductor circuits may be formed in accordance with a subtractive method.

In this case, a thin film conductor layer is formed on the surface of the insulating layer through electroless plating or sputtering, and then, a thick-affixing process of the thin film conductor layer is carried out through electrolytic plating if necessary.

After that, an etching resist is formed in portions on the surface of the conductor layer and the conductor layer is removed from portions where the etching resist is not formed, whereby conductor circuits are formed.

Here, electrolytic plating, etching and the like can be carried out using the same methods as those used in the semi-additive method, for example.

By completing those processes, it is possible to form the conductor circuit and the non-penetrating via hole.

(4) Next, in the case where the process of forming conductor circuits of the above-described (3) is carried out, the process of the above-described (2) is carried out repeatedly, so that insulating layers are formed and layered.

After that, the processes of (3) and (2) may be repeated if necessary, so that conductor circuits and insulating layers are formed and layered.

By repeating the processes (1) to (4), it becomes easier to manufacture a multilayer circuit board according to the embodiment, in which a conductor circuit, an optical circuit and an insulating layer are formed on the substrate configuring the rigid portion, and a conductor circuit and/or an optical circuit board can be formed on the substrate configuring the flex portion.

(5) Next, conductor circuits are formed on the outermost insulating layers and optical signal transmitting regions which penetrate through the insulating layers are formed.

Here, the optical signal transmitting regions may be formed so that an end portion thereof protrudes from the surface of an outermost insulating layer.

In addition, when optical signal transmitting regions are formed in this process, a metal layer may be formed on the wall surface of the optical signal transmitting regions. It is because, in the case where a desmearing treatment is carried out as required on the wall surface of through holes for an optical path without forming a metal layer, and after that, the through holes for an optical path are filled in with a resin composite, there is a risk that voids may be created in the resin composite, while the formation of a metal layer as described above reduces the risk of voids being formed.

In addition, in the case where a metal layer is formed as described above, it is desirable to carry out a coarsening process on the surface thereof, and in this case, it is desirable for the surface roughness Ra to be at least about 0.1 µm and at most about 5 µm. This is because the adhesiveness with the resin composite improves as a result of the coarsening process.

In addition, a resin layer may be separately formed on the wall surface of the optical signal transmitting regions.

Specifically, conductor circuits and optical signal transmitting regions can be formed by carrying out, for example, the following processes (a) to (d).

(a) First, a thin film conductor layer is formed on the outermost insulating layers in accordance with the same method as that used in the process of the above-described (3), and then, if necessary, a thick-affixing process of the thin film conductor layer is carried out through electrolytic plating and the like.

(b) Next, through holes for an optical path are formed so as to penetrate through the substrate, the insulating layers and the conductor layers.

The above-described through holes for an optical path are formed through, for example, a drilling process, a router process, a laser process and the like.

As the laser used in the above-described laser process, the same lasers as those that can be used for the creation of openings for the above-described via holes can be cited.

It is desirable in the above-described drilling process to use an apparatus with a function for recognizing recognition marks (alignment marks) which allows for correction of the location for processing for carrying out a drilling process by recognizing recognition marks on the multilayer printed circuit board.

Here, through holes for an optical path corresponding to optical signal transmitting regions having a collective through hole structure or an individual through hole structure are formed in accordance with the design.

In addition, in the case where a through hole for an optical path having a form where a plurality of round pillars are aligned in parallel and portions on the sides of adjacent round pillars are connected are formed, in this process, it is desirable for the number of formed round pillars to be an odd number, and in addition, it is desirable to first form round pillars which are not adjacent to each other and after that form round pillars between the round pillars which are not adjacent to each other so that portions on the sides are connected to adjacent round pillars.

This is because in the case where adjacent round pillars of which portions on the sides are connected are attempted to be formed in sequence, the end of the drill tends to escape toward the already formed round pillar, causing deviation of the end of the drill, and thus, the precision of the drilling process may lower.

In addition, after the creation of through holes for an optical path, a desmearing treatment may be carried out on the wall surface of the through holes for an optical path if necessary.

The above-described desmearing treatment can be carried out using, for example, a process using a permanganic acid solution, a plasma process, a corona process and the like. Here, resin residue, burrs and the like can be removed from the inside of the through holes for an optical path by carrying out a desmearing treatment as described above, and thus, transmission loss of optical signals caused by diffuse reflection of light from the wall surface can be prevented from increasing in the completed optical signal transmitting regions.

Moreover, grinding treatment may be carried out on the wall surface of the through hole for an optical path by using a grinding stone having a round pillar shape and the like.

(c) Next, the through holes for an optical path are filled in with a resin composite.

The through holes for an optical path is filled in with an uncured resin composite, and after that, a curing process is carried out, whereby optical signal transmitting regions of which end portions protrude from the surface of the outermost insulating layers can be formed.

The method for filling in the holes with an uncured resin composite is not particularly limited, and specifically, a method for printing, potting, or the like for example, can be used.

(d) Next, an etching resist is formed on a conductor layer, and after that, the conductor layer on portions where the etching resist is not formed is removed, whereby conductor circuits are formed.

Here, the etching process can be carried out using the same method as that used in the above-described process (3).

In addition, the following method may be used instead of the above-described methods (a) to (d).

That is to say, after the formation of a thin film conductor layer in the above-described process (a), the processes up to the above described process (c) is carried out without a thick-affixing process of the thin film conductor layer, and a plating resist is formed on the thin film conductor layer in the process of the above-described (d), and then, an electrolytic plating layer is formed in portions where the plating resist is not formed, and after that, the electrolytic plating layer and the thin film conductor layer beneath this plating resist are removed, whereby, conductor circuits and optical signal transmitting regions may be formed.

In addition, in accordance with another method, after the formation of conductor circuits in the outermost layers by carrying out the processes of the above-described (a) and (d) in advance, the above-described processes (b) and (c), that is to say, the processes of creating through holes for an optical path and then filling in the holes with a resin composite, may be carried out, for example, whereby the optical signal transmitting regions may be formed.

Here, the optical signal transmitting region may be formed depending on the needs, and in the case where the optical signal transmitting region is not formed, a conductor circuit as the outermost layer may be formed by the same manner as the above-described process (3).

Moreover, in the case where the optical signal transmitting region is formed by carrying out the above-described process (5), desirably, a substrate having only a conductor circuit formed thereon is used as a starting material, the above-described processes (2) and (3) are carried out on only one side of a substrate and a conductor circuit and an insulating layer are further formed and layered on one side of the substrate, an optical circuit is formed thereafter, and the above-described process (5) and formation of a conductor circuit and an insulating layer on the other side of the substrate are conducted.

This is because, in the case where an optical circuit has been formed before forming the optical signal transmitting region, there is a chance of damaging the optical circuit by a drilling operation and the like upon forming the optical signal transmitting region.

Moreover, in the case where the optical circuit is formed after formation of the optical signal transmitting region, an optical path conversion mirror is formed in the optical circuit in such a manner that an alignment mark comprising a transparent resin is formed at an end portion (the end portion used here refers to an end portion of the optical signal transmitting region which has been formed at this stage) of an optical signal transmitting region on the side opposite to the side facing the optical circuit in the optical signal transmitting region by an exposure and development process using the alignment mark in the substrate as a fiducial, and then the optical path conversion mirror is formed in the optical circuit by using the above-described alignment mark comprising a transparent resin as a fiducial, and thereby the positional accuracy of the optical path conversion mirror and a pad on which the optical element is mounted may be more easily improved so that the optical element may be more easily mounted accurately by a passive alignment, and therefore it is possible to manufacture a photoelectric circuit board having an excellent transmittance of an optical signal.

Here, a lens marker may be formed upon forming an alignment mark made of a transparent resin is formed.

(6) Next, by carrying out the same processes as those described in (6) to (9) in the first manufacturing method, it is possible to manufacture a photoelectric circuit board according to the embodiment of the present invention.

A decision on which of the embodiment of the first manufacturing method or the embodiment of the second manufacturing method should be applied may be appropriately made taking the design of the photoelectric circuit board and the like into consideration; however, the embodiment of the first manufacturing method is preferable in terms of the following points.

In other words, when a photoelectric optical circuit board is manufactured according to the embodiment of the second manufacturing method, since it is necessary to carry out hardening in an oven and the like several times, a thermal history (total time for heat application) is prolonged. Also, when the amount of applied heat increases, in some cases the optical circuit has a larger optical transmission loss. Moreover, with a long thermal history, a credibility problem such as generation of cracks tends to occur due to difference in the coefficient of thermal expansion among the substrate, insulating layer and conductor circuit.

On the other hand, in the embodiment of the first manufacturing method, since a photoelectric circuit board can be manufactured by forming each of the parts in advance, collectively layering those parts and pressing them, it may become easier to reduce the thermal history and to reduce the optical transmission loss, and thus a product having an excellent credibility may be more easily obtained.

In addition, the above-described collective layering may be carried out by a pin-lamination method, and in this case, it may become easier to improve the position alignment accuracy between the optical circuit and the conductor circuit.

The following description will discuss a device for optical communication according to embodiments of the present invention.

The device for optical communication according to the embodiment of the present invention is a device for optical communication comprising the above-described photoelectric circuit board according to the embodiments of the present invention, and an optical element and/or a package substrate on which an optical element is mounted are/is connected to an external connection terminal mounted on the rigid portion of the photoelectric circuit board.

In the device for optical communication according to the embodiment of the present invention, an optical circuit is formed in a flex portion and a conductor circuit is formed in a rigid portion.

For this reason, a high speed transmission is not necessarily required, and therefore it may become easier to provide a configuration in which a conductor circuit is formed for the part where an electric circuit is applicable, and an optical circuit is formed only for the part where a high speed transmission is required, and as a result, it may become easier to favorably carry out a large data processing and a high speed data processing without making the size of the circuit board larger.

Specifically, for example, in the case where the device for optical communication according to the above-described embodiments is used in a mobile phone, for transmission of an image, RGB signals, for which high speed processing is desired, are transmitted by optical circuits, while control signals for the contrast, brightness or the like of screen, for which high speed processing is not particularly necessary, transmitted by electric circuits (conductor circuits).

In other words, the device for optical communication according to the embodiments of the present invention makes it possible for a signal requiring high speed processing to be transmitted by high-speed transmission by using optical circuits, and for a signal, a power supply and a ground to be transmitted by low speed transmission by using electric circuits (conductor circuits).

Here, the device for optical communication according to the embodiments of the present invention can be applicable not only to a mobile phone, but to a variety of devices such as personal computers, digital video cameras, digital cameras, CCD modules, liquid crystal panels, and optical conversion modules, and the application is not particularly limited.

The device for optical communication according to the embodiments of the present invention described in the following is an embodiment of the device for optical communication in which the rigid portion configuring an photoelectric circuit board provided in the device for optical communication comprises a substrate, and a conductor circuit and an insulating layer formed and layered on both sides of the substrate; however, the device for optical communication does not necessarily comprise a substrate as long as at least the conductor circuit and the insulating layer are formed and layered.

In the following, a device for optical communication according to the embodiment of the present invention is described in reference to the drawings.

Figure 7:
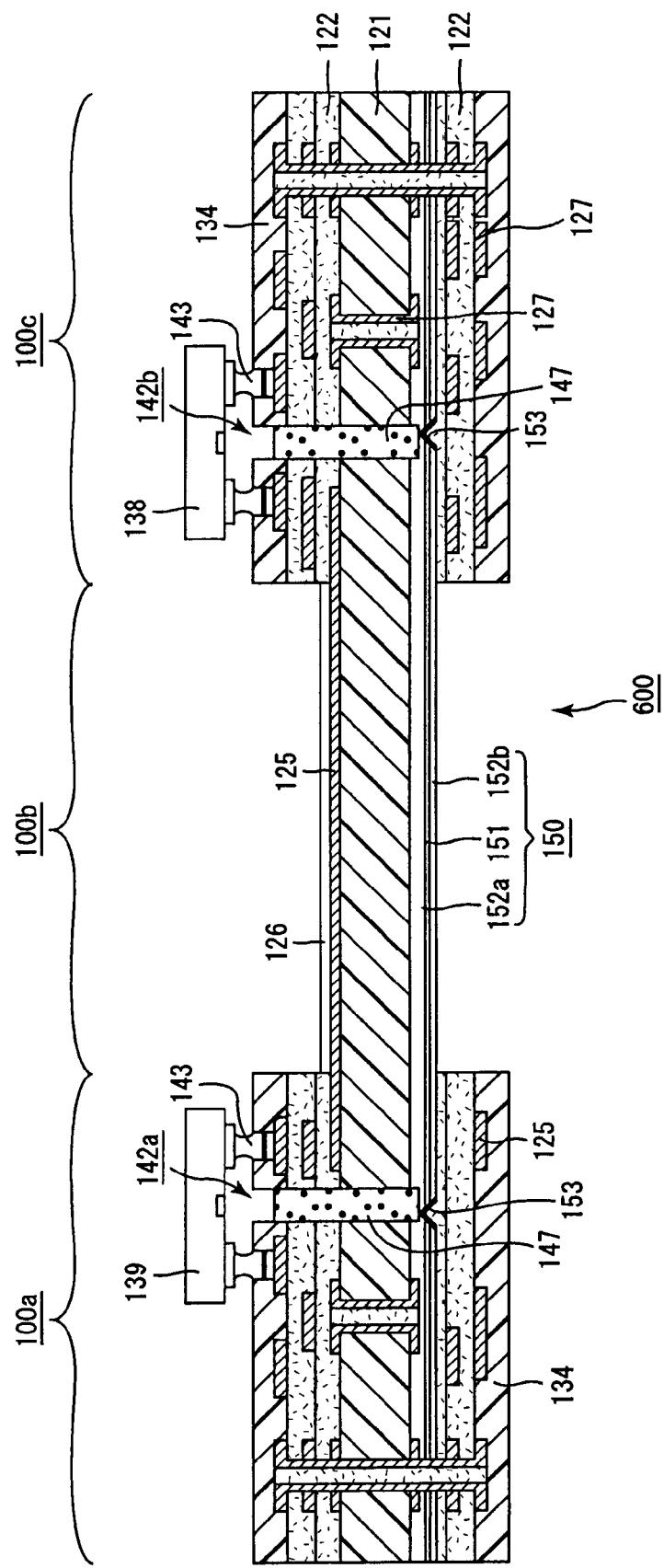
FIG. 7 is a cross-sectional view that schematically shows a device for optical communication according to one embodiment of the present invention.

FIG. 7 is a cross-sectional view that schematically shows a device for optical communication according to one embodiment of the present invention.

In the device for optical communication 600 shown in FIG. 7, a light receiving element 139 and a light emitting element 138 are mounted, by interposing a solder connection portion, in the device for optical communication 100 shown in FIG. 1. In the device for optical communication 600 shown in FIG. 7, a light signal output from the light emitting element 138 is transmitted to the light receiving element 139 through the optical signal passing region 142b, optical waveguide 150 and optical signal transmitting region 142a.

Moreover, when an optical circuit and a conductor circuit are formed on the flex portion in the device for optical communication as shown in FIG. 7, it is possible to drive the entire device for optical communication without connecting the device for optical communication with a substrate for a motherboard.

Optical elements such as a light receiving element and a light emitting element are mounted on the device for optical communication according to the embodiments of the present invention.

They can be properly selected, taking the configuration and required properties of the above-described package substrate into consideration.

For example, PD (photo diode), APD (avalanche photo diode) or the like can be cited as the above-described light receiving element.

Si, Ge, InGaAs or the like can be cited as the material of the above-described light receiving element. From among these, InGaAs is desirable from the viewpoint of having excellent photosensitivity.

An LD (laser diode), a DFB-LD (distributed-feedback laser diode), an LED (light emitting diode), an infrastructure or oxide-confinement VCSEL (vertical cavity surface emitting laser) and the like can be cited as examples of the light emitting element.

Taking the structure of the device for optical communitarian or the demand characteristics into consideration, the light emitting element may be properly used.

As for the material of the above-described light emitting element, a compound of gallium, arsenic and phosphorous (GaAsP), a compound of gallium, aluminum and arsenic (GaAlAs), a compound of gallium and arsenic (GaAs), a compound of indium, gallium and arsenic (InGaAs), a compound of indium, gallium, arsenic and phosphorous (InGaAsP) or the like can be cited.

Moreover, the optical element such as the light receiving element or the light emitting element may be an optical element having multiple channels, and the number of channels is not particularly limited to four, eight, twelve, or the like, and also the pitch is not particularly limited to 125 μm, 250 μm, 500 μm, or the like.

Here, in the case where the optical elements form an array element having multiple channels, the array element may have light receiving portions or light emitting portions arranged linearly or two-dimensionally.

Moreover, the above-described optical elements may be mounted through flip chip bonding or wire bonding.

Furthermore, a microlens may be formed on the light receiving surface of the light receiving element or on the light emitting surface of the light emitting element.

The optical element may be mounted in a state where it is mounted on a package substrate.

Figure 8A:
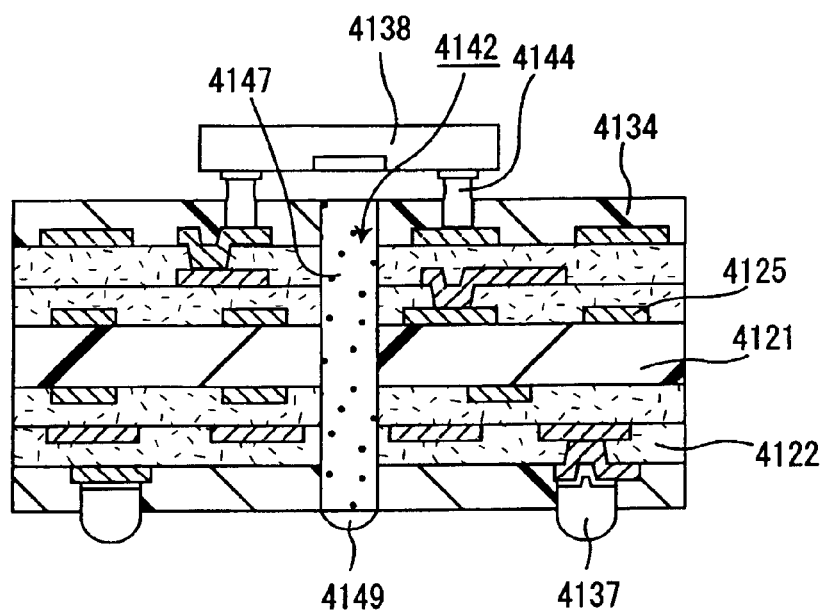
FIGS. 8A and 8B are each a cross-sectional view that schematically shows one example of a package substrate.
Figure 8B:
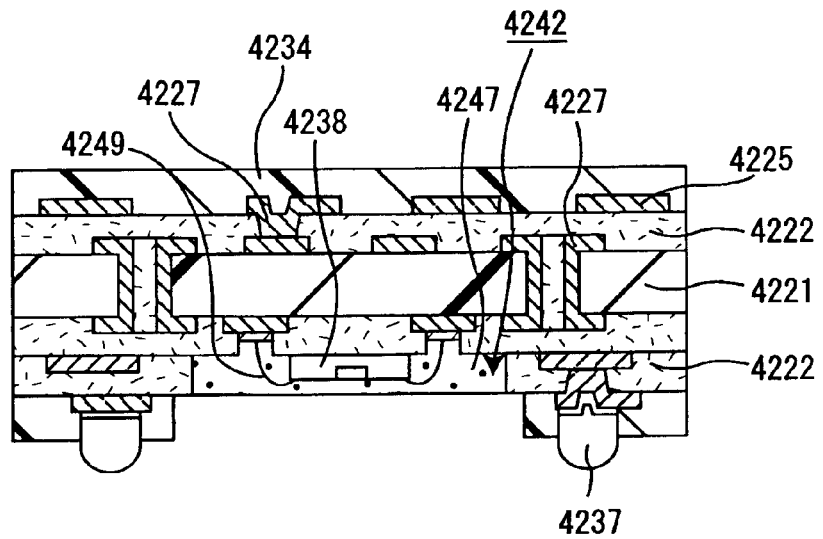

Specifically, for example, a package substrate having a configuration as shown in FIGS. 8A, 8B may be cited.

FIGS. 8A, 8B are each a cross-sectional view that schematically shows one example the embodiment of a package substrate.

In the package substrate shown in FIG. 8A, a conductor circuit 4125 and an insulating layer 4122 are formed and layered on both sides of a substrate 4121, and a solder resist layer 4134 is further formed as an outermost layer.

An optical signal transmitting region 4142, which is filled in with a resin composite 4147, is formed in such a manner as to penetrate through the substrate 4121, the insulating layer 4122 and the solder resist layer 4134, and right above the optical signal transmitting region 4142, an optical element 4138 is mounted by interposing a solder connection portion 4144. Moreover, a microlens 4149 is provided at the optical signal transmitting region 4142 on the side opposite to the side where the optical element 4138 is formed.

Furthermore, a solder bump 4137 to be connected to a photoelectric circuit board is formed on the package substrate on the side opposite to the side where the optical element 4138 is formed.

In the package substrate shown in FIG. 8B, a conductor circuit 4225 and an insulating layer 4222 are formed and layered on both sides of a substrate 4221, and a solder resist layer 4234 is further formed as an outermost layer. A non-penetrating via hole 4227 is also formed.

Moreover, in the insulating layer 4222 on the side of the package substrate where the photoelectric circuit board is formed, an optical signal transmitting region 4242 in a recess form (cavity) having a resin composite 4247 filled therein is formed, and in the optical path transmitting region 4242, the optical element 4238 is mounted by wire bondings 4249.

Furthermore, a solder bump 4237 to be connected to a photoelectric circuit board is formed on the side of the package substrate where the optical signal transmitting region 4242 is formed.

The package substrates having the above-described configurations may be mounted on the device for optical communication according to the embodiment of the present invention, In addition, in the case where an optical element or a package substrate mounted with an optical element is mounted as described above, an underfill may be filled in after mounting.

The material for the above-described underfill is not particularly limited, and thermosetting resins, photosensitive resins, thermosetting resins to which a photosensitive group is partially added, resin compounds including any of these and thermoplastic resins, and the like, for example, can be used. In addition, commercially available resins can be used for the underfill.

In addition, it is desirable for the transmittance of the above-described underfill for light having the communication wavelength to be about 70%/mm or more. This is because, in the case where the transmittance of light having the communication wavelength is 70%/mm or more, loss of optical signals does not become too great, which tends not to lead to reduction in the transmission of optical signals. It is more desirable for the above-described transmittance to be about 90%/mm or more. Here, the underfill may be filled only in the portions other than the portions forming an optical path, and in this case, there is no particular limitation on the transmittance.

As the above-described thermosetting resins, epoxy resins, phenol resins, polyimide resins, polyester resins, bismaleimide resins, polyolefin based resins, polyphenylene ether resins, polyphenylene resins, fluorine resins, and the like can be cited as examples.

As the above-described photosensitive resins, acrylic resins and the like can be cited as examples.

As the above-described thermosetting resins to which a photosensitive group is partially added, thermosetting resins as those described above, of which the thermosetting group is made to react with a methacrylic acid or an acrylic acid so as to be converted to acryl, and the like can be cited as examples.

As the above-described thermoplastic resins, phenoxy resins, polyether sulfone (PES), polysulfone (PSF), polyphenylene sulfone (PPS), polyphenylene sulfide (PPES), polyphenylene ether (PPE), polyether imide (PI), and the like can be cited as examples.

In addition, particles may be included in the above-described underfill. In the case where particles are included, the coefficient of thermal expansion may be more easily adjusted by adjusting the amount mixed in, and therefore, matching of the coefficient of thermal expansion may be more easily achieved between the underfill and the package substrates or the optical elements.

As specific examples of the above-described particles, the same particles as those which can be included in the above-described optical signal transmitting region and the like can be cited.

In addition, in the case where particles as those described above are included in the above-described underfill, it is desirable for the lower limit of the amount of the particles mixed in to be about 20% by weight, and it is desirable for the upper limit to be about 70% by weight. This is because, an amount in this range is usually appropriate for matching the coefficient of thermal expansion with the package substrates or the optical elements, and provides the fluidity required at the time of filling.

A more desirable lower limit is about 30% by weight, and a more desirable upper limit is about 60% by weight.

In a device for optical communication according to the embodiments of the present invention, an optical path conversion member may be provided in a photoelectric circuit board. In this case, the above-described optical path conversion mirror is desirably provided so as to be fixed to the above-described optical element or provided by interposing a submount substrate.

Specific examples of embodiments of the device for optical communication where the above-described optical path conversion member is provided is described in reference to FIGS. 9-1A, 9-2B, 9-2C, and 10.

FIG. 9-1A is a cross-sectional view schematically showing one embodiment of a device for optical communication of the present invention, and FIGS. 9-2B, 9-2C are cross-sectional views schematically showing one embodiment of a device for optical communication of the present invention.

In the device for optical communication shown in FIG. 9-1A, a light receiving element 439 and a light emitting element 438 are mounted by interposing solder connection portions, and an optical path conversion member 462 is provided.

The optical path conversion member 462 is fixed to the optical element (light receiving element 439 and light emitting element 438) by interposing an optical adhesive 461 transparent to a transmission light. Furthermore, an optical path conversion mirror 463 is formed on the side opposite to the side where the optical path conversion member 462 is fixed to the optical element.

In this device for optical communication 700, an optical signal emitted from the light emitting element 438 is transmitted to the light receiving element via an optical signal transmitting region 442b (optical path conversion member 462), an optical waveguide 450, and an optical signal transmitting region 442b (optical path conversion member 462) (see FIG. 9-2B, 9-2C).

Here, the portion where the optical path conversion member 462 is inserted in the photoelectric circuit board may be fixed on the wall surface of the optical signal transmitting region.

As the material of the above-described optical path conversion member, examples thereof include the same material as used in the above-described optical waveguide and the like. In addition, an optical waveguide film on an end portion of which an optical path conversion mirror is formed, as well as an optical fiber sheet, can be used as the optical path conversion member.

In addition, in the case where an optical element mounted thereon is a multi-channel optical element, the above-described optical path conversion member may have a size large enough to convert an all-channel optical path of an optical signal, or an optical path conversion member may be provided on each of the channels.

In addition, as an optical adhesive, the same optical adhesive as used in providing the above-described microlens and the like can be cited.

In addition, in providing an optical path conversion member in the device for optical communication according to the embodiments of the present invention, the optical path conversion member may be provided by interposing a submount substrate, as shown in FIGS. 9-2B, 9-2C.

In an example shown in FIG. 9-2B, a submount substrate 471 is fixed on a solder resist layer 434 by interposing an adhesive 475, and a light receiving element 439 is mounted on a solder 473 by interposing a pad 472 formed on this submount substrate 471. Then, the pad 472 is connected with a conductor circuit 425 in a photoelectric circuit board by a wire bonding 474.

In addition, a through hole for an optical path 471a is formed in the submount substrate 471, and an optical path conversion member 462 in which an optical path conversion mirror 463 is formed is fixed by interposing an optical adhesive 461 on the side opposite to the side where the light receiving element 439 is mounted on the submount substrate 471.

In addition, a portion is sealed with a resin material 478 transparent to a transmission light so as to cover the submount substrate 471, the light receiving element 439, and the wire bonding.

As thus described, in the device for optical communication according to the embodiments of the present invention, the optical path conversion member may be provided by interposing the submount substrate.

Here, a portion where the optical path conversion member is inserted in the photoelectric circuit board may be fixed on the wall surface of an optical path transmitting region by interposing an adhesive.

In addition, in an example shown in FIG. 9-2C, a submount substrate 471 is mounted on a solder resist layer 434, and a light receiving element 439 is mounted on a solder 473 by interposing a pad formed on this submount substrate 471. Then, a pad is extended also on the side face of the submount substrate, and this pad on the side face is connected with a conductor circuit 425 in the photoelectric circuit board by a solder 476. Here, the submount substrate itself is fixed by the solder 476.

In addition, a through hole for an optical path 471a is formed in the submount substrate 471, and an optical path conversion member 462 in which an optical path conversion mirror 463 is formed by interposing an optical adhesive 461 on the side opposite to the side where the light receiving element 439 is mounted on the submount substrate 471 is fixed.

In the device for optical communication of the present invention, the configuration in which the optical path conversion member is provided by interposing the submount substrate may be a configuration shown in FIG. 9-2C.

The above-described submount substrate is not particularly limited, and examples thereof include a glass substrate, a ceramic substrate, a resin substrate, and the like.

In addition, a through hole for an optical path is formed in a submount substrate illustrated, but this through hole for an optical path may not be formed in the case where the submount substrate itself is transparent to a transmission light. In addition, the through hole for an optical path may be filled in with a resin composite.

In addition, in FIGS. 9-2B and 9-2C, conduction between an optical element and a photoelectric circuit board is adjusted by wire bonding, and soldering that has been carried out on the side face of a submount substrate. In the case where the submount substrate is attached to the photoelectric circuit board, a pad for mounting the optical element and a pad connected via a through hole may be formed beforehand on the side opposite to the side where an optical element is mounted in the submount substrate, the photoelectric circuit board may be connected by interposing solder by using this pad using a soldering technique such as BGA and CSP, and the conduction between the optical element and the photoelectric circuit board may be adjusted.

Figure 10:
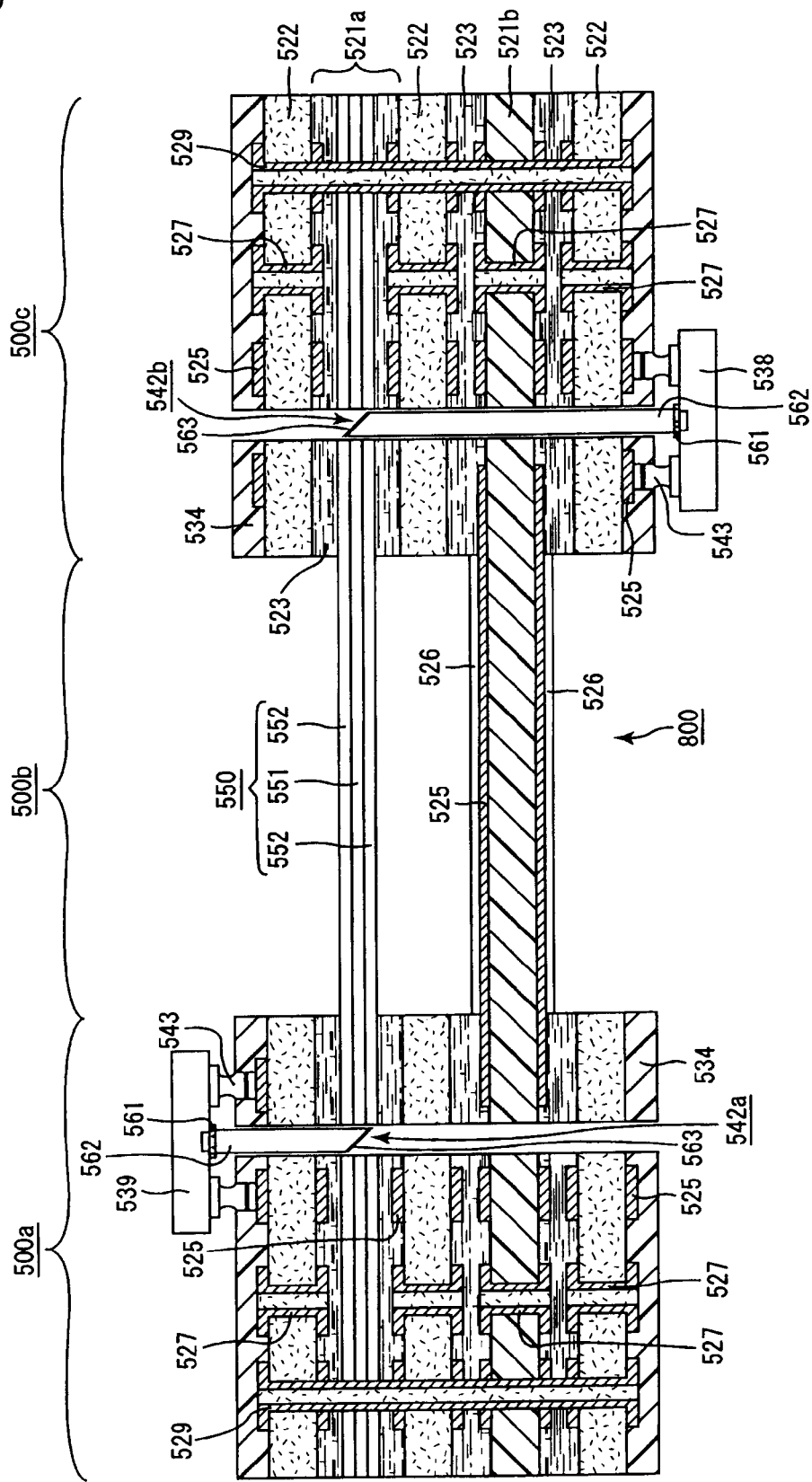
FIG. 10 is a cross-sectional view that schematically shows the device for optical communication according to another embodiment of the present invention.

The device for optical communication according to the embodiments of the present invention may be that according to one embodiment shown in FIG. 10.

FIG. 10 is a cross-sectional view schematically showing a device for optical communication according to one embodiment of the present invention.

In a device for optical communication 800 shown in FIG. 10, a light receiving element 539 and a light emitting element 538 are mounted by interposing solder connection portions and optical path conversion members 562 are provided, in comparison with the device for optical communication shown in FIG. 6.

The optical conversion member 562 is fixed to an optical element (light receiving element 539 and light emitting element 538) by interposing an optical adhesive 561 transparent to a transmission light. Furthermore, an optical path conversion mirror 563 is formed on the side opposite to the side where an optical path conversion member 562 is fixed to the optical element.

In this device for optical communication 800, an optical signal emitted from a light emitting element 538 will be transmitted to a light receiving element 539 via an optical signal transmitting region 542b (optical path conversion member 562), an optical waveguide 550, and an optical signal transmitting region 542a (optical path conversion member 563).

Here, a portion where the optical path conversion member 562 is inserted in a photoelectric circuit board may be fixed by interposing an adhesive also on the wall surface of the optical signal transmitting region, or may be fixed by filling an adhesive into the entirety of the optical path transmitting region where the optical path conversion member 562 is inserted.

The device for optical communication according to the embodiments where an optical conversion member is provided has been described in FIGS. 9-1A, 9-2B, 9-2C, and 10. In the device for optical communication according to the embodiments of the present invention, an optical path conversion member may be provided, for example, in such a manner that the wall surface of the portion where the optical path conversion member is inserted in a photoelectric circuit board is fixed by interposing an adhesive also on the wall surface of an optical signal transmitting region.

However, rather than that, it is more desirable for it, as described above, to be provided by being fixed to the optical element or by interposing a submount substrate.

This is because, in the case where the optical conversion member is inserted in the photoelectric circuit board and provided by fixing the wall surface thereof by an adhesive, the optical path conversion member needs to be fixed by positioning using active alignment; whereas, in the case where the optical path conversion member is provided by being fixed to the optical element or by interposing the submount substrate, the positioning thereof can be carried out by passive alignment and the adjustment of the optical axis thereof is relatively easy.

In addition, in the above-described optical path conversion member, a convex lens or a grating lens may be formed on a reflective side of the optical path conversion member, and furthermore, the convex may be provided on the side face (the face that an optical circuit optically contacts).

In addition, in the case where the optical path conversion member is provided in the device for optical communication according to the embodiments of the present invention, the optical path conversion member may be fixed in an optical signal transmitting region in a package substrate, as shown in FIGS. 8A, 8B.

Next, a method for manufacturing a device for optical communication according to the embodiments of the present invention is briefly described.

The device for optical communication according to the above-described embodiments can be manufactured by manufacturing this photoelectric circuit board, and afterward, providing an optical path conversion member on this photoelectric circuit board if necessary and mounting an optical element.

The above-described optical element can be mounted by using flip chip bonding.

In addition, in providing an optical path conversion member, the optical path conversion member is manufactured by first cutting a glass or a resin film by a dicing process, and then forming an optical path conversion side by a polishing treatment, molding a melted glass material or a resin material or pressing a mold against a heated glass material or a resin material.

Here, a metal vapor deposition layer may be formed on an optical path conversion side of the optical path conversion member.

Next, as shown in FIG. 9-1A, in the case where the optical path conversion member is provided so as to be fixed to an optical element, it is necessary for it to be provided, for example, by fixing the optical path conversion member on light emitting surfaces of an light emitting element and light receiving surfaces of a light receiving element using an optical adhesive by positioning an alignment mark for an optical element and the outer shape of the optical path conversion member, and then mounting the light emitting element and the light receiving element on a photoelectric circuit board by using a high-accuracy electric component mounter (mounting accuracy <1 µm).

In addition, as shown in FIG. 9-2B, in the case where the optical path conversion member is provided by interposing a submount substrate, a photoelectric circuit board is fixed to the submount substrate by interposing an adhesive by fixing the optical path conversion member on the side opposite to the side where an optical element is mounted on the submount substrate using an optical adhesive, mounting the optical element on this submount substrate, and afterward using a high-accuracy electric component mounter.

After that, the optical path conversion member should be provided by connecting a pad formed on a submount substrate with a conductor circuit formed in a photoelectric circuit board via wire bonding, and furthermore sealing with resin so as to cover the entirety of the submount substrate.

In addition, as shown in FIG. 9-2C, in the case where the optical path conversion member is provided by interposing a submount substrate, a photoelectric circuit board may be provided by fixing the optical path conversion member on the side opposite to the side where an optical element is mounted on a submount substrate using an optical adhesive, and furthermore mounting the submount substrate on a solder photoelectric circuit board by interposing solder.

Here, in this case, the submount substrate can be solder connected at a predetermined position by utilizing the self alignment effect at the time of reflow.

In addition, in the case where the optical path conversion member is directly provided, it should be provided, for example, by inserting the optical path conversion member in an optical signal transmitting region and fixing by filling an adhesive into the periphery of the optical path conversion member while positioning by the active alignment.

The device for optical communication according to the embodiments of the present invention can be manufactured through these processes.

Here, with regard to the photoelectric circuit board according to the embodiments of the present invention and the photoelectric circuit board comprising the device for optical communication according to the embodiments of the present invention, description has been given citing as an example a photoelectric circuit board according to the embodiment in which a conductor circuit and an insulating layer are formed and layered on both sides of a substrate in a rigid portion. In the photoelectric circuit board according to the embodiments of the present invention and the device for optical communication according to the embodiments of the present invention, a conductor circuit and an insulating layer do not need to be formed and layered on both sides of a substrate in the above-described rigid portion, and the above-described laminated body may be that where only either a conductor circuit or an insulating layer is formed and layered, or may be that where a conductor circuit and an insulating layer are formed and layered only on one side of a substrate.

That is, the above-described rigid portion may have a structure that comprises a substrate, or a structure without a substrate (coreless structure) may be used.

EXAMPLES

In the following, the present invention is described in further detail.

Example 1

Figure 11A:
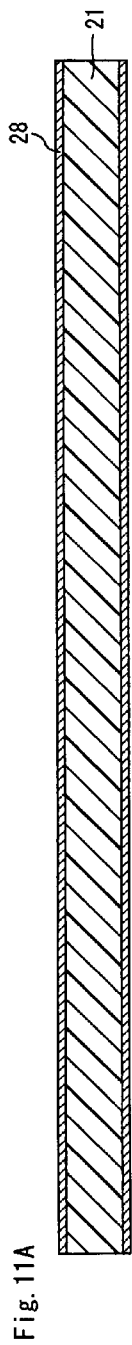
FIGS. 11A to 11E are cross-sectional views that schematically show a part of the method for manufacturing a photoelectric circuit board according to one embodiment of the present invention.

(1) As a starting material, a resin-attached copper foil in which a copper foil 28 having a thickness of 18 was laminated on both sides of the flexible substrate 21 comprising an epoxy resin film having a thickness of 25 μm was used (see FIG. 11A).

Figure 11B:
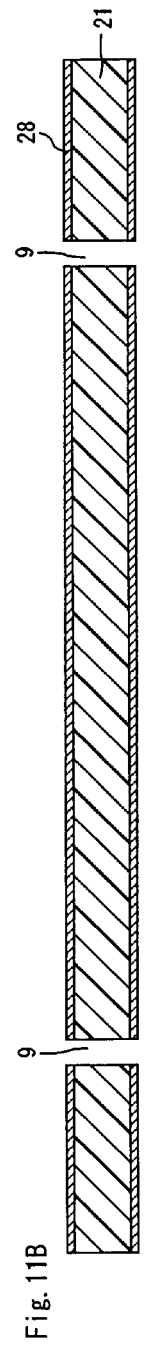

First, a hole 9 was formed by drilling (see FIG. 11B) at a portion configuring a rigid portion of the resin-attached copper foil, and electroless plating treatment was carried out thereon so that a conductor layer 27 was formed on the wall surface of the hole 9.

Figure 11C:
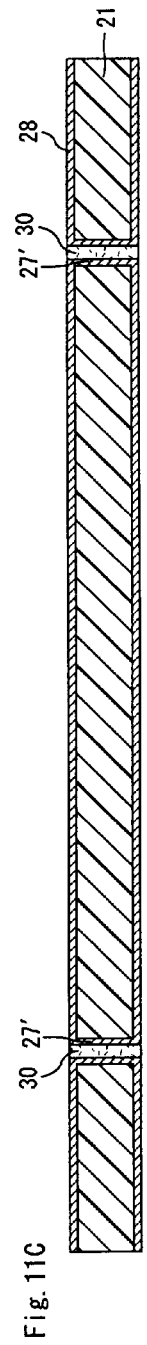

Thereafter, the hole 9 was filled in with a resin composite 30 (see FIG. 11C).

For the resin composite for filling into the holes 9, 100 parts by weight of a bisphenol F type epoxy monomer (molecular weight: 310, YL983U, made by Yuka Shell Epoxy K.K.), 170 parts by weight of $SiO_2$ particles in spherical form (CRS1101-CE, made by ADTEC Corp.) of which the surface is coated with a silane coupling agent and the average diameter of the largest particles is 0.8 μm or less, and a leveling agent (Perenol S4, made by San Nopco Co., Ltd.) (1.5 parts by weight) were put in a container and mixed through stirring, and thereby, a resin filler of which the viscosity is 45 Pa·s to 49 Pa·s at 23±1° C. was prepared. Here, 6.5 parts by weight of an imidazole curing agent (2E4MZ-CN, made by Shikoku Corp.) was used as a curing agent.

Figure 11D:
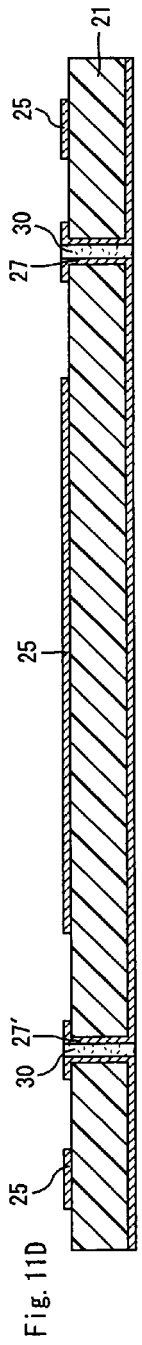

(2) Next, an etching resist (not shown) was formed on the substrate, and by performing etching treatment, a conductor circuit 25 was formed on one side of the substrate 21 (see FIG. 11D).

Figure 11E:
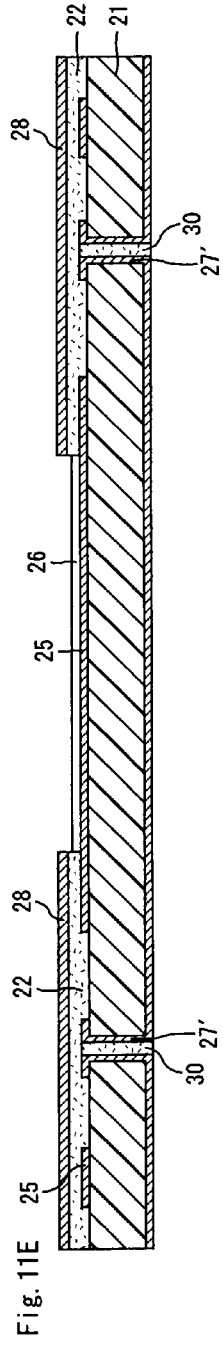

(3) Thereafter, an adhesive film with a copper foil (manufactured by Hitachi Chemical Co., Ltd., MCF-6000E), in which a copper foil 28 having a thickness of 18 μm was laminated on one side of a prepreg comprising a epoxy resin having a thickness of 80 μm, was pasted on one side (the side where the conductor circuit was formed) of the substrate 21 at the position configuring the rigid portion, and by completely hardening the epoxy resin, an insulating layer 22 was formed. On the other hand, at the portion configuring the flex portion on the substrate 21, a cover lay 26 comprising a polyimide having a thickness of 12.5 μm was formed (see FIG. 11E).

Figures 12A, 12B, 12C, 12D:
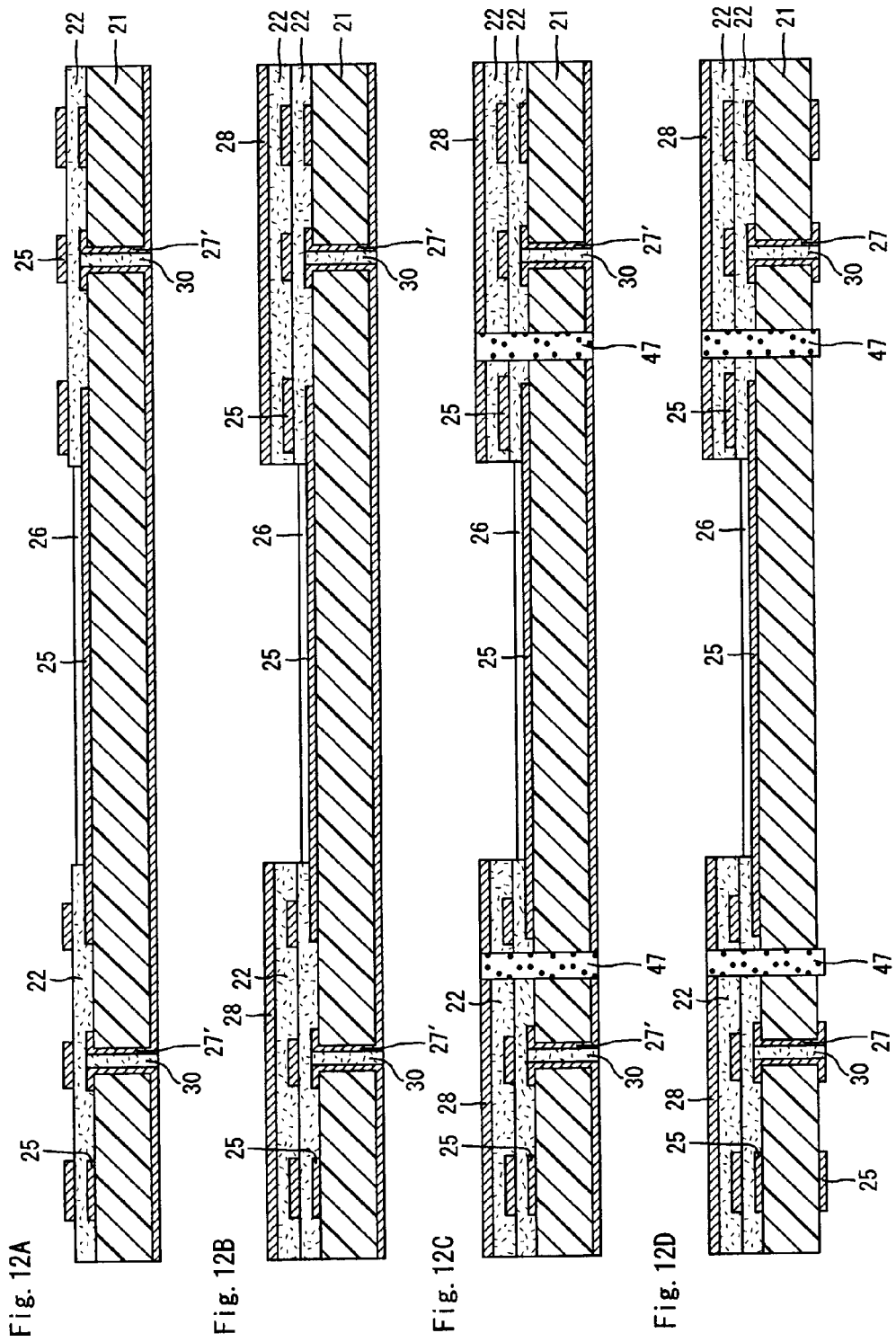
FIGS. 12A to 12D are cross-sectional views that schematically show a part of the method for manufacturing a photoelectric circuit board according to one embodiment of the present invention.

Next, an etching resist (not shown) was formed on the copper foil 28, and by performing etching treatment, the conductor circuit 25 was formed on the insulating layer 22 (see FIG. 12A).

Further, a process of pasting a prepreg with a copper foil was repeated (see FIG. 12B).

(4) Next, by carrying out routering by using a drill, a through hole for an optical path penetrating through the substrate 21, the copper foil 28 and the insulating layer 22 was formed, and further, a desmearing treatment was carried out on the wall faces of the through hole.

Thereafter, an uncured resin composite containing epoxy resin was filled into the through hole for an optical path by using a squeezee, and after drying, buffing polishing was carried out to smooth the surface layer. By further carrying out curing treatment, an optical signal transmitting region that is filled in with a resin composite 47 was formed (see FIG. 12C).

The through hole for an optical path was formed into a shape of a rectangular pillar having a bottom face of 300 μm×700 μm with a semicircular round pillar having a diameter of 150 μm attached thereto.

(5) Next, etching treatment was carried out on the side of the substrate where the conductor circuit 25 was not formed in the above process (2) to form a conductor circuit 25 (see FIG. 12D)

(6) Further, an optical waveguide was formed on the conductor circuit formed in the above process (5) according to the following method. Here, as the optical waveguide, a four-channel optical waveguide 50 in which four cores were provided in parallel.

An acrylic-based resin (index of refraction: 1.52, transmittance: 94%/mm, CTE: 72 ppm) as a resin for forming a core, and a resin for forming a clad made by adding 25% by weight of spherical $SiO_2$ particle (SO-E2, Admatechs Co., Ltd.) having a particle size of 0.4 to 0.6 μm to an acrylic-based resin (index of refraction: 1.51, transmittance: 93%/mm, CTE: 70 ppm) so as to set the transmittance to 81%/mm, the CTE to 53 ppm and the viscosity to 1000 cps, were prepared.

The resin for forming a clad was applied to a predetermined position of the substrate 21, and then pre-baking at 80° C. for 10 minutes, exposure process at 2000 mJ and post-baking at 150° C. for 1 hour were carried out to form a lower clad of 50 μm in thickness. Here, the lower clad was formed to have a thickness larger than that of the conductor circuit 25.

Next, the resin for forming a core was applied on the lower clad 52, and then pre-baking at 80° C. for 10 minutes, mask exposure at 500 mJ, development through a dipping process using 1% TMAH (tetramethylammonium hydroxide) for 2 minutes, solid development at 2000 J and post-baking at 150° C. for 1 hour were carried out to form a core 51 having a size of 50 μm in width×50 μm in thickness.

Next, the resin for forming a clad was applied thereto by using a spin coater (1000 pm/10 sec), and then pre-baking at 80° C. for 10 minutes, exposure process at 2000 mJ, and post-baking at 150° C. for 1 hour were carried out to form an upper clad layer 51 over the outermost layer of the substrate, including on the core 51, so that an optical waveguide 50 was formed (see FIG. 13A).

Thereafter, a dicing process was carried out on the predetermined position (position corresponding to the optical signal transmitting region) of the optical waveguide 50 by using #3000 blade with 90 degrees, and further an Au/Cr vapor deposition film was formed to form an optical path conversion mirror 53 which converts an optical path to 90 degrees (see FIG. 13B).

(7) In the same manner as in the above described process (3), a prepreg with a copper foil was pasted to the optical waveguide 50 at the position configuring the rigid portion (see FIG. 13C), and further a conductor circuit 25 was formed on the insulating layer 22 (see FIG. 14A).

Thereafter, a prepreg with a copper foil was further pasted on the insulating layer 22 where the conductor circuit 25 was formed (See FIG. 14B).

(8) A through hole 19 which penetrates through the entire rigid portion was formed by a drilling process (see FIG. 14C), and then a conductor layer 29' was formed on the wall surface of the through hole 19.

The conductor circuit 29' was formed in such a manner that a palladium catalyst was applied to the wall surface of the through hole 19, a mask was formed on both sides of the substrate, the substrate was immersed in an electroless plating solution having the following composition to form a plating film of electroless plating copper, and then a thick-affixing process of an electrolytic plating film having the following composition was carried out.

[Electroless plating solution]

| | |
|---|---|
| $NiSO_4$ | 0.003 mol/L |
| Tartaric acid | 0.200 mol/L |
| Copper sulfate | 0.030 mol/L |
| HCHO | 0.050 mol/L |
| NaOH | 0.100 mol/L |
| Polyethylene Glycol (PEG) | 0.10 g/L |
| $\alpha,\alpha'$-bipyridyl | 100 mg/L |

[Conditions for Electroless Plating]

Solution temperature of 30° C. for 40 minutes
[Electrolytic Plating Solution]

| | |
|---|---|
| Sulfuric acid | 2.24 mol/L |
| Copper sulfate | 0.26 mol/L |
| Additive | 19.5 ml/L |

(Copper acid HL, made by Atotech Japan K.K.)
[Conditions for electrolytic plating]

| | |
|---|---|
| Current density | 1 $A/dm^2$ |
| Time | 65 minutes |
| Temperature | 22 ± 2° C. |

(9) The through hole 19 having the conductor layer 29' on the wall surface was filled in with the resin composite 30 (see FIG. 15A).

(10) Next, an etching resist (not shown) was formed on the copper foil 28 which is the outermost layer of the rigid portion, and then by carrying out etching thereon, a conductor circuit 25 was formed on the outermost layer (see FIG. 15B).

Moreover, in this process, a through via hole 29 was formed at the same time.

(11) Next, a layer of a solder resist composition was formed as an outer most layer.

The solder resist composition used here was one that prepared was by mixing 46.67 g of a photosensitive oligomer (molecular weight: 4000), where 50% of the epoxy group in 60 wt % of a cresol novolac type epoxy resin (made by Nippon Kayaku Co., Ltd.) dissolved in DMDG was converted to acryl, 15.0 g of 80 wt % of a bisphenol A type epoxy resin (Epikote 1001, made by Yuka Shell Epoxy K.K.) dissolved in methyl ethyl ketone, 1.6 g of an imidazole hardening agent (trade name: 2E4MZ-CN, made by Shikoku Chemicals Corporation), 3.0 g of a multivalent acryl monomer (trade name: R604, made by Nippon Kayaku Co., Ltd.), which is a photosensitive monomer, 1.5 g of multivalent acryl monomer (trade name: DPE6A, made by Kyoeisha Chemical Co., Ltd.), which is also a photosensitive monomer, and 0.71 g of a dispersion antifoam (made by San Nopco. Co, tradename: S-65), and furthermore, adding 2 g of benzophenone (made by Kanto Chemical Co., Inc.) as an optical initiator and 0.2 g of Michler's ketone (made by Kanto Chemical Co., Inc.) as an optical sensitizer to this mixture, and adjusting the viscosity to 2.0 Pa·s at 25° C.

Here, the viscosity was measured using a B type viscometer (type DVL-B, made by Tokyo Keiki Co., Ltd.), with a rotor No. 4 in the case of 60 rpm and a rotor No. 3 in the case of 6 rpm.

(12) Next, a photo mask having a thickness of 5 mm where patterns of openings for forming solder bumps and openings for optical paths were drawn was made to make contact with the layer of a transparent solder resist composition, and then exposed to ultraviolet rays of 1000 $mJ/cm^2$, and a development process was carried out using a DMTG solution so that a solder resist composition layer having the openings for forming solder bumps and openings for an optical path were formed.

Figure 16A:
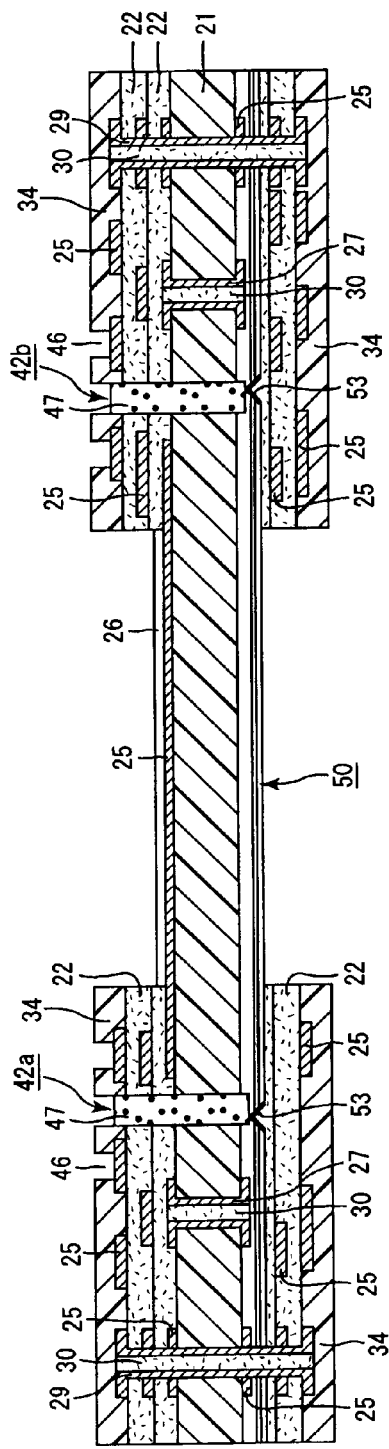
FIGS. 16A and 16B are cross-sectional views that schematically show a part of the method for manufacturing a photoelectric circuit board according to one embodiment of the present invention.

Furthermore, heat treatment was carried out under conditions of 80° C. for one hour, 100° C. for one hour, 120° C. for one hour and 150° C. for three hours, respectively, so that the layers of a solder resist composition cured, and thus, solder resist layers 34 having openings for forming solder bumps and openings for an optical path were formed (see FIG. 16A).

(13) After that, the substrate on which the solder resist layers 34 were formed was immersed in an electroless nickel plating solution having a pH of 4.5 and including nickel chloride ($2.3 \times 10^{-1}$ mol/L), sodium hypophosphite ($2.8 \times 10^{-1}$ mol/L) and sodium citrate ($1.6 \times 10^{-1}$ mol/L) for 20 minutes, and thus, nickel plating layers having a thickness of 5 μm were formed in the openings for forming solder bumps. Furthermore, this substrate was immersed in an electroless gold plating solution including gold potassium cyanide ($7.6 \times 10^{-3}$ mol/L), ammonium chloride ($1.9 \times 10^{-1}$ mol/L), sodium citrate ($1.2 \times 10^{-1}$ mol/L) and sodium hypophosphite ($1.7 \times 10^{-1}$ mol/L) under conditions of 80° C. for 7.5 minutes, and thus, gold plating layers having a thickness of 0.03 μm were formed on the nickel plating layers for the formation of solder pads.

Figure 16B:
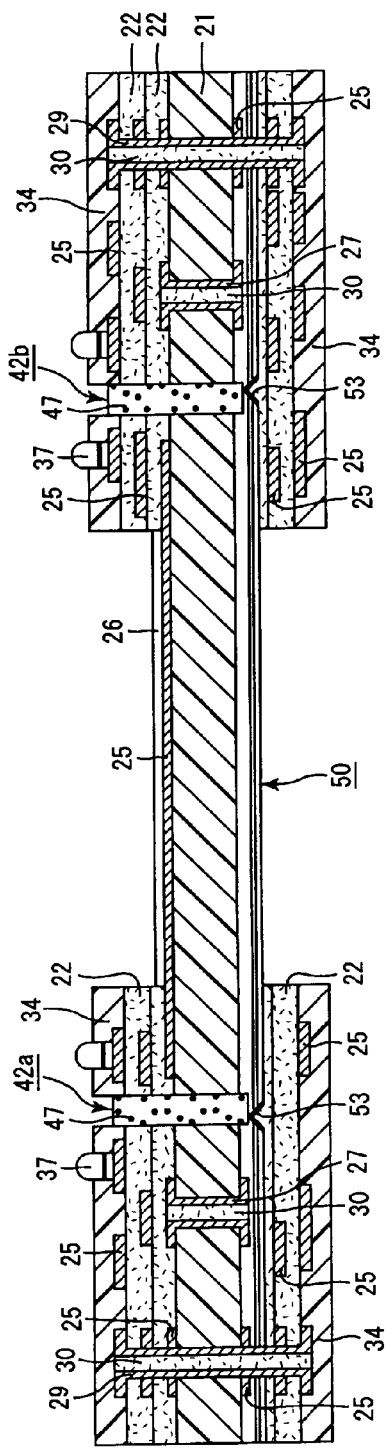

(14) Next, a solder paste (Sn/Ag=96.5/3.5) was printed on the openings for forming solder bumps formed on the solder resist layer 34 to form solder bumps 37, thereby completed a photoelectric circuit board (see FIG. 16B).

Example 2-1

A optical circuit board was manufactured in the same manner as in Example 1, except that the conductor circuit formed on the substrate 21 had a stripline structure as shown in FIG. 2B.

Example 2-2

A optical circuit board was manufactured in the same manner as in Example 1, except that the conductor circuit formed on the substrate 21 had a microstripline structure as shown in FIG. 2C.

Example 2-3

A optical circuit board was manufactured in the same manner as in Example 1, except that the conductor circuit formed on the substrate 21 had a differential line structure as shown in FIG. 2D.

Example 3

A. Manufacture of Optical Waveguide Substrate (1) First, an acrylic-based resin (index of refraction: 1.52, transmittance: 94%/mm, CTE: 72 ppm) as a resin for forming a core, and a resin for forming a clad made by adding 25% by weight of $SiO_2$ spherical particles having a particle diameter of 0.4 to 0.6 μm (SO-E2, manufactured by Admatechs Co., Ltd.) to an acrylic-based resin (index of refraction: 1.51, transmittance: 93%/mm, CTE: 70 ppm) so as to set the transmittance, to 81%/mm the CTE to 53 ppm and the viscosity to 1000 cps, were prepared.

(2) The resin for forming a clad was applied on a silicon plate, and then pre-baking at 80° C. for 10 minutes, exposure process at 2000 mJ and post-baking at 150° C. for 1 hour were carried out to form a lower clad of 50 μm in thickness.

Next, the resin for forming a core was applied on the lower clad, and then pre-baking at 80° C. for 10 minutes, mask exposure at 500 mJ, development through a dipping process using 1% TMAH (tetramethylammonium hydroxide) for 2 minutes, solid development at 2000 J and post-baking at 150° C. for 1 hour were carried out to form a core having a size of 50 μm in width×50 μm in thickness.

Next, the resin for forming a clad was applied by using a spin coater (1000 pm/10 sec), and then pre-baking at 80° C. for 10 minutes, exposure process at 2000 mJ, and post-baking at 150° C. for 1 hour were carried out to form an upper clad over the outermost layer of the substrate, including the core, so that an optical waveguide was formed.

Here, an alignment mark was made simultaneously upon forming the core.

Thereafter, a dicing process was carried out on the predetermined position (position corresponding to the optical signal transmitting region) of the optical waveguide by using #3000 blade with 90 degrees, and further an Au/Cr vapor deposition film was formed to form an optical path conversion mirror which converts an optical path to 90 degrees. The optical path conversion mirror was formed using alignment mark as a fiducial.

Lastly, the optical waveguide was peeled off by immersing in a hydrofluoric acid.

Figure 17A:
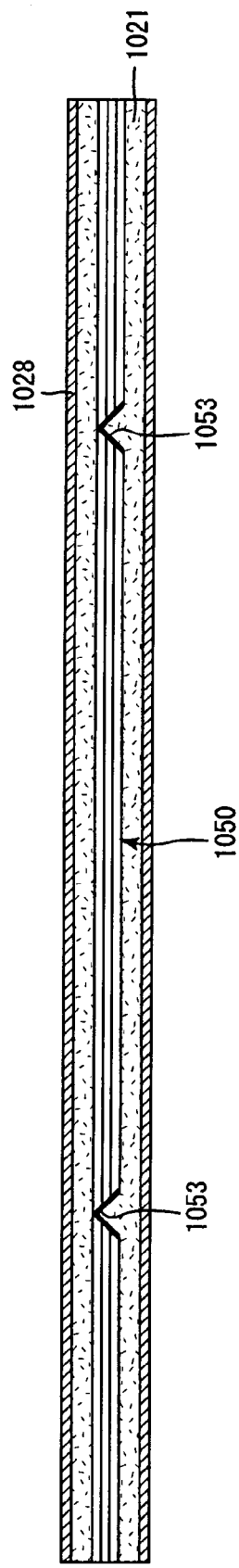
FIGS. 17A and 17B are cross-sectional views that schematically show a part of the method for manufacturing a photoelectric circuit board according to one embodiment of the present invention.

(3) A prepreg with a copper foil was attached to both sides of the optical waveguide 1050 manufactured up to the above-described process (2), and pressed so that a substrate 1021 was manufactured (see FIG. 17A). In the Figure, the part 1053 shows an optical path conversion mirror.

The prepreg with a copper foil used here was manufactured according to the following method.

In other words, 30 parts by weight of spherical $SiO_2$ particles (SO-E2, manufacture by Admatechs Co., Ltd.) having a particle size of 0.4 to 0.6 μm was added to 40 parts by weight of a bisphenol A type epoxy resin (E-1001, made by Yuka Shell Epoxy K.K.), 60 parts by weight of a phenol novolak epoxy resin (E-154, manufactured by Yuka Shell Epoxy, Ltd.), 5.0 parts by weight of an imidazole curing agent (2PHZ, manufactured by Shikoku Corp.) and 75 parts by weight of butyl cellosolve acetate, and then stirred with a three rollers machine.

Next, the resin composite was applied by a roller coater to a copper foil having a thickness of 18 μm which was preliminary attached (fixed by tape) to a supporting substrate, and then cured to the B-stage in an oven under conditions of 80° C./10 min. so that a prepreg with a copper foil in which a thickness of the prepreg portion was 80 μm was manufactured. The prepreg portion has an index of refraction of 1.58 and a transmittance of 97% for light having a wavelength of 850 nm at a thickness of 37 μm.

Figure 17B:
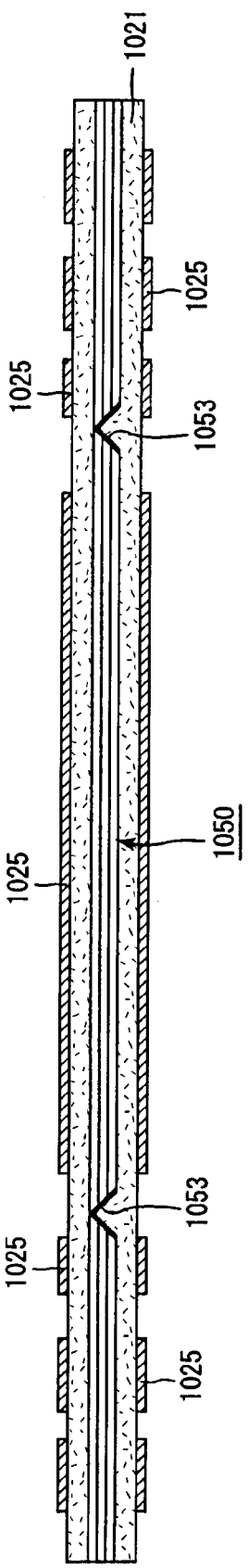

(4) Next, an etching resist (not shown) was formed on the substrate 1021, and by performing etching treatment, conductor circuits 1025 were formed on both sides of the substrate 1021 (see FIG. 17B).

Moreover, although not shown in Figure, a guide hole for pin lamination was formed on the optical waveguide substrate using an alignment mark formed in the core as a fiducial.

Figure 18A:
FIGS. 18A to 18F are cross-sectional views that schematically show a part of the method for manufacturing a photoelectric circuit board according to one embodiment of the present invention.
Figure 18B:
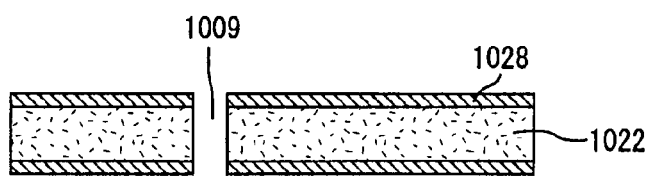

B. Manufacture of Rigid Member (1) As a starting material, a resin-attached copper foil in which a copper foil 1028 was laminated on both sides of the insulating sheet 1022 comprising an epoxy resin film was used (see FIG. 18A). First, a hole 1009 was formed by drilling (see FIG. 18B) in the resin-attached copper foil, and electroless plating treatment was carried out thereon so that a conductor layer 1027' was formed on the wall surface of the hole 1009.

Figure 18C:
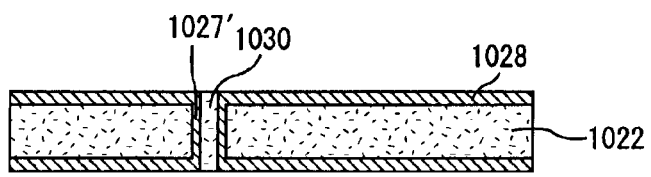

Afterward, the hole 1009 was filed in with a resin composite 1030 (see FIG. 18C). As the resin composite, the same resin as that used in the process (1) of Example 1 was used.

Figure 18D:
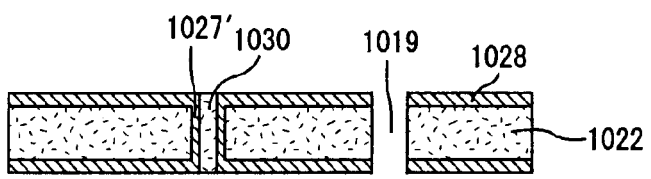

(2) Next, by carrying out routering by using a drill, a through hole for an optical path 1019 penetrating through the insulating sheet 1022 and the copper foil 1028 was formed, and further, desmearing treatment was carried out on the wall faces of the through hole(see FIG. 18D).

Figure 18E:
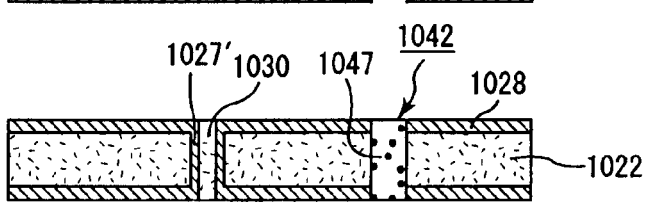

Thereafter, an uncured resin composite containing epoxy resin was filled in the through hole for an optical path by using a squeezee, and after drying, buffing polishing was carried out to smooth the surface layer. By further carrying out curing treatment, an optical signal transmitting region 1042 having a resin composite 1047 filled therein was formed (see FIG. 18E). The through hole for an optical path was formed into a shape of a rectangular pillar having a bottom face of 300 μm×700 μm with a semicircular round pillar having a diameter of 150 μm attached thereto.

Figure 18F:
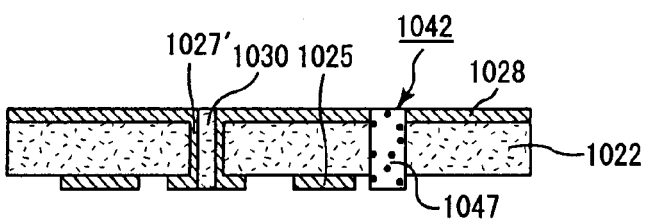
Figure 19A:
FIGS. 19A to 19D are cross-sectional views that schematically show a part of the method for manufacturing a photoelectric circuit board according to one embodiment of the present invention.
Figure 19B:
Figure 19C:
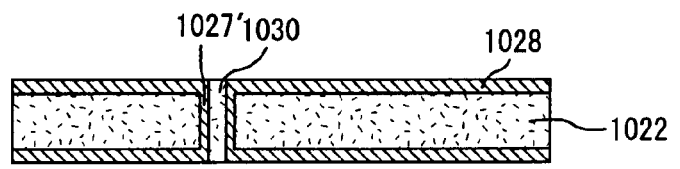
Figure 19D:
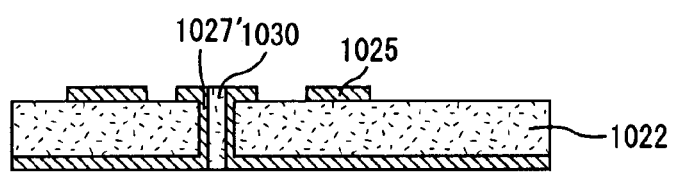

(3) Next, conductor circuits 1025 were formed on one surface of the insulating sheet 1022 by carrying out an etching process (see FIG. 18F). Here, a guide hole for pin lamination was formed in a rigid member a in advance.

Here, two pieces of rigid members a were manufactured.

C. Manufacture of Rigid Member b

A rigid member b was manufactured in the same manner as in the above-described process B, (see FIGS. 19(a) to 19(d) except that the process (2) was not carried out in the above-described process B for manufacturing a rigid member b. Here, a guide hole for pin lamination was formed in a rigid member a in advance.

Here, two pieces of rigid members b were manufactured.

Figures 20A, 20B:
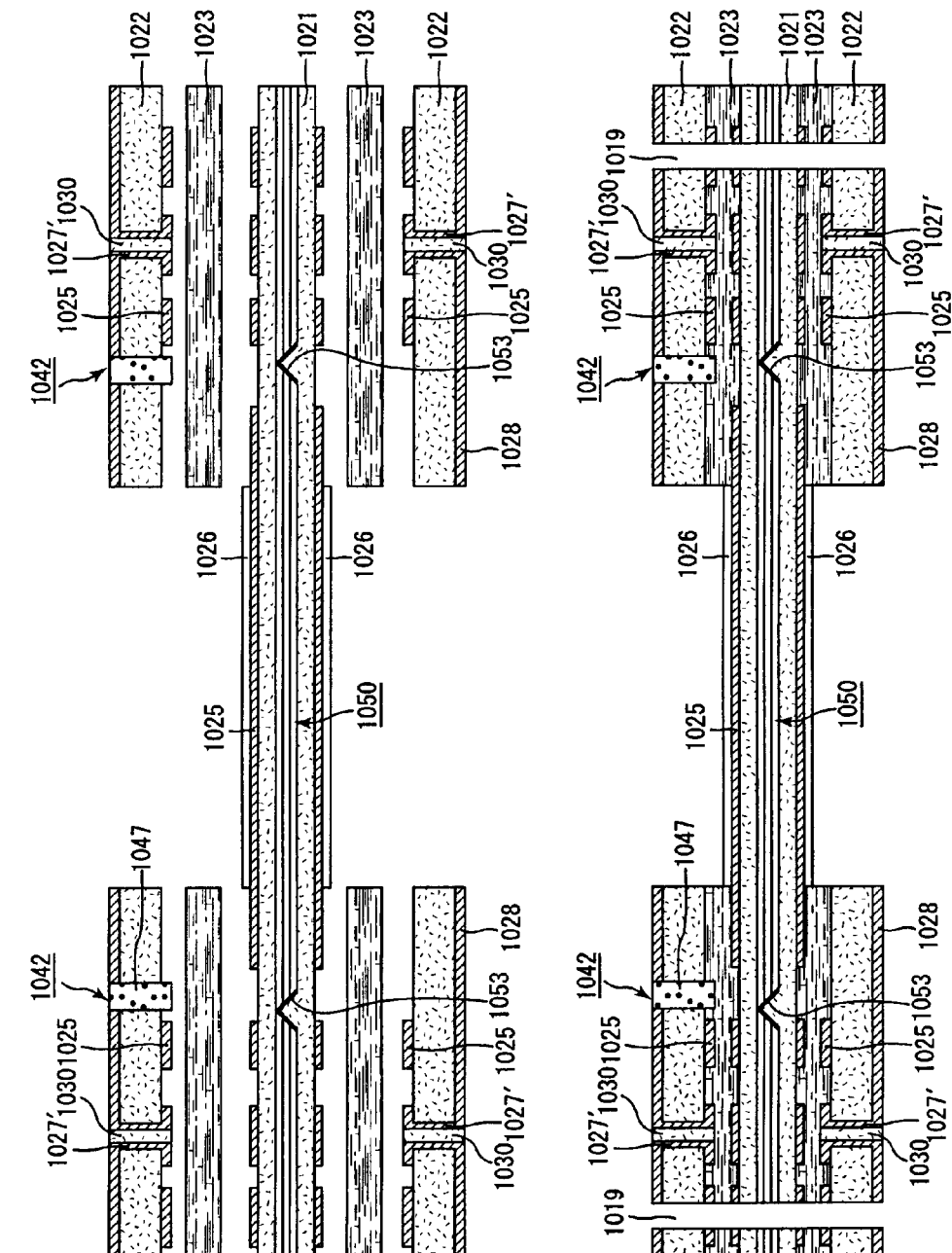
FIGS. 20A and 20B are cross-sectional views that schematically show a part of the method for manufacturing a photoelectric circuit board according to one embodiment of the present invention.

D. Manufacture of Photoelectric Circuit Board (1) The rigid members a and b were layered by interposing prepregs 1023 in accordance with a pin lamination method on a portion configuring a rigid portion on both surfaces of the optical waveguide substrate 1021 manufactured in the above-described process A (see FIG. 20A), and furthermore, a cover lay 1026 was formed on a portion configuring a flex portion of the optical waveguide substrate 1021, and pressed.

Here, pressing was carried out under conditions of a pressure of 30 kg/cm², a temperature of 180° C. for 45 minutes, and the total pressing period of time of 45 minutes.

Here, prepregs used herein were manufactured by the following method.

Here, 30 parts by weight of spherical $SiO_2$ particles having a particle diameter of 0.4 to 0.6 μm (SO-E2, made by Admatec GmbH) was added to 40 parts by weight of a bisphenol A type epoxy resin (E-1001, made by Yuka Shell K.K.), 60 parts by weight of a phenol novolac type epoxy resin (E-154, made by Yuka Shell Epoxy K.K.), 5 parts by weight of an imidazole type curing agent (2PHZ, made by Shikoku Corp.) and 75 parts by weight of butyl cellosolve acetate, and then stirred with a three rollers machine.

Next, this resin composite was interposed between PET films and then passed through rollers, and was cured to the B-stage, whereby prepregs with a thickness of 80 µm was manufactured.

Here, in the prepreg portion, an index of refraction is 1.58, and a transmittance of light of 850 nm is 97%/37 µm.

(2) In the same manner as in the process (8) of Example 1, a through hole 1019 that penetrates through the entirety of the rigid portion was formed (see FIG. 20B), and conductor layers were formed on the wall surface of this through hole 1019.

(3) In the same manner as in the processes (9), (10) of Example 1, a through hole 1019 was filled in with a resin composite 1030, and conductor circuits 1025 were further formed in outermost layers of the rigid portion (see FIG. 21A). In this process, penetrating via holes 1029 are formed.

Figure 22:
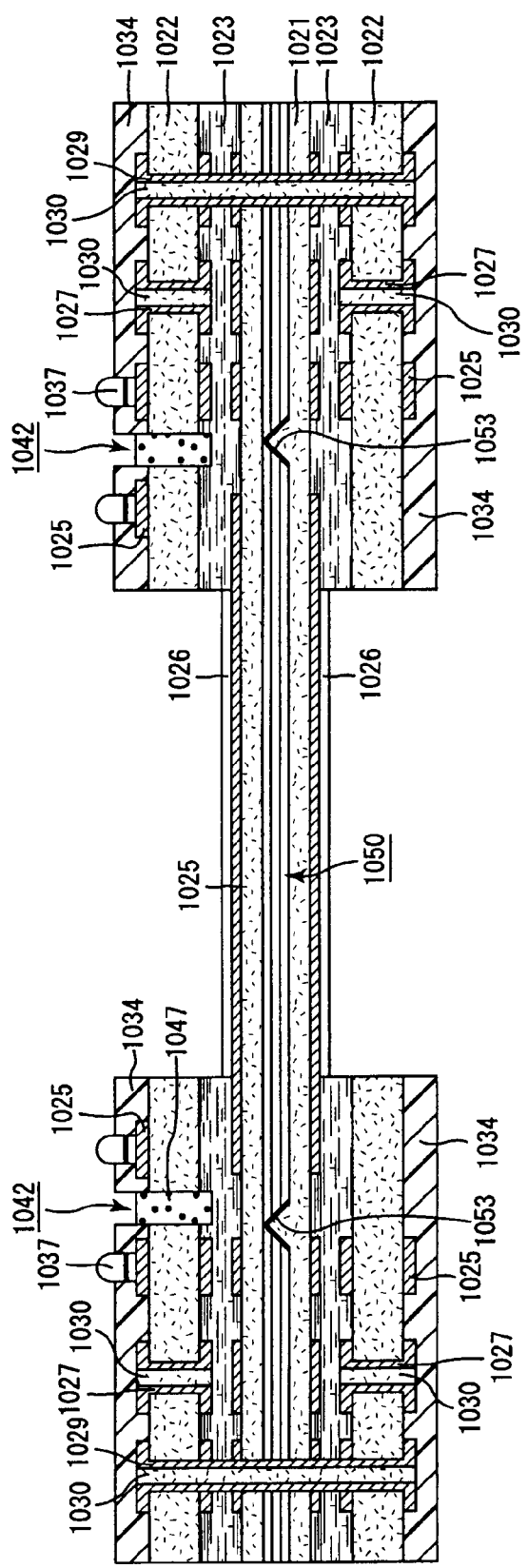
FIG. 22 is a cross-sectional view that schematically shows a part of the method for manufacturing a photoelectric circuit board according to one embodiment of the present invention.

(4) In the same manner as in the processes (11) to (14) of Example 1, solder resist layers 1034, solder bumps 1037 and the like were formed, and the photoelectric circuit board was completed (see FIGS. 21B and 22).

Example 4

A. Manufacture of Optical Waveguide Film

An optical waveguide film was manufactured in the same manner as in the processes (1), (2) of Example 3.

B. Manufacture of Flex Substrate

A flex substrate was manufactured in the same manner as in the processes (1), (2) of Example 1. Here, in carrying out the process (2) of Example 1, conductor circuits 2025 were formed on both surfaces of a substrate. Here, a guide hole for pin lamination was formed in the flex substrate in advance.

C. Manufacture of Rigid Members a, b

Rigid members a, b were manufactured in the same manner as in the processes B, C of Example 3.

D. Manufacture of Rigid Member c

A rigid member c was manufactured in the same manner as in the process C of Example 3. Here, conductor circuits were formed herein on both surfaces of an insulating sheet.

Figure 23:
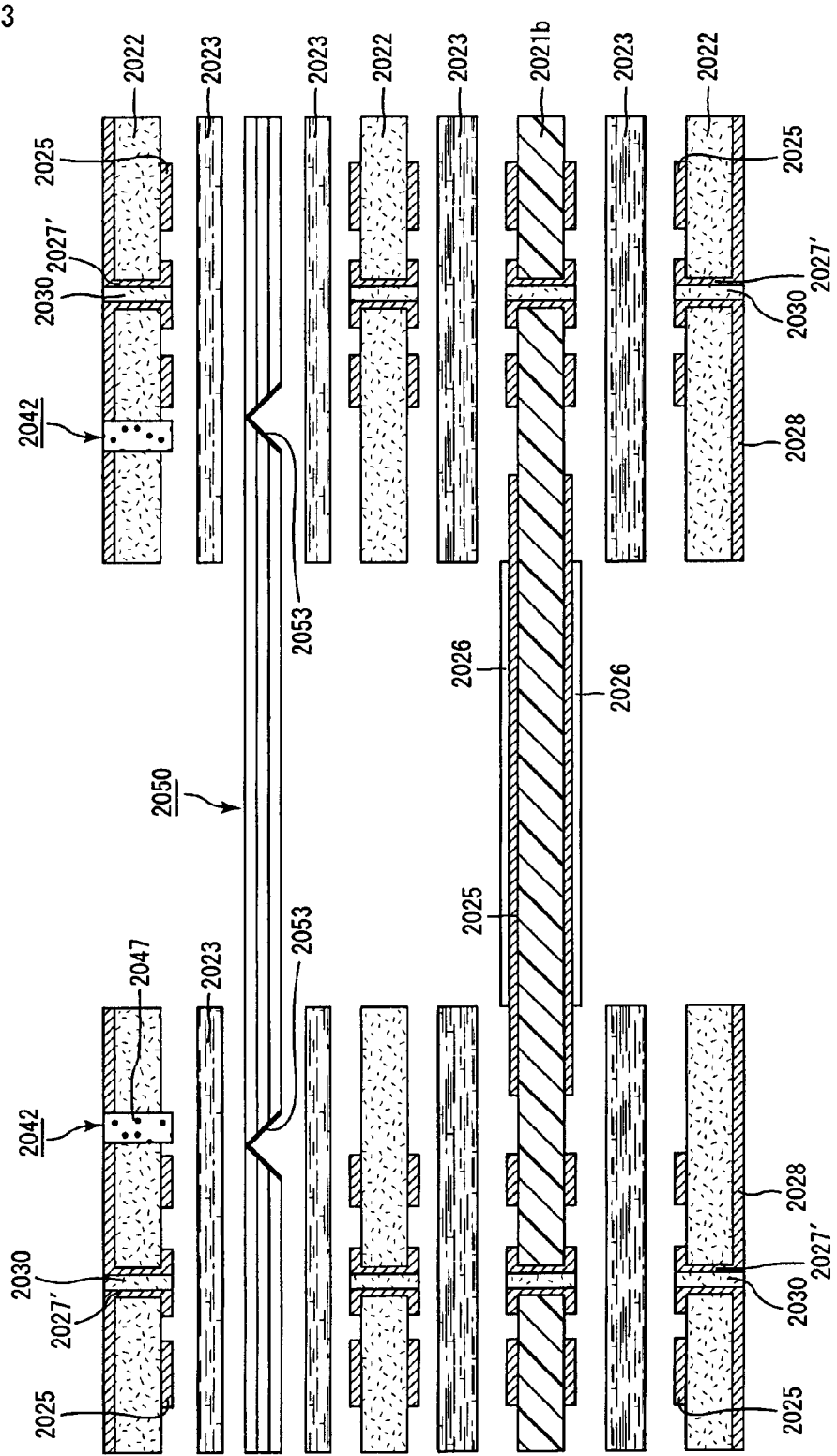
FIG. 23 is a cross-sectional view that schematically shows a part of the method for manufacturing a photoelectric circuit board according to one embodiment of the present invention.
Figure 24A:
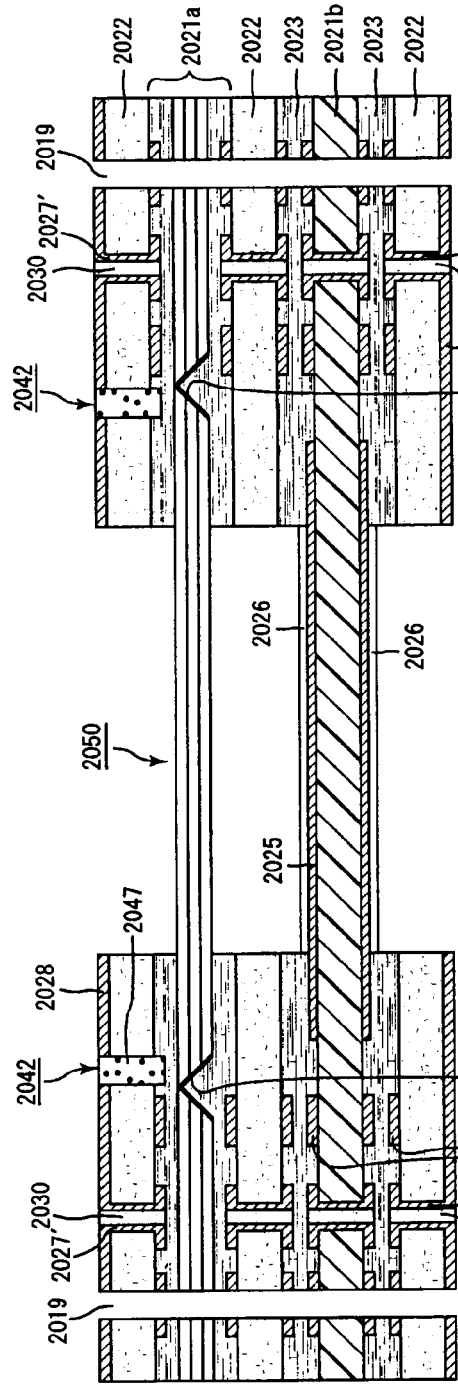
FIGS. 24A and 24B are cross-sectional views that schematically show a part of the method for manufacturing a photoelectric circuit board according to one embodiment of the present invention.
Figure 24B:
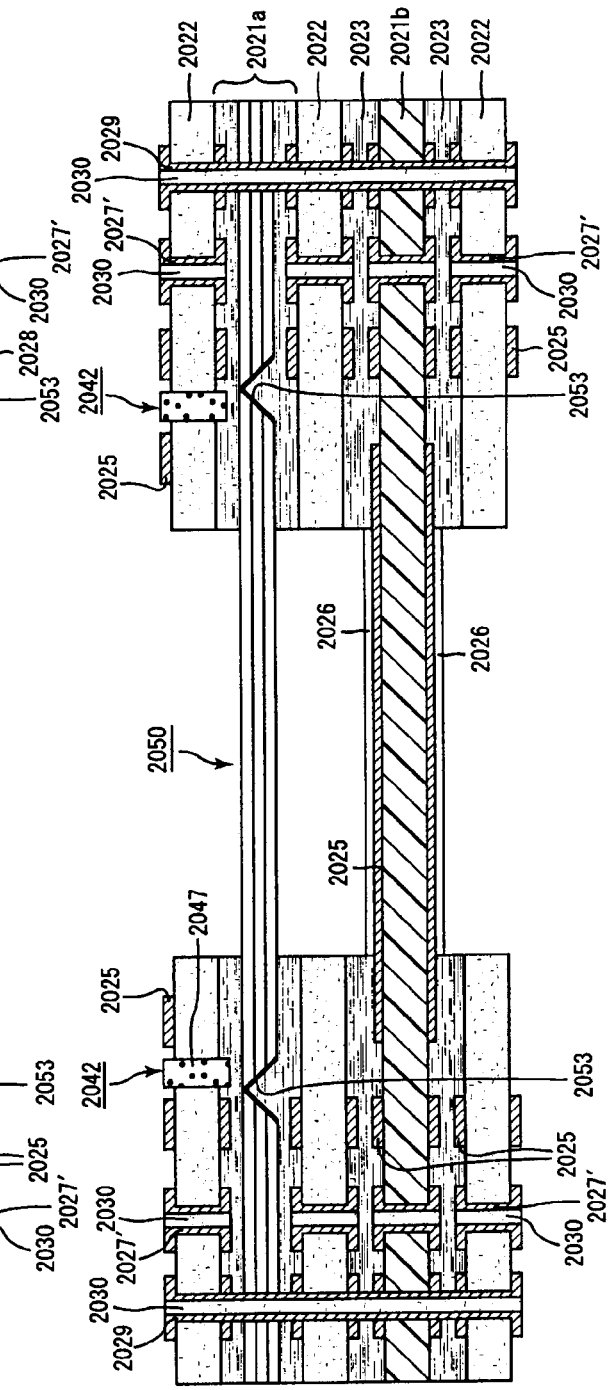

E. Manufacture of Photoelectric Circuit Board (1) The optical waveguide film 2050, the rigid members a to c, and the flex substrate 2021b, all of which had been manufactured in the above-described process A, were layered by interposing prepregs 2023 in accordance with a pin lamination method in prescribed order (see FIG. 23), and a cover lay 2026 was further formed on a portion configuring a flex portion and pressed.

Here, the pressing was carried out under conditions of a pressure of 30 kg/cm², a temperature of 180° C. for 45 minutes, and the total pressing period of time of 45 minutes.

Here, in the present example, the portion combined with the optical waveguide film 2050 and prepregs is a substrate 2021a. Here, the same prepregs as manufactured in the process D(1) of Example 3 was used herein.

(2) In the same manner as in the processes D(2) to D(4) of Example 3, penetrating via holes 2029, conductor circuits 2025 in outermost layers, solder resist layers 2034, solder bumps 2037 and the like were formed, and the photoelectric circuit board was completed (see FIGS. 24A, 24B, 25A, and 25B).

Here, the photoelectric circuit board manufactured in the present example has two pieces of flex members.

Example 5

A. Manufacture of Optical Waveguide Substrate

A rigid member c was manufactured in the same manner as in the process C of Example 3 (see FIGS. 26A, 26B). However, optical path conversion mirrors were not formed in an optical waveguide, and the planar size of the optical waveguide itself was made identical to that of the optical waveguide substrate.

B. Manufacture of Rigid Member b

A rigid member b was manufactured in the same manner as in the process C of Example 3. Here, four pieces of rigid members b were manufactured.

C. Manufacture of Photoelectric Circuit Board (1) The rigid member c was layered in accordance with a pin lamination method by interposing prepregs 3023 with a thickens of 80 µm made of high-Tg epoxy resin (MCL-E-679, made by Hitachi Chemical Co., Ltd.) (see FIG. 27A), and a cover lay 3026 was further formed on a portion configuring a flex portion and pressed.

Here, pressing was carried out under conditions of a pressure of 30 kg/cm², a temperature of 180° C. for 45 minutes, and the total pressing period of time of 45 minutes.

(2) Next, in the same manner as in the processes D(2) to D(4) of Example 3, penetrating via holes 3029, conductor circuits 3025 in outermost layers, solder resist layers 3034, and solder bumps 3037 were formed (see FIGS. 27B, 28A, 28B, and 29A).

Next, a through hole for an optical path (optical signal transmitting region 3042) that penetrates through the entirety of the rigid portion was manufactured in the same manner as in the process (4) of Example 1, and the photoelectric circuit board was completed (see FIG. 29B).

The above-described through hole for an optical path was formed in a quadrangular pillar shape with a bottom face of 340 µm×1300 µm with a semicylinder with a radius of 170 µm.

Example 6

A. Manufacture of Optical Waveguide Substrate

An optical waveguide substrate was manufactured in the same manner as in the process A of Example 5.

B. Manufacture of Flex Substrate

A flex substrate was manufactured in the same manner as in the process B of Example 4.

C. Manufacture of Rigid Member b

A rigid member was manufactured in the same manner as in the process C of Example 3.

D. Manufacture of Rigid Member c

A rigid member was manufactured in the same manner as in the process D of Example 4.

Here, two sheets of rigid members c were manufactured in the present process.

E. Manufacture of Photoelectric Circuit Board (1) The optical waveguide film, the rigid members b, c, and the flex substrate, all of which had been manufactured in the above-described process A, were layered by interposing prepregs in accordance with a pin lamination method in prescribed order, and furthermore, a cover lay was formed on a portion configuring a flex portion in an optical waveguide substrate and pressed.

Here, the pressing was carried out under conditions of a pressure of 30 kg/cm$^2$, a temperature of 180° C. for 45 minutes, and the total pressing period of time of 45 minutes. Here, the same prepregs as manufactured in the process D(1) of Example 3 was used herein.

(2) Next, penetrating via holes, conductor circuits in outermost layers, solder resist layers, solder bumps and the like were formed in the same manner as in the process E(2) of Example 4.

Afterward, the through hole for an optical path (optical signal transmitting regions 542a, 542b) that penetrates through the entirety of rigid portions was formed with the same method as in the process (4) of Example 1, and the photoelectric circuit board was completed (see FIG. 6).

The above-described through hole for an optical path was formed in a quadrangular pillar shape with a bottom face of 340 μm×1300 μm with a semicylinder with a radius of 170 μm.

Example 7

A photoelectric circuit board was manufactured in the same manner as in Example 4, except that an optical fiber sheet was used instead of an optical waveguide film in Example 4.

As the optical fiber sheet, an optical fiber sheet where four silica optical fibers with a core diameter of 50 μm and a clad diameter of 125 μm are placed in parallel and the surrounding thereof are coated with a cover resin layer made of a polyimide resin was used. Here, optical path conversion mirrors were formed in a prescribed portion of the optical fiber sheet.

Comparative Example

A photoelectric circuit board was manufactured in the same manner as in Example 1, except that an optical waveguide was not formed.

After mounting of a light emitting element (VCSEL), a light receiving element (PD), and an IC chip (not illustrated) on the (photo)electric circuit board manufactured in Example 1, Example 2-1 to 2-3 and Comparative Example, transmission of an optical signal and an electric signal was evaluated in accordance with the following method. The results are shown in Table 1. Here, the length of a flex portion is 5 cm with regard to the photoelectric circuit board according to Examples and Comparative Example.

That is, an optical signal of 1 Gbps, 2.5 Gbps, 5 Gbps and 10 Gbps was inputted into a connector for testing by using a pulse generator, light was emitted from a VCSEL so as to pass through a driver IC, the optical signal that was transmitted via the photoelectric circuit board (optical signal transmitting regions and optical circuits) was received by a PD so as to be converted to an electrical signal that passed via an amplifier IC, the electrical signal was taken out from the connector for testing, and whether or not the optical signal was transmitted normally was determined from eye patterns by using an oscilloscope.

Here, for the VCSEL and the PD, a four-channel VCSEL with a pitch of 250 μm and a four-channel PD with a pitch of 250 μm, respectively, were mounted.

In addition, an electrical signal was inputted into a connector for testing by using a pulse generator, the electrical signal was transmitted via conductor circuits (conductor circuits formed on a flex portion) from a driver IC, the electrical signal that passed via an amplifier IC was taken out from the connector for testing, and whether or not the optical signal was transmitted normally was determined from a wave shape (eye pattern) by using an oscilloscope.

TABLE 1

|  |  | Example | | | | Comparative |
|---|---|---|---|---|---|---|
|  |  | 1 | 2-1 | 2-2 | 2-3 | Example |
| Optical signal | 1 Gbps | ○ | ○ | ○ | ○ | — |
|  | 2.5 Gbps | ○ | ○ | ○ | ○ | — |
|  | 5 Gbps | ○ | ○ | ○ | ○ | — |
|  | 10 Gbps | ○ | ○ | ○ | ○ | — |
| Electric signal | 1 Gbps | ○ | ○ | ○ | ○ | ○ |
|  | 2.5 Gbps | X | ○ | ○ | ○ | X |
|  | 5 Gbps | X | X | X | ○ | X |
|  | 10 Gbps | X | X | X | X | X |

As is clear from the results of Table 1, in the photoelectric circuit board according to Examples, even 10 Gbps of an optical signal was able to be transmitted certainly, but 10 Gbps of an electrical signal was not able to be transmitted even if transmitted via a differential line.

Only 1 Gbps of a signal was able to be transmitted in the electrical circuit board according to Comparative Example.

In addition, when the transmission of the optical signal and the electrical signal was evaluated in accordance with the same method as the above-described method, the same results as in Example 1 was obtained also in the case of the photoelectric circuit board according to Examples 3 to 7.

Here, in the evaluation of Example 6, 7, an optical path conversion member manufactured in the following method was fixed (curing conditions: 150° C., one hour) on light receiving surfaces of a light receiving element and light emitting surfaces of a light emitting element with an epoxy based optical adhesive having a prescribed index of refraction (made by NTT Advanced Technology Corp.) by using a high-accuracy electric component mounter (mounting accuracy <1 μm).

Then, the optical element to which this optical path conversion member was fixed was mounted on the photoelectric circuit board, and an optical signal transmitting region and the lower part of the optical element were further filled in with an epoxy resin (index of refraction: 1.52, transmittance: 90%/mm).

What is claimed as new and desired to be secured by Letters Patent of the United States is:

1. A photoelectric circuit board comprising:
a substrate;
at least one insulating layer formed over said substrate;
a plurality of conductor circuits formed over said substrate and interposed by said at least one insulating layer; and
an optical circuit formed over said substrate,
wherein said substrate, conductor circuits and insulating layer form a rigid portion, said substrate has a portion where said conductor circuits and said insulating layer are not formed, said portion of said substrate forms a flex portion, said rigid portion has an external connection portion for mounting an optical element or a package substrate having an optical element, said rigid portion has an optical signal transmitting region, said optical circuit is formed in said flex portion, and said optical circuit is optically coupled with one end of said optical signal transmitting region of said rigid portion, and wherein said optical signal transmitting region is formed so as to penetrate through a portion of said rigid portion.

2. The photoelectric circuit board according to claim 1, wherein said rigid portion has a plurality of second conductor circuits and at least one second insulating layer on an opposite side of said substrate where said conductor circuits and at least one insulating layer are formed.

3. The photoelectric circuit board according to claim 1, wherein said optical signal transmitting region comprises a resin composite.

4. The photoelectric circuit board according to claim 1, wherein said optical signal transmitting region is an opening.

5. The photoelectric circuit board according to claim 2, wherein said optical signal transmitting region is formed so as to penetrate through said rigid portion.

6. The photoelectric circuit board according to claim 1, wherein said optical signal transmitting region has a collective through hole structure or an individual through hole structure.

7. The photoelectric circuit board according to claim 3, wherein said resin composite has about 70%/mm or more of transmittance of a transmission light.

8. The photoelectric circuit board according to claim 1, wherein said optical circuit is an optical waveguide where an optical path conversion mirror is formed.

9. A device for optical communication comprising:
a photoelectric circuit board comprising a substrate, at least one insulating layer formed over said substrate, a plurality of conductor circuits formed over said substrate and interposed by said at least one insulating layer, and an optical circuit formed over said substrate,
wherein said substrate, conductor circuits and insulating layer form a rigid portion, said substrate has a portion where said conductor circuits and said insulating layer are not formed, said portion of said substrate forms a flex portion, said rigid portion has an external connection portion for mounting an optical element or a package substrate having an optical element, said rigid portion has an optical signal transmitting region, said optical circuit is formed in said flex portion, and said optical circuit is optically coupled with one end of said optical signal transmitting region of said rigid portion, and
wherein said optical signal transmitting region is formed so as to penetrate through a portion of said rigid portion.

10. The device for optical communication according to claim 9, wherein said rigid portion has a plurality of second conductor circuits and at least one second insulating layer on an opposite side of said substrate where said conductor circuits and at least one insulating layer are formed.

11. The device for optical communication according to claim 9, wherein said optical signal transmitting region comprises a resin composite.

12. The device for optical communication according to claim 9, wherein said optical signal transmitting region is an opening.

13. The device for optical communication according to claim 10, wherein said optical signal transmitting region is formed so as to penetrate through said rigid portion.

14. The device for optical communication according to claim 9, wherein said optical signal transmitting region has a collective through hole structure or an individual through hole structure.

15. The device for optical communication according to claim 11, wherein said resin composite has about 70%/mm or more of transmittance of a transmission light.

16. The device for optical communication according to claim 9, further comprising a microlens provided on an end portion on the side opposite to the side where said optical signal transmitting region is optically coupled with an optical circuit.

17. The device for optical communication according to claim 16, wherein said microlens has about 70%/mm or more of transmittance of a transmission light.

18. The device for optical communication according to claim 16, wherein said microlens is provided by interposing optical adhesive.

19. The device for optical communication according to claim 16, wherein said microlens is provided by interposing a lens marker.

20. The device for optical communication according to claim 9, wherein said optical circuit is an optical waveguide where an optical path conversion mirror is formed.

21. The device for optical communication according to claim 9, further comprising an optical path conversion member provided in said photoelectric circuit board.

22. A device for optical communication comprising:
a photoelectric circuit board comprising a substrate, at least one insulating layer formed over said substrate, a plurality of conductor circuits formed over said substrate and interposed by said at least one insulating layer, and an optical circuit formed over said substrate,
wherein said substrate, conductor circuits and insulating layer form a rigid portion, said substrate has a portion where said conductor circuits and said insulating layer are not formed, said portion of said substrate forms a flex portion, said rigid portion has an external connection portion for mounting an optical element or a package substrate having an optical element, said rigid portion has an optical signal transmitting region, said optical circuit is formed in said flex portion, and said optical circuit is optically coupled with one end of said optical signal transmitting region of said rigid portion, and
wherein an optical path conversion member is provided within said circuit board and fixed to said optical element.

23. The device for optical communication according to claim 21, further comprising a submount substrate, wherein said optical path conversion member is provided on said photoelectric circuit board by interposing said submount substrate.

24. The device for optical communication according to claim 21, wherein said optical path conversion member is fixed to wall side of said optical signal transmitting region by interposing an adhesive.

25. The device for optical communication according to claim 21, further comprising an optical path conversion mirror formed in said optical path conversion member.

26. The device for optical communication according to claim 21, further comprising a convex lens or a grating lens formed on a reflective side of said optical path conversion member.

27. The device for optical communication according to claim 23, wherein said optical path conversion member is fixed by an optical adhesive layer on the side opposite to the side of said submount substrate where the optical element is mounted, and said submount substrate is mounted on said photoelectric circuit board by interposing solder.

* * * * *